(12) United States Patent
Fujimoto

(10) Patent No.: US 7,799,591 B2
(45) Date of Patent: Sep. 21, 2010

(54) SEMICONDUCTOR DEVICE AND METHOD FOR MANUFACTURING THE SAME

(75) Inventor: Hiroyuki Fujimoto, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 14 days.

(21) Appl. No.: 12/332,649

(22) Filed: Dec. 11, 2008

(65) Prior Publication Data
US 2009/0152611 A1   Jun. 18, 2009

(30) Foreign Application Priority Data
Dec. 12, 2007   (JP) .............................. 2007-321036

(51) Int. Cl.
H01L 21/00   (2006.01)
(52) U.S. Cl. ................... 438/40; 438/254; 438/296; 438/494; 257/E23.027
(58) Field of Classification Search ............... 438/40, 438/254, 296, 494
See application file for complete search history.

(56) References Cited

U.S. PATENT DOCUMENTS

| | | | |
|---|---|---|---|
| 6,548,374 B2 * | 4/2003 | Chung | ................. 438/424 |
| 7,553,748 B2 * | 6/2009 | Jang et al. | ................. 438/586 |

| | | | |
|---|---|---|---|
| 2006/0151855 A1 * | 7/2006 | Kiyotoshi et al. | ........... 257/618 |

FOREIGN PATENT DOCUMENTS

| | | |
|---|---|---|
| JP | 62-139356 | 6/1987 |
| JP | 05-114658 | 5/1993 |
| JP | 06-163912 | 6/1994 |
| JP | 06-196707 | 7/1994 |
| JP | 09-260669 | 10/1997 |
| JP | 09-321289 | 12/1997 |
| JP | 10-027845 | 1/1998 |
| JP | 10-065160 | 3/1998 |
| JP | 2002-299613 | 10/2002 |
| JP | 2003-101012 | 4/2003 |
| JP | 2004-128182 | 4/2004 |
| JP | 2004-319808 | 11/2004 |

* cited by examiner

*Primary Examiner*—Wai-Sing Louie
(74) *Attorney, Agent, or Firm*—Young & Thompson

(57) ABSTRACT

A semiconductor device comprises a first contact plug, a first structure and a second insulating layer, or comprises a first contact plug, a first structure, a protruding region and a second insulating layer. The first contact plug extends in a predetermined direction and including a step converting a cross section area of the first contact plug perpendicular to the predetermined direction discontinuously via the step in one end side. The second insulating layer is formed on side surface of a part of the first contact plug closer to the first structure than the step, or on side surfaces of the protruding region and a part of the first contact plug closer to the first structure than the step.

14 Claims, 49 Drawing Sheets

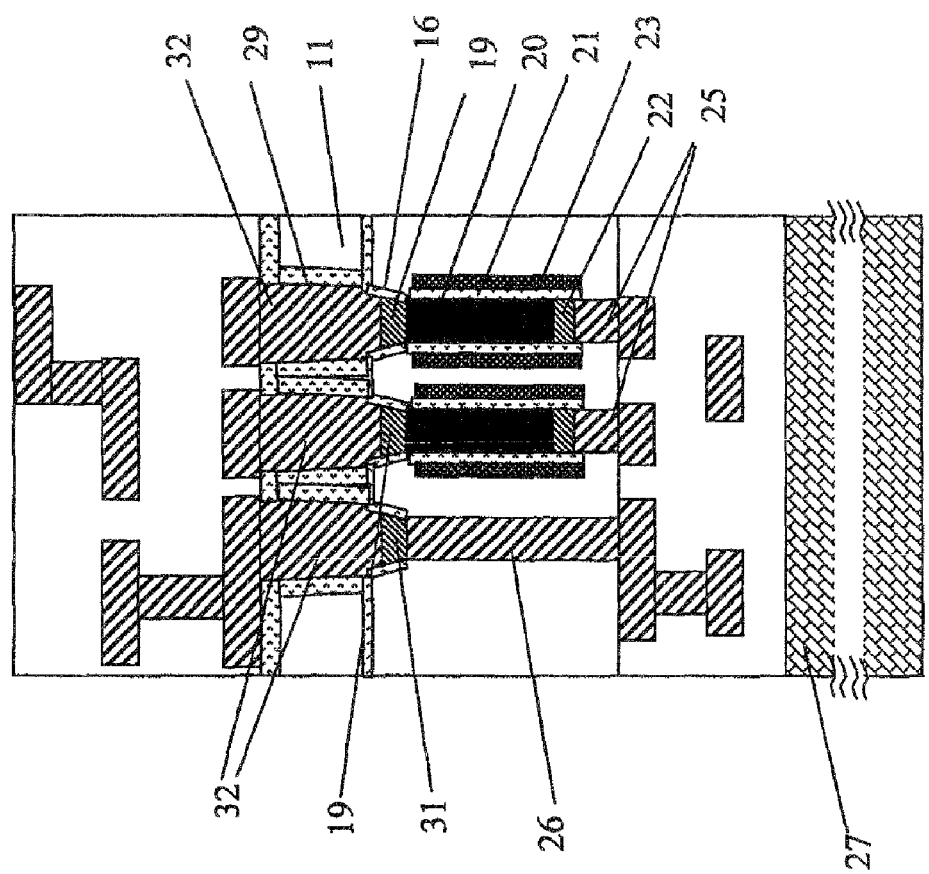

SEMICONDUCTOR DEVICE AND METHOD FOR MANUFACTURING THE SAME

This application is based upon and claims the benefit of priority from Japanese Patent Application No. 2007-321036, filed on Dec. 12, 2007, the disclosure of which is incorporated herein in its entirety by reference.

BACKGROUND OF THE INVENTION

1. Field of the Invention

The present invention relates to a semiconductor device and a method for manufacturing the semiconductor device.

2. Description of the Related Art

Conventionally, the mainstream of semiconductor device configuration has been that a single semiconductor device is equipped with a single semiconductor layer. In recent years, however, there have been proposed such semiconductor device configuration in which a single semiconductor device is equipped with a plurality of semiconductor layers. More specifically, it is possible to enhance the capabilities of a semiconductor device, including the processing speed, while reducing the size and weight of the semiconductor device as a whole by mounting a plurality of semiconductor layers in a multilayered manner within the single semiconductor device.

When manufacturing this multilayer-structured semiconductor device, it is necessary to laminate and electrically connect the semiconductor layers to one another within the semiconductor device. Hence, this plurality of semiconductor layers are electrically connected to one another through a contact plug.

FIGS. 15 to 17 illustrate a method for forming a common multilayer structure. First, as shown in FIG. 15A, semiconductor element 2 is formed on one surface of semiconductor substrate 1. In FIG. 15, an example is shown in which a planar-type MOSFET is formed as semiconductor element 2. Next, as shown in FIG. 15B, first interlayer insulating film 3 is formed on the side of semiconductor substrate 1 on which semiconductor element 2 is formed.

After this, as shown in FIG. 16A, there is formed mask pattern 4 including openings on first interlayer insulating film 3 in the positions thereof corresponding to the source/drain regions of the planar-type MOSFET. Next, using this mask pattern 4 as a mask, contact holes 5 are formed so as to penetrate through first interlayer insulating film 3 up to the source/drain regions. Next, as shown in FIG. 16B, mask pattern 4 is removed and then a conductive material is buried in the contact holes, thereby forming contact plugs 6.

After this, as shown in FIG. 17A, second interlayer insulating film 7 is further formed on first interlayer insulating film 3. Then, there is formed mask pattern 8 including an opening on second interlayer insulating film 7 in the position thereof corresponding to either one of the source/drain regions of the planar-type MOSFET. Next, contact hole 9 is formed so as to penetrate through second interlayer insulating film 7. Next, as shown in FIG. 17B, a conductive material is buried in contact hole 9, thereby forming contact plug 10.

In recent years, there has been a progress in the miniaturization of such a multilayer structure as described above and, therefore, it has become increasingly difficult to align a contact plug with a desired region to establish contact when forming the contact plug. Hence, a study has been made of a method capable of aligning a contact plug with high accuracy.

In the method described in Japanese Patent Laid-Open No. 5-114658, a contact hole for connecting a plurality of conductive layers is formed, and then a film consisting primarily of silicon is buried in the contact hole. After this, the film consisting primarily of silicon is left over so as to cover a contact hole opening, and then a metal film for forming a second conductive layer is formed. The document states that by forming this metal film, it is possible to use the step difference of the film consisting primarily of silicon as an index for alignment in a photolithography step of forming an interconnect and, thereby, increase the alignment accuracy of the interconnect in the second conductive layer.

In the method described in Japanese Patent Laid-Open No. 10-27845, a silicon dioxide film and a silicon nitride film are formed on a semiconductor substrate including a lower interconnect layer, and then the silicon nitride film in a region in which an interconnect layer is to be formed is selectively etched away, thereby forming a trench. After this, photoresist A is formed in this trench and photoresist B including a hole in a region in which a contact hole is to be formed is further formed. Subsequently, photoresist A in this position is removed to expose the silicon dioxide film. Then, using this photoresist B and the silicon nitride film as masks, the silicon dioxide film in the region in which the contact hole is to be formed is selectively removed to expose the lower interconnect layer, thereby forming a contact hole. Japanese Patent Laid-Open No. 10-27845 states that in the method described therein, high-precision alignment is possible by forming the masks composed of photoresist B and the silicon nitride film in such a stepwise fashion as described above.

Along with the progress of equipment miniaturization, high integration, and diversification of equipment design in recent years, it has been necessary, in some cases, to include a step of aligning a contact hole from the rear surface side of a semiconductor substrate. I have now discovered that a related method for forming a contact plug, however, had limitations in the accuracy of aligning the contact hole due to, for example, an alignment error arising when forming a mask pattern by photolithography. The recent progress in the miniaturization of a semiconductor device, in particular, has given rise to a demand for high accuracy also in the alignment of a contact plug with a semiconductor element. Failure to carry out such alignment with high accuracy has, in some cases, led to a short-circuit between the contact plug and the semiconductor substrate and between the contact plug and the gate electrode thereof. Furthermore, the methods described in Japanese Patent Laid-Open Nos. 5-114658 and 10-27845 have had limitations in alignment accuracy.

SUMMARY OF THE INVENTION

The present invention seeks to solve one or more of the above problems, or to improve upon those problems at least in part.

In one embodiment, there is provided a semiconductor device, comprising:

a first contact plug extending in a predetermined direction and including a step converting a cross section area of the first contact plug perpendicular to the predetermined direction discontinuously via the step in one end side;

a protruding region electrically connected to the first contact plug;

a first structure electrically connected to the protruding region; and a second insulating layer formed on side surfaces of the protruding region and a part of the first contact plug closer to the first structure than the step.

In another embodiment, there is provided a semiconductor device, comprising:

a first contact plug extending in a predetermined direction and including a step converting a cross section area of the first contact plug perpendicular to the predetermined direction discontinuously via the step in one end side;

a first structure electrically connected to the first contact plug; and a second insulating layer formed on side surface of a part of the first contact plug closer to the first structure than the step.

In another embodiment, there is provided a method for manufacturing a semiconductor device, comprising:

(1) preparing a semiconductor substrate including a protruding region;

(2) forming a second insulating layer on side surface of the protruding region;

(3) forming a first structure on top surface of the protruding region;

(4) performing anisotropic etching to the semiconductor substrate in a position corresponding to the protruding region, from a rear side opposite to a side on which the first structure is formed, so that the etching rate of the semiconductor substrate is faster than the etching rate of the second insulating layer, to form a second opening until the second opening reaches at least the protruding region; and (5) forming at least a first contact plug within the second opening.

In another embodiment, there is provided a method for manufacturing a semiconductor device, comprising:

(1) forming a first insulating layer across the entire surface of a semiconductor substrate;

(2) forming a first mask pattern on the first insulating layer;

(3) etching the first insulating layer and the semiconductor substrate using the first mask pattern as a mask to form, below the first mask pattern, a protruding region a portion of which other than a portion below the first mask pattern is exposed;

(4) forming a second insulating layer in the exposed portion of the semiconductor substrate;

(5) removing the first mask pattern;

(6) forming an interlayer insulating film over the entire surface of the semiconductor substrate;

(7) forming a first opening within the interlayer insulating film in a position thereof corresponding to the protruding region, removing the first insulating layer on the protruding region, and further forming a first structure on the protruding region;

(8) forming a protective substrate on the first structure;

(9) polishing the semiconductor substrate from the rear surface side thereof opposite to a side on which the first structure is formed to reduce a thickness of the semiconductor substrate;

(10) performing anisotropic etching to the semiconductor substrate in a position corresponding to the protruding region, from the rear surface side thereof, so that the etching rate of the semiconductor substrate is faster than the etching rate of the second insulating layer, to form a second opening until the second opening reaches at least the protruding region;

(11) forming a third insulating layer on the inner wall of the second opening; and

(12) forming at least a first contact plug within the second opening.

In another embodiment, there is provided a method for manufacturing a semiconductor device, comprising:

(1) forming a first insulating layer over the entire surface of a semiconductor substrate;

(2) forming a first mask pattern on the first insulating layer;

(3) etching the first insulating layer and the semiconductor substrate using the first mask pattern as a mask to form, below the first mask pattern, at least one protruding region the portions of which other than a portion below the first mask pattern are exposed;

(4) forming a second insulating layer in the exposed portions of the semiconductor substrate;

(5) removing the first mask pattern;

(6) forming an interlayer insulating film over the entire surface of the semiconductor substrate;

(7) forming a first opening within the interlayer insulating film in a position thereof corresponding to the protruding region, removing the first insulating layer on the protruding region, and further forming a first structure on the protruding region;

(8) performing anisotropic etching on the semiconductor substrate from the rear surface side thereof opposite to a side on which the first structure is formed, so as to leave a portion in the semiconductor substrate corresponding to the first structure, the anisotropic etching being performed so that the etching rate of the semiconductor substrate is faster than the etching rate of the second insulating layer; and (9) implanting an impurity into a portion in the semiconductor substrate corresponding to the first structure, to form a first contact plug.

In another embodiment, there is provided a method for manufacturing a semiconductor device, comprising:

(1) forming a second insulating layer over the entire surface of a semiconductor substrate;

(2) forming a first impurity-diffused region in the semiconductor substrate;

(3) performing anisotropic etching on the rear surface side of the semiconductor substrate opposite to a side on which the second insulating layer is formed, in a position of the semiconductor substrate corresponding to the first impurity-diffused region, the anisotropic etching being performed so that the etching rate of the semiconductor substrate is faster than the etching rate of the second insulating layer, to form a second opening until the second opening reaches at least the first impurity-diffused region; and (4) forming at least a first contact plug within the second opening.

In another embodiment, there is provided a method for manufacturing a semiconductor device, comprising:

(1) forming a first insulating layer over the entire surface of a semiconductor substrate;

(2) forming a first mask pattern on the first insulating layer;

(3) etching the first insulating layer and the semiconductor substrate using the first mask pattern as a mask to form, below the first mask pattern, at least one protruding region the portions of which other than a portion below the first mask pattern are exposed;

(4) forming a second insulating layer in the exposed portions of the semiconductor substrate;

(5) removing the first mask pattern;

(6) forming an interlayer insulating film over the entire surface of the semiconductor substrate;

(7) forming a first opening within the interlayer insulating film in a position thereof corresponding to the protruding region, removing the first insulating layer on the protruding region, and further forming a first structure on the protruding region;

(8) performing anisotropic etching on the semiconductor substrate from the rear surface side thereof opposite to a side on which the first structure is formed, the anisotropic etching being performed in a position corresponding to the protruding region within the semiconductor substrate so that the etching rate of the semiconductor substrate is faster than the etching rate of the second insulating layer, to form a second opening until the second opening reaches at least the first impurity-diffused region;

(9) forming a third insulating layer on the inner wall of the second opening; and

(10) forming at least a first contact plug within the second opening.

In another embodiment, there is provided a method for manufacturing a semiconductor device, comprising:

(1) forming a first insulating layer over the entire surface of a silicon semiconductor substrate;

(2) forming a first mask pattern on the first insulating layer;

(3) etching the first insulating layer and the silicon semiconductor substrate using the first mask pattern as a mask to form, below the first mask pattern, a silicon semiconductor region projecting from a predetermined plane of the silicon semiconductor substrate;

(4) forming a second insulating layer in the exposed portions of the silicon semiconductor substrate;

(5) forming a first structure including the silicon semiconductor region;

(6) polishing the silicon semiconductor substrate from the rear surface side thereof opposite to a side on which the first structure is formed, to reduce a thickness of the silicon semiconductor substrate;

(7) performing anisotropic etching on a position corresponding to the silicon semiconductor region within the silicon semiconductor substrate from the rear surface side thereof, so that the etching rate of the silicon semiconductor substrate is faster than the etching rate of the second insulating layer, to form a second opening until the second opening reaches at least the silicon semiconductor region;

(8) forming a third insulating layer on the inner wall of the second opening; and (9) forming at least a first contact plug within the second opening.

In the above embodiments, "step" means a surface converting a cross section area of the first contact plug perpendicular to the first contact plug extending-direction discontinuously. The cross section area of the first contact plug perpendicular to the first contact plug extending-direction discontinuously converts via the step. For example, the step is illustrated by numerical number 41 in FIGS. 14, 20, 24, 28 and 48.

Consequently, it is possible to manufacture a semiconductor device in which a structure and a contact plug constituting the semiconductor device are precisely aligned with each other.

BRIEF DESCRIPTION OF THE DRAWINGS

The above features and advantages of the present invention will be more apparent from the following description of certain preferred embodiments taken in conjunction with the accompanying drawings, in which:

FIG. 18 is a schematic view illustrating an example of a semiconductor device of the present invention;

Figure 1:
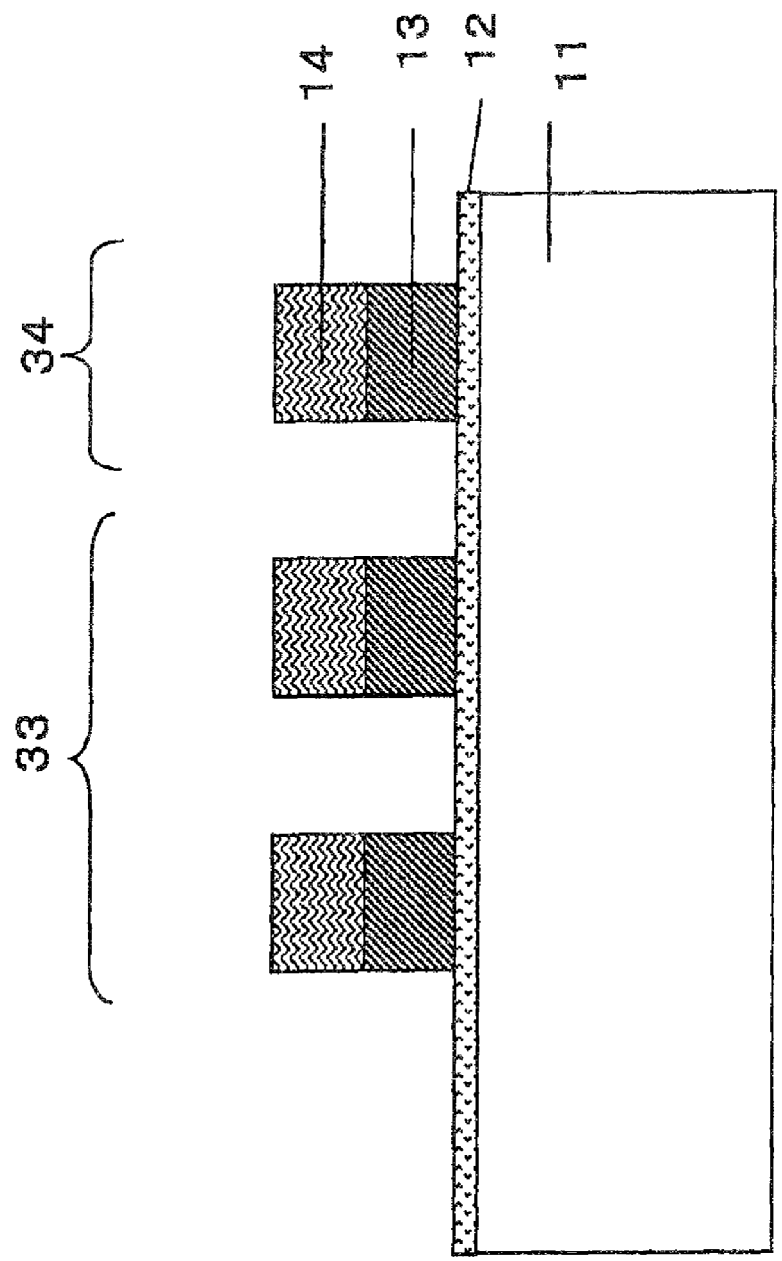
FIG. 1 is a schematic view illustrating one step of a method for manufacturing a semiconductor device of the present invention.

In the drawings, numerals have the following meanings. 1: semiconductor substrate, 2: semiconductor element, 3, 7: interlayer insulating film, 4, 8: mask pattern, 5, 9: contact hole, 6, 10: contact plug, 11: silicon semiconductor substrate, 12, 16, 17, 24, 29: silicon dioxide film, 13: silicon nitride film, 14, 18: photoresist, 15: protruding region A, 19, 129, 201: lower impurity-diffused region, 20, 20*a*: semiconductor region, 21: gate insulating film, 22, 125: upper impurity-diffused region, 23: gate electrode, 25, 126*a*: second contact plug, 26, 124, 126*b*: third contact plug, 27: protective substrate, 28: second opening, 30: protruding region B, 31: connecting part, 32, 110, 118: first contact plug, 33: transistor portion, 34, 127: interconnect portion, 41: step, 102: contact plug, 104, 107: bit line, 105: capacitor, 106: semiconductor portion, 108: word line, 109: semiconductor part, 111: gate electrode, 112: gate sidewall, 113: source/drain region, 114: contact plug, 115: first impurity-diffused region, 116: isolation region, 117: gate insulating layer, 119: interconnect layer, 120: N-type diffusion region, 121: P-type diffusion region, 122: gate electrode material, 123, 141: oxide film, 126: contact plug material, 130: resist mask, 140: insulating layer

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

(Method for Manufacturing Semiconductor Device)

A method for manufacturing a semiconductor device comprises:

(1) forming a first insulating layer across the entire surface of a semiconductor substrate;

(2) forming a first mask pattern on the first insulating layer;

(3) etching the first insulating layer and the semiconductor substrate using the first mask pattern as a mask to form, below the first mask pattern, a protruding region a portion of which other than a portion below the first mask pattern is exposed;

(4) forming a second insulating layer in the exposed portion of the semiconductor substrate;

(5) removing the first mask pattern;

(6) forming an interlayer insulating film over the entire surface of the semiconductor substrate;

(7) forming a first opening within the interlayer insulating film in a position thereof corresponding to the protruding region, removing the first insulating layer on the protruding region, and further forming a first structure on the protruding region;

(8) forming a protective substrate on the first structure;

(9) polishing the semiconductor substrate from the rear surface side thereof opposite to a side on which the first structure is formed to reduce a thickness of the semiconductor substrate;

(10) performing anisotropic etching to the semiconductor substrate in a position corresponding to the protruding region, from the rear surface side thereof, so that the etching rate of the semiconductor substrate is faster than the etching rate of the second insulating layer, to form a second opening until the second opening reaches at least the protruding region;

(11) forming a third insulating layer on the inner wall of the second opening; and

(12) forming at least a first contact plug within the second opening.

In the manufacturing method, only first insulating layer on the protruding region is removed and second insulating layer present on part of the protruding region is left over in step (7). In addition, in step (10), anisotropic etching is performed on the position corresponding to the protruding region from the rear surface side of the semiconductor substrate, so that the etching rate of the semiconductor substrate is faster than the etching rate of second insulating layer. Then, the second opening is formed until at least the second opening reaches the protruding region.

In this step (10), there is provided, for example, a mask pattern including an opening on the rear surface side of the semiconductor substrate in a position thereof corresponding to the protruding region. Using this mask pattern as a mask, anisotropic etching is performed on the semiconductor substrate to form the second opening. At this time, anisotropic etching is performed so that the etching rate of the semiconductor substrate is faster than the etching rate of second insulating layer even if, for example, the opening of the mask pattern is not precisely aligned with a position corresponding to the protruding region. Consequently, second insulating layer is left over and only the semiconductor substrate is etched. Accordingly, it is possible to form the second opening with the opening precisely aligned with the protruding region (or with the first structure if the protruding region is removed) in a self-aligned manner. As a result, it is possible to manufacture a semiconductor device in which a first structure and a contact plug are precisely aligned with each other.

In the present invention, the "first structure" denotes all structure (except a protruding region) formed within an opening (on the protruding region, or if the protruding region is removed, on the part where the protruding region has existed) of an interlayer insulating film formed on the front surface side of a semiconductor substrate. That is, if the protruding region is left, the first structure is formed on the protruding region. If the protruding region is removed, the first structure is formed on the protruding region existing region before removing the protruding region. The first structure is not limited in particular, as long as the first structure is a portion constituting part of the semiconductor device.

In the present invention, the "first contact plug" denotes a contact plug formed from the rear surface side of the semiconductor substrate. The "second contact plug" denotes a contact plug electrically connected to a vertical MOSFET within the interlayer insulating film formed on the front surface side of the semiconductor substrate. The "third contact plug" denotes a contact plug formed so as to penetrate through the interlayer insulating film provided on the front surface side of the semiconductor substrate across the entire thickness direction of the interlayer insulating film.

In the present invention, the "connecting part" denotes a conductive portion for electrically connecting the first contact plug and the third contact plug. Examples of the connecting part include an impurity-implanted polysilicon region.

The first structure may or may not constitute a semiconductor element by itself. Alternatively, the first structure may constitute a single semiconductor element. For example, as the first structure, it is possible to form a semiconductor region the upper portion of which is an upper impurity-diffused region, a gate insulating film, a gate electrode, and a second contact plug. In this case, the semiconductor region comprising the upper impurity diffused region, the gate insulating film, the gate electrode, and the lower impurity-diffused region constitute a vertical MOSFET (metal-oxide semiconductor field-effect transistor). In addition, as the first structure, it is possible to form a third contact plug. In this case, the first structure forms an interconnect structure. Furthermore, with the manufacturing method of the present invention, it is possible to manufacture the vertical MOSFET and the interconnect structure separately or in combination.

In the method for manufacturing a semiconductor device of the present invention, a semiconductor substrate is first prepared in step (1). Examples of this semiconductor substrate include a silicon semiconductor substrate and an SOI. Next, first insulating layer is formed across the entire surface of this semiconductor substrate. Examples of a method for forming this first insulating layer include forming a silicon dioxide film by performing thermal oxidation if the front surface of the semiconductor substrate is made of silicon.

Next, in step (2), a first mask pattern is formed on this first insulating layer. Examples of a method for forming this first mask pattern include depositing a silicon nitride film using a CVD method or the like, and then performing patterning on the silicon nitride film using a lithography technique.

Next, in step (3), first insulating layer and the semiconductor substrate are etched to form at least one protruding region below the first mask pattern using the first mask pattern as a mask. At this time, the portions of the semiconductor substrate other than a portion between the first mask pattern and the lower portion of the semiconductor substrate are exposed.

Next, in step (4), a second insulating layer is formed on the exposed portions of the semiconductor substrate. Examples of a method for forming this second insulating layer include forming a silicon dioxide film by performing thermal oxidation if the front surface of the semiconductor substrate is made of silicon.

Next, in step (5), the first mask pattern is removed. Examples of a method for removing this first mask pattern include wet etching.

Next, in step (6), an interlayer insulating film is formed across the entire surface of the semiconductor device being manufactured. Examples of a method for forming this interlayer insulating film include a plasma CVD method.

Next, in step (7), a first opening is formed in a position corresponding to the protruding region within the interlayer insulating film. Concurrently, first insulating layer on the protruding region is removed and a first structure is formed so as to have contact with the protruding region. Examples of a method for forming this first opening include forming a mask pattern including an opening in a position corresponding to the protruding region by a lithography technique, and then etching the interlayer insulating film using this mask pattern as a mask. In addition, first insulating layer on the protruding region is removed at the time of this etching. After this, a first structure is formed so as to have contact with the protruding region. After the completion of etching, the mask pattern is removed.

Next, in step (8), a protective substrate is formed on the first structure. Typically, the first structure exists in the form of being buried within the interlayer insulating film. In addition, there is formed, in some cases, an interlayer insulating film comprising an interconnect layer on the interlayer insulating film within which the first structure is buried. In such a case, the protective substrate may be bonded onto these interlayer insulating films.

Next, in step (9), the semiconductor substrate is polished from the rear surface side thereof opposite to a side on which the first structure is formed, thereby reducing the thickness of the semiconductor substrate. Examples of a method of this polishing include a CMP (chemical mechanical polish) method. In addition, the thickness of the semiconductor substrate after this polishing is preferably 50 to 150 μm and, more preferably, 50 to 100 μm. By polishing the semiconductor substrate down to such a thickness as described above, second insulating layer is etched to a lesser extent even if a difference in etching rate between the semiconductor substrate and second insulating layer in later step (10) is small. Thus, it is possible to align the second opening with the protruding region in a self-aligned manner and with high accuracy.

Next, in step (10), anisotropic etching is performed to the semiconductor substrate in a position corresponding to the protruding region from the rear surface side thereof, so that the etching rate of the semiconductor substrate is faster than the etching rate of second insulating layer, thereby forming a second opening. Thus, the second opening is formed until the second opening reaches at least the protruding region.

In performing anisotropic etching, a common ICP type etching apparatus may be used. The anisotropic etching may be performed on electrode cooled down at 10° C. by chiller. HBr, $Cl_2$ and $O_2$ may be used as a gas for anisotropic etching. The anisotropic etching conditions include HBr flow rate 100 sccm, $Cl_2$ flow rate 100 sccm, $O_2$ flow rate 5 sccm, and pressure 2 Pa. The typical etching rate is 500 nm/min. If a silicon semiconductor substrate is used as the semiconductor substrate, a etching selectivity of the silicon semiconductor substrate to the second insulating film, that is, (silicon semiconductor substrate)/(second insulating film), is 20 or more.

In step (10), anisotropic etching may be performed until the second opening reaches at least the protruding region. Specifically, this anisotropic etching may be performed until the protruding region is exposed, may be stopped when the protruding region is partially etched, or may be performed until the first structure is exposed.

The etching rate of this semiconductor substrate is preferably 1.5 or more times and, more preferably, twice or more times the etching rate of second insulating layer. By etching the semiconductor substrate faster than second insulating layer with these differences in etching rate, it is possible to selectively etch the semiconductor substrate alone without deteriorating second insulating layer. As a result, it is possible to align the second opening with the protruding region with even higher accuracy.

Next, in step (11), a third insulating layer is formed on the inner wall of the second opening. Examples of a method for forming this third insulating layer include forming a silicon dioxide film by performing thermal oxidation if the semiconductor substrate is made of silicon.

Next, in step (12), at least a first contact plug is formed within the second opening. Typically, the first structure and the first contact plug are electrically connected to each other at this time. In addition, as a method for forming this first contact plug, it is possible to use a publicly-known method for forming a contact plug.

Hereinafter, a description will be made of specific examples of the manufacturing method of the present invention.

First Exemplary Embodiment

The first exemplary embodiment relates to a method for manufacturing a semiconductor device including a vertical MOSFET. The first exemplary embodiment includes:

(1) forming a first insulating layer across the entire surface of a semiconductor substrate;

(2) forming a first mask pattern on the first insulating layer;

(3) etching the first insulating layer and the semiconductor substrate using the first mask pattern as a mask to form, below the first mask pattern, a protruding region a portion of which other than a portion below the first mask pattern is exposed;

(4) forming a second insulating layer in the exposed portion of the semiconductor substrate;

(5) removing the first mask pattern;

(6) forming a first interlayer insulating film over the entire surface of the semiconductor substrate;

(7-1) forming a first opening in a position corresponding to the protruding region within the first interlayer insulating film and removing the first insulating layer on the protruding region;

(7-2) causing selective epitaxial growth to take place on the protruding region within the first opening to form a semiconductor region on the protruding region;

(7-3) removing the first interlayer insulating film to expose the semiconductor region;

(7-4) forming a gate insulating film on a side surface of the exposed semiconductor region parallel with a thickness direction of the semiconductor substrate;

(7-5) forming a gate electrode on the gate insulating film;

(7-6) implanting an impurity into an upper portion of the semiconductor region opposite to the protruding region side, to convert the upper portion of the semiconductor region into an upper impurity-diffused region;

(7-7) forming a second interlayer insulating film over the entire surface of the semiconductor substrate;

(7-8) forming a second contact plug so as to penetrate through the second interlayer insulating film and be electrically connected to the upper impurity-diffused region;

(8) forming a protective substrate on a first structure (the semiconductor region the upper portion of which is the upper impurity-diffused region, the gate insulating film, the gate electrode, and the second contact plug);

(9) polishing the semiconductor substrate from the rear surface side thereof opposite to a side on which the first structure is formed, to reduce a thickness of the semiconductor substrate;

(10) performing anisotropic etching to the semiconductor substrate in a position corresponding to the protruding region from the rear surface side thereof, so that the etching rate of the semiconductor substrate is faster than the etching rate of the second insulating layer, to form a second opening until the semiconductor region is exposed;

(11) forming a third insulating layer on the inner wall of the second opening; and

(12) forming, within the second opening, a lower impurity-diffused region so as to have contact with the semiconductor region and a first contact plug so as to be electrically connected to the lower impurity-diffused region.

In the first exemplary embodiment, steps (1) to (6), (8), (9), (11) and (13) are the same as steps (1) to (6), (8), (9), (11) and (13) described in the section "(Method for manufacturing semiconductor device)." Accordingly, no further explanation will be made of these steps. Hereinafter, only steps (7), (10) and (12) will be explained.

In step (7-1) of the first exemplary embodiment, the first opening is provided within the first interlayer insulating film in a position corresponding to the protruding region, and the first insulating layer on the protruding region is removed.

Next, in step (7-2), selective epitaxial growth is caused to take place on the protruding region within the first opening, thereby forming a semiconductor region on the protruding region. The conditions for selective epitaxial growth can be set as appropriate, according to the desired characteristics of the semiconductor region.

Next, in step (7-3), the first interlayer insulating film is removed to expose the semiconductor region. Examples of a method for removing this first interlayer insulating film include dry etching and wet etching.

Next, in step (7-4), a gate insulating film is formed on a side surface of the exposed semiconductor region parallel with the thickness direction of the semiconductor substrate. Here, the "side surface of the exposed semiconductor region parallel with the thickness direction of the semiconductor substrate" denotes a surface vertical to the front surface of the semiconductor substrate. Examples of a method for forming this gate insulating film include thermally oxidizing a side surface of the semiconductor region parallel with the thickness direction of the semiconductor substrate, or depositing a gate insulating film material on the entire surface of the semiconductor device being manufactured by a CVD method or the like and then etching back the gate insulating film material, thereby leaving over the gate insulating film on the side surface parallel with the thickness direction of the semiconductor substrate.

Next, in step (7-5), a gate electrode is formed on the gate insulating film. Examples of a method for forming this gate electrode include a DOPOS (doped polycrystalline silicon) method.

Next, in step (7-6), an impurity is implanted into the upper portion of the semiconductor region opposite to the protruding region side, thereby converting the upper portion of the semiconductor region as an upper impurity-diffused region. The type of impurity to be implanted for the upper impurity-diffused region and the conditions of implanting the impurity can be set as appropriate, according to a desired vertical MOSFET.

Next, in step (7-7), a second interlayer insulating film is formed across the entire surface of the semiconductor device being manufactured. Examples of a method for forming this second interlayer insulating film include the same method as that for forming the first interlayer insulating film.

Next, in step (7-8), a second contact plug is formed so as to penetrate through the second interlayer insulating film and be electrically connected to the upper impurity-diffused region.

Examples of a method for forming this second contact plug include the same method as that for forming the first contact plug.

In step (10), anisotropic etching is performed to remove the protruding region and form the second opening until the semiconductor region is exposed.

In addition, in step (12), a lower impurity-diffused region is formed so as to be electrically connected to the semiconductor region. Likewise, a first contact plug is formed so as to be electrically connected to the lower impurity-diffused region. Examples of a method for forming this lower impurity-diffused region include a DOPOS method and a method for forming a polysilicon layer and then implanting an impurity into this polysilicon layer after. The lower impurity-diffused region and the first contact plug are formed in separate steps.

In the first exemplary embodiment, a semiconductor region the upper portion of which is an upper impurity-diffused region, a gate insulating film, a gate electrode, and a second contact plug are formed as the first structure. In some cases, the other structure may be formed as the first structure. In addition, the semiconductor region comprising the upper impurity-diffused region, the gate insulating film, the gate electrode, and the lower impurity-diffused region constitute a vertical MOSFET.

The vertical MOSFET formed in the first exemplary embodiment may be either an N-type MOSFET or a P-type MOSFET. When forming an N-type MOSFET, an N-type impurity is implanted into the upper impurity-diffused region and the lower impurity-diffused region. In addition, a P-type impurity is implanted into the semiconductor region. When forming a P-type MOSFET, a P-type impurity is implanted into the upper impurity-diffused region and the lower impurity-diffused region. In addition, an N-type impurity is implanted into the semiconductor region.

In a modified example of the present exemplary embodiment, an impurity is implanted into the protruding region in step (7), thereby converting the protruding region as the lower impurity-diffused region. In addition, in step (10), anisotropic etching is performed to form the second opening until the second opening reaches the protruding region which is the lower impurity-diffused region, and leave over the protruding region. After this, in step (12), a first contact plug is formed so as to be electrically connected to the lower impurity-diffused region. Specifically, this modified example includes:

(1) forming a first insulating layer across the entire surface of a semiconductor substrate;

(2) forming a first mask pattern on the first insulating layer;

(3) etching the first insulating layer and the semiconductor substrate using the first mask pattern as a mask to form, below the first mask pattern, a protruding region a portion of which other than a portion below the first mask pattern is exposed;

(4) forming a second insulating layer in the exposed portion of the semiconductor substrate;

(5) removing the first mask pattern;

(6) forming a first interlayer insulating film over the entire surface of the semiconductor substrate;

(7-1) forming a first opening in a position corresponding to the protruding region within the first interlayer insulating film and removing the first insulating layer on the protruding region;

(7-2) implanting an impurity into the protruding region to convert the protruding region into a lower impurity-diffused region;

(7-3) causing selective epitaxial growth to take place on the protruding region, which is the lower impurity-diffused region within the first opening, to form a semiconductor region on the protruding region;

(7-4) removing the first interlayer insulating film to expose the semiconductor region;

(7-5) forming a gate insulating film on a side surface of the exposed semiconductor region parallel with a thickness direction of the semiconductor substrate;

(7-6) forming a gate electrode on the gate insulating film;

(7-7) implanting an impurity into an upper portion of the semiconductor region opposite to the protruding region side, to convert the upper portion of the semiconductor region into an upper impurity-diffused region;

(7-8) forming a second interlayer insulating film over the entire surface of the semiconductor substrate;

(7-9) forming a second contact plug so as to penetrate through the second interlayer insulating film and be electrically connected to the upper impurity-diffused region;

(8) forming a protective substrate on a first structure (the semiconductor region the upper portion of which is the upper impurity-diffused region, the gate insulating film, the gate electrode, and the second contact plug);

(9) polishing the semiconductor substrate from the rear surface side thereof opposite to a side on which the first structure is formed, to reduce a thickness of the semiconductor substrate;

(10) performing anisotropic etching to the semiconductor substrate in a position corresponding to the protruding region from the rear surface side thereof, so that the etching rate of the semiconductor substrate is faster than the etching rate of the second insulating layer, to form a second opening until the second opening reaches the protruding region which is the lower impurity-diffused region;

(11) forming a third insulating layer on the inner wall of the second opening; and

(12) forming a first contact plug within the second opening so as to be electrically connected to the lower impurity-diffused region.

In step (10) of the above-described modified example, anisotropic etching may be performed until the lower impurity-diffused region is exposed or may be performed so that the lower impurity-diffused region is partially etched. When performing anisotropic etching so that this lower impurity-diffused region is partially etched, the anisotropic etching is performed so that the etching rate of the semiconductor substrate and the lower impurity-diffused region is faster than the etching rate of second insulating layer.

Second Exemplary Embodiment

The second exemplary embodiment relates to a method for manufacturing a semiconductor device including a vertical MOSFET and an interconnect structure. The second exemplary embodiment includes:

(1) forming a first insulating layer across the entire surface of a semiconductor substrate;

(2) forming a first mask pattern on the first insulating layer;

(3) etching the first insulating layer and the semiconductor substrate using the first mask pattern as a mask to form, below the first mask pattern, a plurality of protruding regions composed of protruding regions A and B the portions of which other than portions below the first mask pattern are exposed;

(4) forming a second insulating layer in the exposed portions of the semiconductor substrate;

(5) removing the first mask pattern;

(6) forming a first interlayer insulating film over the entire surface of the semiconductor substrate;

(7-1) forming a first opening in a position corresponding to the protruding region A within the first interlayer insulating film and removing the first insulating layer on the protruding region A;

(7-2) causing selective epitaxial growth to take place on the protruding region A within the first opening, to form a semiconductor region on the protruding region A;

(7-3) removing the first interlayer insulating film to expose the semiconductor region;

(7-4) forming a gate insulating film on a side surface of the exposed semiconductor region parallel with a thickness direction of the semiconductor substrate;

(7-5) forming a gate electrode on the gate insulating film;

(7-6) implanting an impurity into an upper portion of the semiconductor region opposite to the protruding region A side, to convert the upper portion of the semiconductor region into an upper impurity-diffused region;

(7-7) forming a second interlayer insulating film over the entire surface of the semiconductor substrate;

(7-8) forming a second contact plug so as to penetrate through the second interlayer insulating film and be electrically connected to the upper impurity-diffused region, forming a first opening in a position corresponding to the protruding region B within the second interlayer insulating film, removing the first insulating layer on the protruding region B, and forming a third contact plug so as to be electrically connected to the protruding region B;

(8) forming a protective substrate on a first structure (the semiconductor region the upper portion of which is the upper impurity-diffused region, the gate insulating film, the gate electrode, and the second and third contact plugs);

(9) polishing the semiconductor substrate from the rear surface side thereof opposite to a side on which the first structure is formed, to reduce a thickness of the semiconductor substrate;

(10) performing anisotropic etching to the semiconductor substrate in positions corresponding to the protruding regions A and B from the rear surface side thereof, so that the etching rate of the semiconductor substrate is faster than the etching rate of the second insulating layer, to form a second opening until the semiconductor region and the third contact plug are exposed;

(11) forming a third insulating layer on the inner wall of the second opening; and

(12) forming a lower impurity-diffused region so as to have contact with the semiconductor region within the second opening, forming a first contact plug so as to be electrically connected to the lower impurity-diffused region, forming a connecting part so as to be electrically connected to the third contact plug, and forming a first contact plug so as to be electrically connected to the connecting part.

In the second exemplary embodiment, steps (1), (2), (4) to (6), (8), (9) and (11) are the same as steps (1), (2), (4) to (6), (8), (9) and (11) described in the first exemplary embodiment. Accordingly, no further explanation will be made of these steps and only steps (3), (7), (10) and (12) will be explained.

In the second exemplary embodiment, a plurality of protruding regions are formed in step (3). Among these protruding regions, a region in which a vertical MOSFET is to be formed is referred to as protruding region A, whereas a region in which a third contact plug is to be formed is referred to as protruding region B. In steps (7-1) and (7-2), a semiconductor region is formed only on protruding region A. In these steps, it is possible to use the same methods as used in steps (7-1) and (7-2) of the first exemplary embodiment. At this time, it is possible to prevent the first opening and the semiconductor region from being formed on protruding region B by forming a mask in a portion corresponding to protruding region B on the first interlayer insulating film.

In steps (7-3) to (7-7), the gate insulating film and the gate electrode are formed in the same way as in steps (7-3) to (7-7) of the first exemplary embodiment only on the side surface of the semiconductor region formed on protruding region A parallel with the thickness direction of the semiconductor substrate. In addition, the upper portion of the semiconductor region is converted into the upper impurity-diffused region. After this, the second interlayer insulating film is formed across the entire surface of the semiconductor device being manufactured.

Next, in step (7-8), the second contact plug is formed so as to penetrate through the second interlayer insulating film and be electrically connected to the upper impurity-diffused region. In addition, the first opening is formed in a position corresponding to protruding region B, concurrently with forming an opening for the second contact plug in a position within this second interlayer insulating film corresponding to the upper impurity-diffused region. Furthermore, first insulating layer on protruding region B is removed. In addition, the third contact plug is formed so as to be electrically connected to protruding region B, concurrently with forming the second contact plug in a position within the opening corresponding to the upper impurity-diffused region. As described above, in step (7-8), the first opening is also formed on protruding region B when forming the opening for the second contact plug. Thus, it is possible to simultaneously form the second contact plug and the third contact plug.

In the second exemplary embodiment, the formation of the first opening in step (7) described in the above-discussed section "(Method for manufacturing semiconductor device)" is performed in two separate steps. That is, the steps of forming first openings on protruding regions A and B are respectively carried out as separate steps.

In step (10), the second opening is formed in the same way as in the first exemplary embodiment by performing anisotropic etching to the semiconductor substrate in a position corresponding to the protruding region from the rear surface side of the semiconductor substrate. This formation of the second opening is performed until the semiconductor region and the third contact plug are exposed.

In step (12), the lower impurity-diffused region is formed within the second opening, in the same way as in the first exemplary embodiment, so as to be electrically connected to the semiconductor region. Likewise, the first contact plug is formed so as to be electrically connected to the lower impurity-diffused region. In addition, the connecting part is formed so as to be electrically connected to the third contact plug, and the first contact plug is formed so as to be electrically connected to the connecting part.

In the second exemplary embodiment, (a) the semiconductor region the upper portion of which is the upper impurity-diffused region, the gate insulating film, the gate electrode, and the second contact plug, and (b) the third contact plug are formed, as the first structure. Thus, the vertical MOSFET is composed of (a) the semiconductor region the upper portion of which is the upper impurity-diffused region, the gate insulating film, the gate electrode, and the lower impurity-diffused region constituting this first structure. In addition, (b) the third contact plug and the connecting part constitute the interconnect structure. In some cases, the other structure may be formed as the first structure.

In the modified example of the present exemplary embodiment, anisotropic etching is performed in step (10) to form the second openings until the second openings reach the lower impurity-diffused region and the connecting part, which are protruding regions A and B, respectively. In addition, protruding regions A and B are left over. After this, the first contact plugs are formed so as to be electrically connected to the lower impurity-diffused regions and the connecting part. Specifically, this modified example includes:

(1) forming a first insulating layer across the entire surface of a semiconductor substrate;

(2) forming a first mask pattern on the first insulating layer;

(3) etching the first insulating layer and the semiconductor substrate using the first mask pattern as a mask to form, below the first mask pattern, a plurality of protruding regions composed of protruding regions A and B the portions of which other than portions below the first mask pattern are exposed;

(4) forming a second insulating layer in the exposed portion of the semiconductor substrate;

(5) removing the first mask pattern;

(6) forming a first interlayer insulating film over the entire surface of the semiconductor substrate;

(7-1) forming a first opening in a position corresponding to the protruding region A within the first interlayer insulating film and removing the first insulating layer on the protruding region A;

(7-2) implanting an impurity into the protruding region A to convert the protruding region A into a lower impurity-diffused region;

(7-3) causing selective epitaxial growth to take place on the protruding region A which is the lower impurity-diffused region within the first opening, to form a semiconductor region on the protruding region A;

(7-4) removing the first interlayer insulating film to expose the semiconductor region;

(7-5) forming a gate insulating film on a side surface of the exposed semiconductor region parallel with a thickness direction of the semiconductor substrate;

(7-6) forming a gate electrode on the gate insulating film;

(7-7) implanting an impurity into an upper portion of the semiconductor region opposite to the protruding region A side, to convert the upper portion of the semiconductor region into an upper impurity-diffused region;

(7-8) forming a second interlayer insulating film over the entire surface of the semiconductor substrate;

(7-9) forming a second contact plug so as to penetrate through the second interlayer insulating film and be electrically connected to the upper impurity-diffused region, forming a first opening in a position corresponding to the protruding region B within the second interlayer insulating film, removing the first insulating layer on the protruding region B, and implanting an impurity into the protruding region B to form a connecting part, and forming a third contact plug so as to be electrically connected to the connecting part;

(8) forming a protective substrate on a first structure (the semiconductor region the upper portion of which is the upper impurity-diffused region, the gate insulating film, the gate electrode, and the second and third contact plugs);

(9) polishing the semiconductor substrate from the rear surface side thereof opposite to a side on which the first structure is formed, to reduce a thickness of the semiconductor substrate;

(10) performing anisotropic etching to the semiconductor substrate in positions corresponding to the protruding regions A and B from the rear surface side thereof, so that the etching rate of the semiconductor substrate is faster than the etching rate of the second insulating layer, to form a second opening until the second opening reaches the protruding region A which is the lower impurity-diffused region and the protruding region B which is the connecting part;

(11) forming a third insulating layer on the inner wall of the second opening; and

(12) forming a first contact plug so as to be electrically connected to the lower impurity-diffused region and the connecting part within the second opening.

In step (10) of the above-described modified example, anisotropic etching may be performed until the lower impurity-diffused region and the connecting part are exposed, or may be performed so that the lower impurity-diffused region and the connecting part are partially etched. When performing anisotropic etching so that the lower impurity-diffused region and the connecting part are partially etched, the anisotropic etching is performed so that the etching rate of the semiconductor substrate, the lower impurity-diffused region and the connecting part is faster than the etching rate of the second insulating layer.

In the above-described modified example, the formation of the first opening in step (7) described in the above-discussed section "(Method for manufacturing semiconductor device)" is performed in two separate steps. That is, the steps of forming the first openings on protruding regions A and B are respectively carried out as separate steps.

Third Exemplary Embodiment

The third exemplary embodiment relates to a method for manufacturing a semiconductor device including an interconnect structure. The third exemplary embodiment includes:

(1) forming a first insulating layer across the entire surface of a semiconductor substrate;

(2) forming a first mask pattern on the first insulating layer;

(3) etching the first insulating layer and the semiconductor substrate using the first mask pattern as a mask to form, below the first mask pattern, a protruding region a portion of which other than a portion below the first mask pattern is exposed;

(4) forming a second insulating layer in the exposed portion of the semiconductor substrate;

(5) removing the first mask pattern;

(6) forming a first interlayer insulating film over the entire surface of the semiconductor substrate;

(7-1) forming a first opening in a position corresponding to the protruding region within the first interlayer insulating film and removing the first insulating layer on the protruding region;

(7-2) forming a third contact plug so as to penetrate through the first interlayer insulating film and have contact with the protruding region;

(8) forming a protective substrate on a first structure (the third contact plug);

(9) polishing the semiconductor substrate from the rear surface side thereof opposite to a side on which the first structure is formed, to reduce a thickness of the semiconductor substrate;

(10) performing anisotropic etching to the semiconductor substrate in a position corresponding to the protruding region from the rear surface side thereof, so that the etching rate of the semiconductor substrate is faster than the etching rate of the second insulating layer, to form a second opening until the third contact plug is exposed;

(11) forming a third insulating layer on the inner wall of the second opening; and

(12) forming a connecting part so as to be electrically connected to the third contact plug within the second opening and forming a first contact plug so as to be electrically connected to the connecting part.

In the third exemplary embodiment, steps (1) to (6), (8), (9), (11) and (13) are the same as steps (1) to (6), (8), (9), (11) and (13) described in the first exemplary embodiment. Accordingly, no further explanation will be made of these steps and only steps (7), (10) and (12) will be explained.

In step (7-1) of the third exemplary embodiment, the first opening is formed within the first interlayer insulating film in a position corresponding to the protruding region, and first insulating layer on the protruding region is removed, in the same way as in step (7-1) of the first exemplary embodiment.

Next, in step (7-2), the third contact plug is formed so as to penetrate through the first interlayer insulating film and be electrically connected to the protruding region.

In step (10), anisotropic etching is performed, in the same way as in the first exemplary embodiment, in a position corresponding to the protruding region within the semiconductor substrate from the rear surface side thereof, thereby forming the second opening. This formation of the second opening is performed until the third contact plug is exposed.

In addition, in step (12), the connecting part is formed so as to have contact with the third contact plug within the second opening, and the first contact plug is formed so as to have contact with the connecting part, as in the first exemplary embodiment. In this third exemplary embodiment, the third contact plug is formed as a first structure. In some cases, the other structure may be formed as the first structure.

In the modified example of the present exemplary embodiment, anisotropic etching is performed in step (10) to form the second opening until the second opening reaches the protruding region which is the connecting part, and the protruding region is left over. After this, the first contact plug is formed so as to be electrically connected to the connecting part. Specifically, this modified example includes:

(1) forming a first insulating layer across the entire surface of a semiconductor substrate;

(2) forming a first mask pattern on the first insulating layer;

(3) etching the first insulating layer and the semiconductor substrate using the first mask pattern as a mask to form, below the first mask pattern, a protruding region a portion of which other than a portion below the first mask pattern is exposed;

(4) forming a second insulating layer in the exposed portion of the semiconductor substrate;

(5) removing the first mask pattern;

(6) forming a first interlayer insulating film over the entire surface of the semiconductor substrate;

(7-1) forming a first opening in a position corresponding to the protruding region within the first interlayer insulating film and removing the first insulating layer on the protruding region;

(7-2) implanting an impurity into the protruding region to convert the protruding region into a connecting part;

(7-3) forming a third contact plug so as to penetrate through the first interlayer insulating film and be electrically connected to the protruding region which is the connecting part;

(8) forming a protective substrate on a first structure (the third contact plug);

(9) polishing the semiconductor substrate from the rear surface side thereof opposite to a side on which the first structure is formed, to reduce a thickness of the semiconductor substrate;

(10) performing anisotropic etching to the semiconductor substrate in a position corresponding to the protruding region from the rear surface side thereof, so that the etching rate of the semiconductor substrate is faster than the etching rate of the second insulating layer, to form a second opening until the second opening reaches the protruding region which is the connecting part;

(11) forming a third insulating layer on the inner wall of the second opening; and

(12) forming a first contact plug so as to be electrically connected to the connecting part within the second opening.

In step (10) of the above-described modified example, anisotropic etching may be performed until the connecting part is exposed or may be performed so that the connecting part is partially etched. When performing anisotropic etching so that the connecting part is partially etched, the anisotropic etching is performed so that the etching rate of the semiconductor substrate and the connecting part is faster than the etching rate of the second insulating layer.

Variations of the First to Third Exemplary Embodiments

Furthermore, the portions of the semiconductor device according to the first to third exemplary embodiments can be varied as described below.

Gate Electrode

The gate electrode may be formed of polysilicon. Alternatively, the gate electrode may be formed of a metal material as a metal gate electrode. In this case, the metal gate electrode may be composed an alloy of one or more metal materials, or the like.

Moreover, the metal gate electrode may be formed of silicide. The silicide is not particularly limited provided that the silicide is composed of a metal which can be silicidized by being allowed to react with silicon. The silicide may be, for example, $NiSi$, $Ni_2Si$, $Ni_3Si$, $NiSi_2$, $WSi_2$, $TiSi_2$, $WSi_2$, $CrSi_2$, $ZrSi_2$, $NbSi_2$, $MoSi_2$, $TaSi_2$, $CoSi$, $CoSi_2$, $PtSi$, $Pt_2Si$, or $Pd_2Si$.

Gate Insulating Film

The gate insulating film may be formed of an oxide film. Alternatively, the gate insulating film may be formed of a high-dielectric-constant insulating film containing Hf and offering a high dielectric constant. Alternatively, the gate insulating film may be formed of a high-dielectric-constant insulating film containing no Hf and offering a high dielectric constant. The "high-dielectric-constant insulating film" refers to an insulating film offering a larger relative dielectric constant than $SiO_2$ ($SiO_2$ offers a relative dielectric constant of about 3.6), which is commonly utilized as a gate insulating film in the semiconductor device. Typically, the relative dielectric constant of the high-dielectric-constant insulating film may be several tens to several thousands. The high-dielectric-constant insulating film may be, for example, HfSiO, HfSiON, HfZrSiO, HfZrSiON, ZrSiO, ZrSiON, HfAlO, HfAlON, HfZrAlO, HfZrAlON, ZrAlO, or ZrAlON.

Other Materials

The interconnect material may be silicide or metal, or any other conductive substance.

The insulating material is not limited to an oxide film but may be a nitride film. Alternatively, SiON, SiOC, or the like may be used as the insulating material.

Application of the Vertical MOSFET

The vertical MOSFET may be utilized as a flash memory by forming a floating portion in the gate electrode. Furthermore, the transistor may be utilized as an ordinary transistor, or holes may be stored in the body of the transistor so that the transistor can be utilized as a floating body cell (FBC) that operates as a memory.

Example

A semiconductor device including a vertical MOSFET and an interconnect structure was manufactured in the manner described below. This method for manufacturing a semiconductor device corresponds to the manufacturing method of the above-described second exemplary embodiment.

First, silicon semiconductor substrate 11 was prepared and then the front surface of this silicon semiconductor substrate 11 was oxidized to form silicon dioxide film (first insulating layer) 12 (step (1)). Dry oxidization was performed as a method of this oxidization, thereby forming a 10 nm-thick silicon dioxide film.

After this, a nitride film was grown to a thickness of 100 nm. Then, line-and-space formation was performed using a lithography technique and photoresist 14 was subjected to patterning. At this time, the width of a line was set to 70 nm and the width of a space was set to 70 nm. Next, using the pattern of this photoresist 14 as a mask, the nitride film was subjected to patterning to form the first mask pattern (reference numeral 13) (FIG. 1: step (2)).

After this, the photoresist used for the lithography technique was separated. Then, using the first mask pattern (reference numeral 13) made of the nitride film as a hard mask, silicon dioxide film 12 and silicon semiconductor substrate 11 were dry-etched to a depth of 50 nm, thereby forming protruding region A (reference numeral 15) and protruding region B (reference numeral 30) below the first mask pattern. At this time, the portions of silicon semiconductor substrate 11 other than a portion below the first mask pattern were exposed (step (3)).

Figure 2:
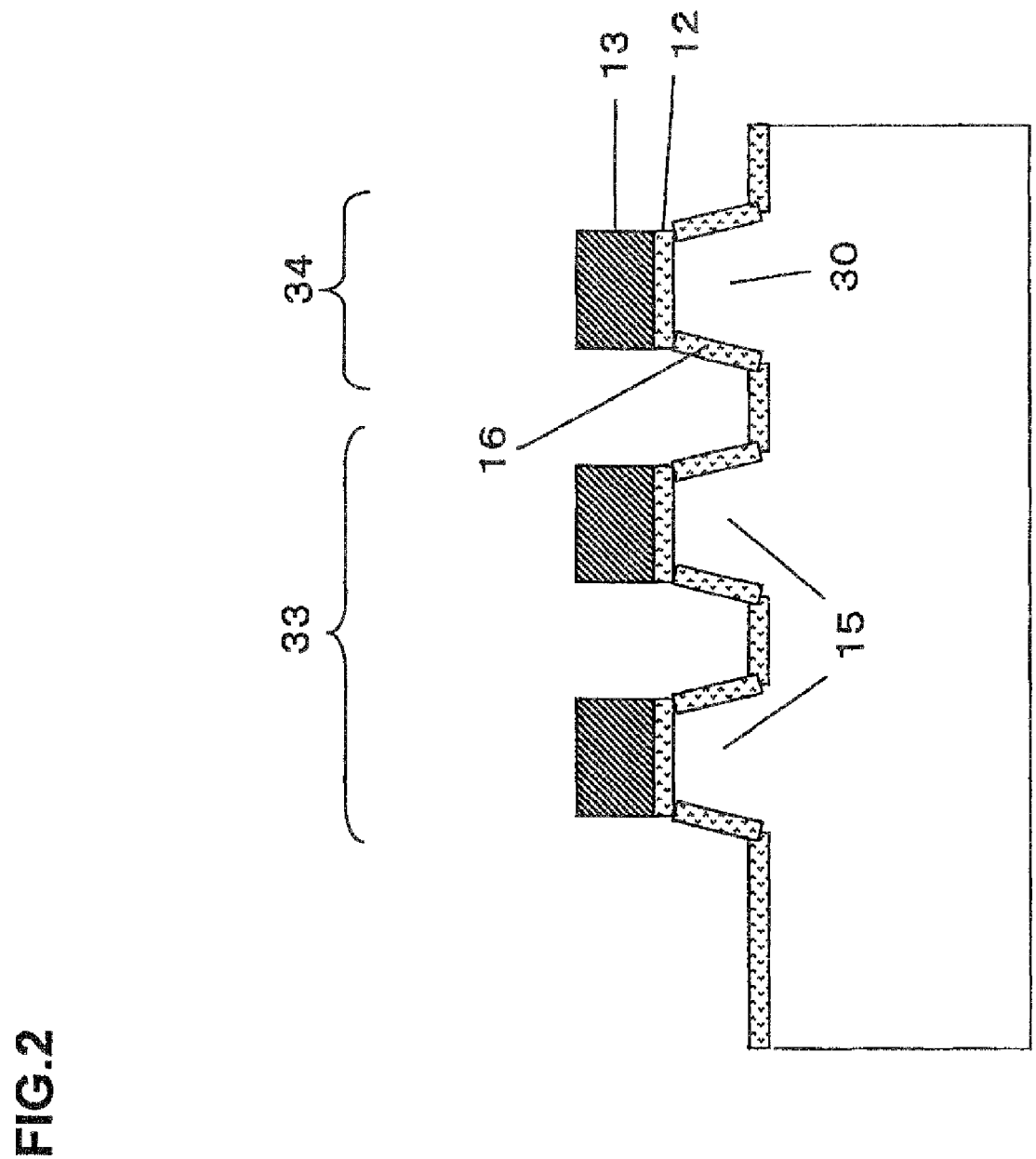
FIG. 2 is another schematic view illustrating one step of the method for manufacturing the semiconductor device of the present invention.

After this, thermal oxidation was performed on the exposed portions of the silicon semiconductor substrate to form 10 nm-thick silicon dioxide film (second insulating layer) 16 (FIG. 2: step (4)).

Figure 3:
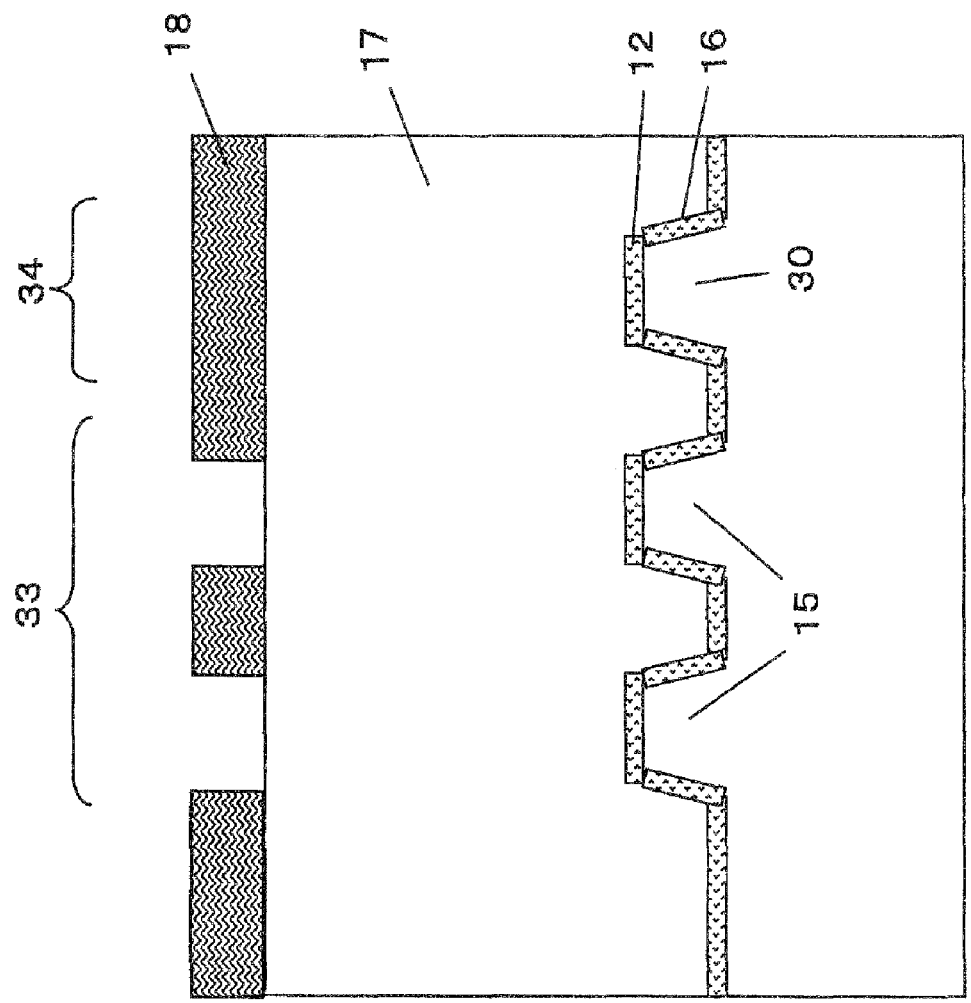
FIG. 3 is yet another schematic view illustrating one step of the method for manufacturing the semiconductor device of the present invention.

After this, the first mask pattern (reference numeral 13) made of the nitride film was removed by wet etching (step (5)). Then, 500 nm-thick silicon dioxide film (first interlayer insulating film) 17 was formed by means of oxide film growth across the entire surface of the semiconductor device being manufactured (step (6)). After this, an improvement was made to the planarity of the silicon dioxide film by means of CMP. Then, photoresist mask pattern 18 was formed using a lithography technique so as to include an opening in a position corresponding to protruding region A (FIG. 3).

After this, silicon dioxide film 17 was dry-etched using this mask pattern 18 as a mask, thereby forming the first opening in a position corresponding to protruding region A (reference numeral 15). Concurrently, silicon dioxide film (first insulating layer) 12 on protruding region A (reference numeral 15) was removed (step (7-1)). After this, the resist mask was separated. Then, arsenic was implanted into protruding region A (reference numeral 15) under the condition of 10 KeV and $1 \times 10^{15}/cm^2$ to form lower impurity-diffused region 19 (step (7-2)).

Figure 4:
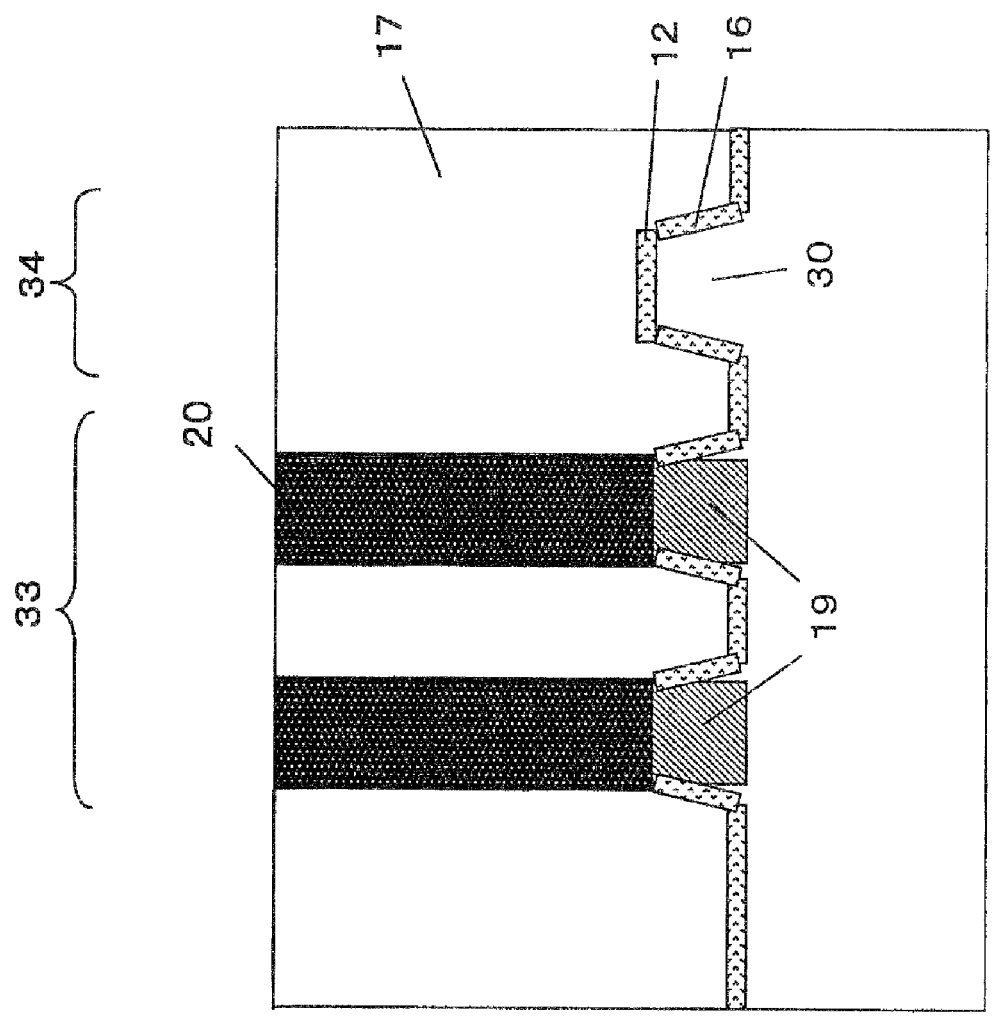
FIG. 4 is still another schematic view illustrating one step of the method for manufacturing the semiconductor device of the present invention.

After this, selective epitaxial growth was caused to take place on lower impurity-diffused region 19 within the first opening, thereby forming semiconductor region 20 made of silicon crystal on lower impurity-diffused region 19 (FIG. 4: step (7-3)).

After this, silicon dioxide film (first interlayer insulating film) 17 was set back to the front surface of the silicon semiconductor substrate by dry etching or by wet etching, thereby exposing semiconductor region 20 (step (7-4)). Then, a side surface of the exposed semiconductor region parallel with the thickness direction of the semiconductor substrate was oxidized to form gate insulating film 21 made of a 10 nm-thick silicon dioxide film (step (7-5)).

Figure 5:
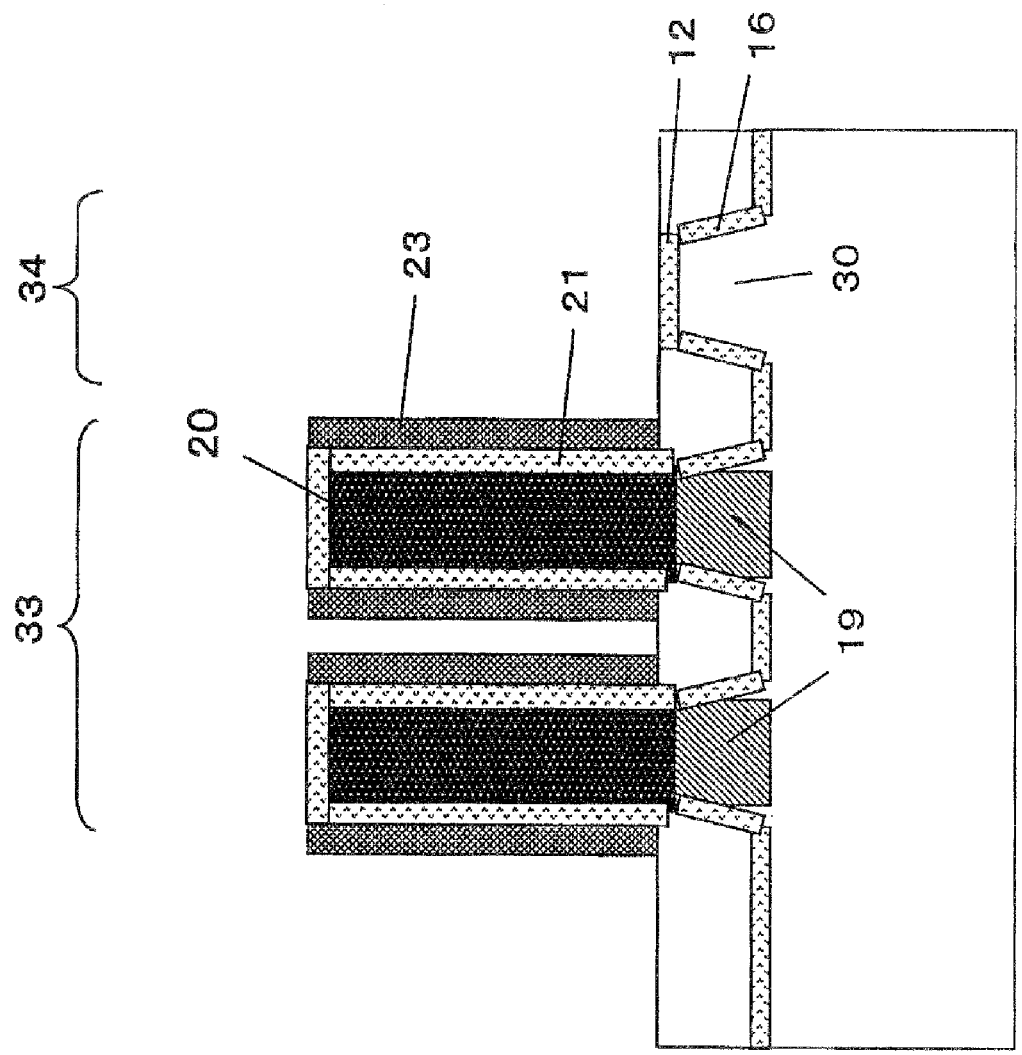
FIG. 5 is still another schematic view illustrating one step of the method for manufacturing the semiconductor device of the present invention.

After this, 30 nm-thick DOPOS (doped polycrystalline silicon) was grown on gate insulating film 21, and then etched back by dry etching to form 30 nm-thick gate electrode 23 (FIG. 5: step (7-6)).

Figure 6:
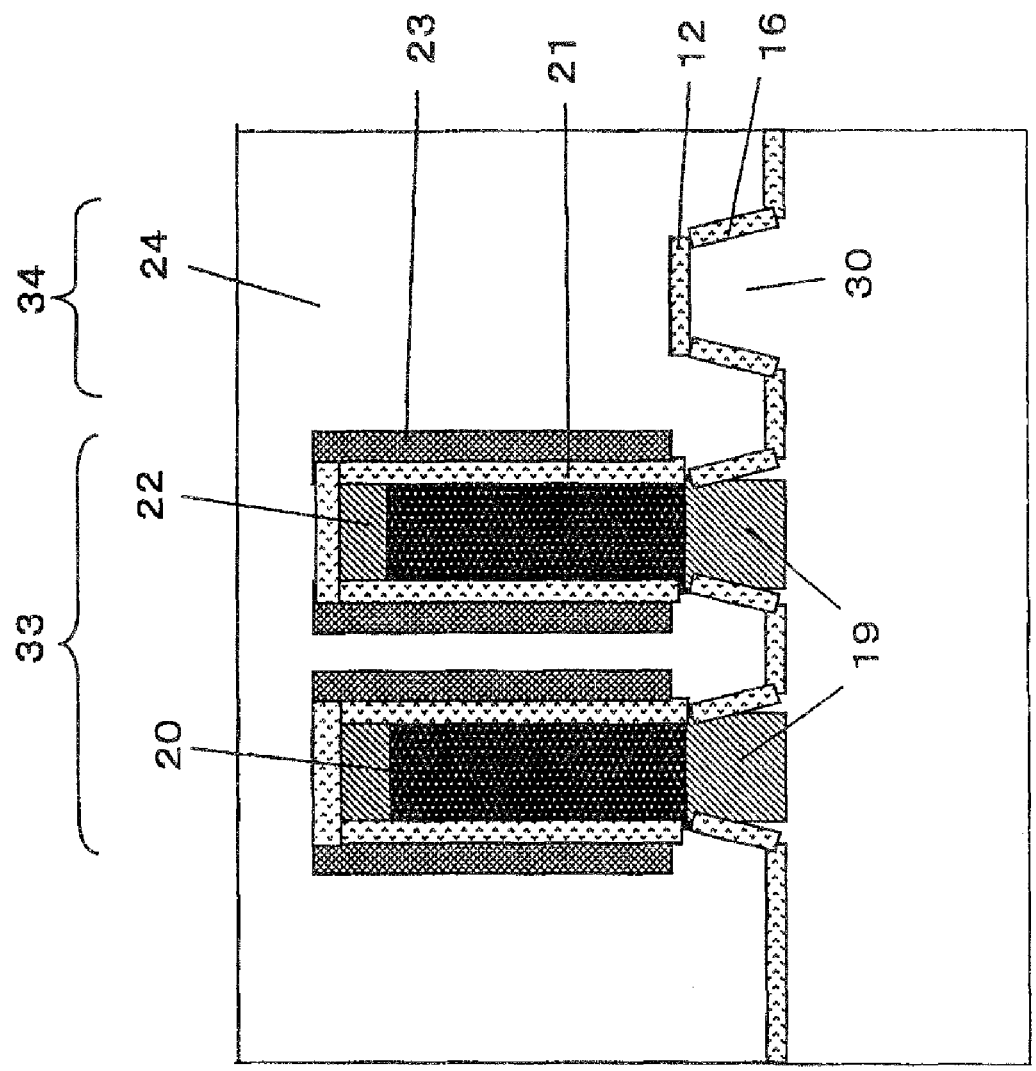
FIG. 6 is still another schematic view illustrating one step of the method for manufacturing the semiconductor device of the present invention.

After this, arsenic was implanted into the upper portion of semiconductor region 20 under the condition of 10 KeV and $11 \times 10^{15}/cm^2$ to convert the upper portion of semiconductor region 20 into upper impurity-diffused region 22 (step (7-7)). Then, silicon dioxide film (second interlayer insulating film) 24 was deposited using a CVD method, and then planarized by means of CMP (FIG. 6: step (7-8)).

Figure 7:
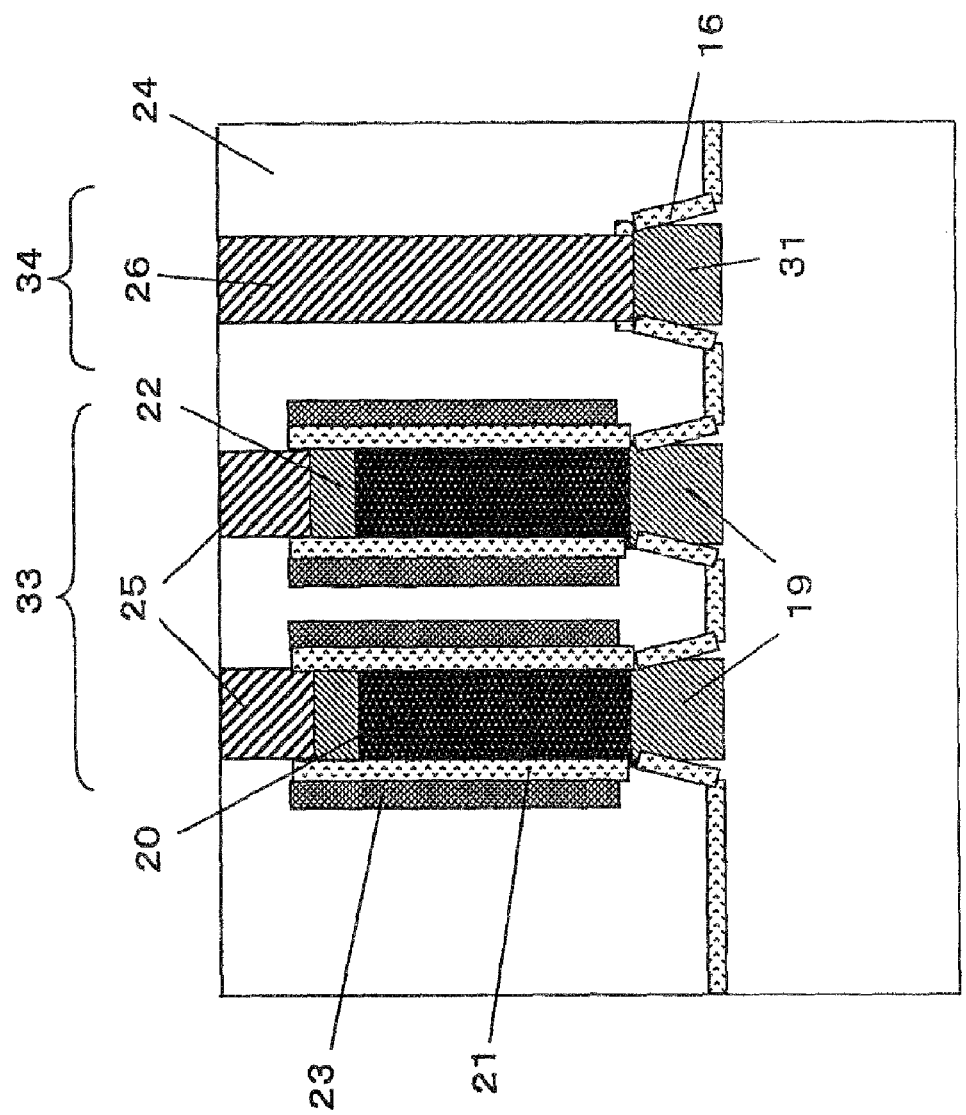
FIG. 7 is still another schematic view illustrating one step of the method for manufacturing the semiconductor device of the present invention.

After this, second and third contact plugs 25 and 26 were formed. That is, a mask pattern (not illustrated) aligned with the semiconductor region and protruding region B was formed on silicon dioxide film (second interlayer insulating film) 24. Then, using this mask pattern as a mask, an opening was formed within silicon dioxide film 24 in a position corresponding to semiconductor region 20 and the first opening formed within silicon dioxide film 24 in a position corresponding to protruding region B (reference numeral 30). Next, after removing silicon dioxide film 12 (second insulating film) on this protruding region B (reference numeral 30), an impurity was implanted into protruding region B to convert the protruding region B into connecting part 31. After this, polysilicon was buried in the opening in a position corresponding to the semiconductor region and in the first opening in a position corresponding to connecting part 31. Then, boron was implanted into this polysilicon under the condition of 10 keV and $1 \times 10^{15}/cm^2$ (FIG. 7: step (7-9)). Consequently, second contact plug 25 was formed so as to be electrically connected to upper impurity-diffused region 22 of the semiconductor region and third contact plug 26 was formed so as to be electrically connected to connecting part 31.

Figure 8:
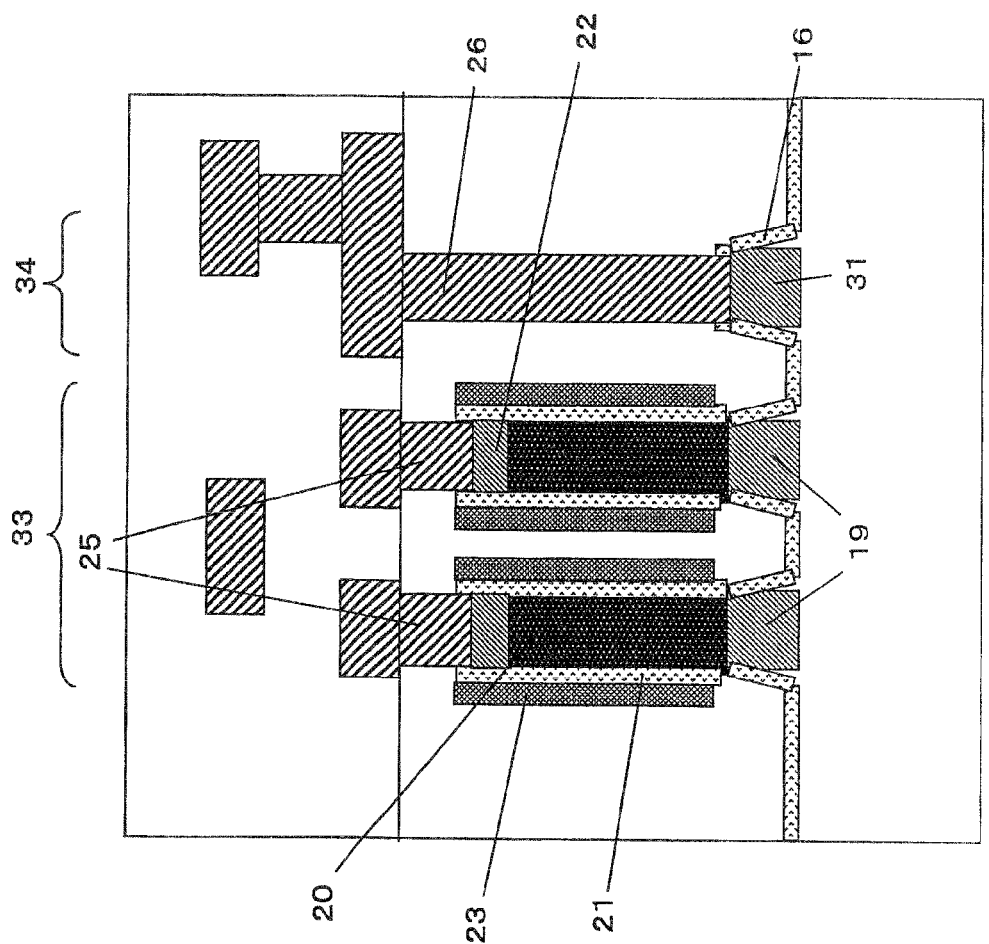
FIG. 8 is still another schematic view illustrating one step of the method for manufacturing the semiconductor device of the present invention.
Figure 9:
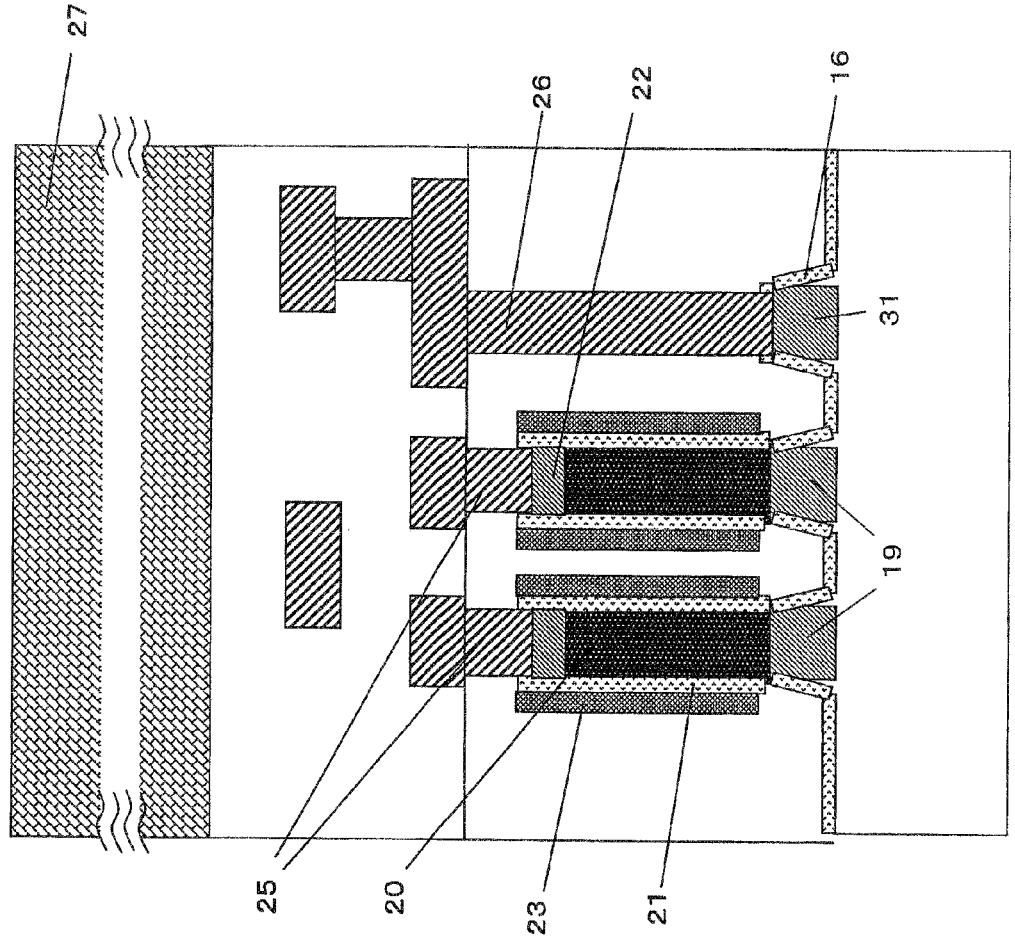
FIG. 9 is still another schematic view illustrating one step of the method for manufacturing the semiconductor device of the present invention.

After this, an upper interconnect layer and a contact were formed on silicon dioxide film (second interlayer insulating film) 24 using a publicly-known method (FIG. 8). Then, 1 mm-thick supporting substrate 27, for example, was bonded on top of this semiconductor device being manufactured (FIG. 9: step (8)).

Figure 10:
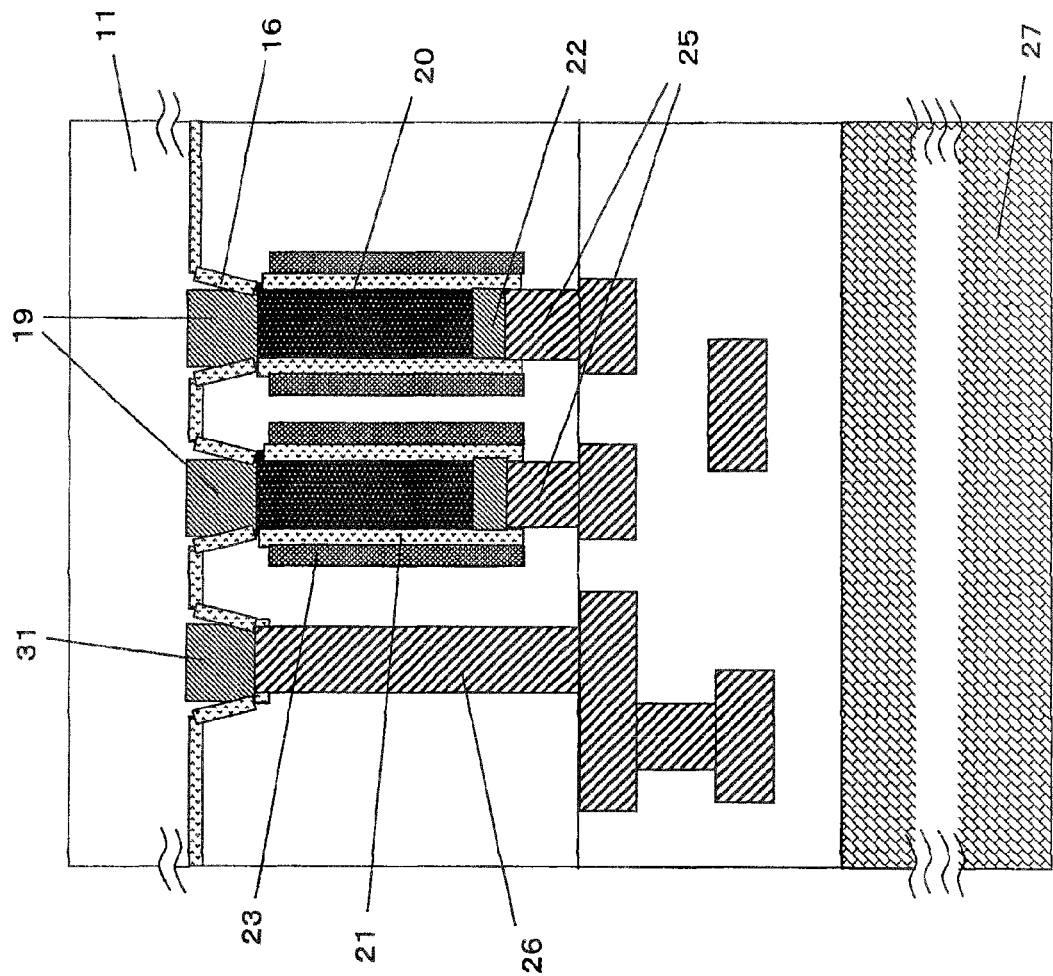
FIG. 10 is still another schematic view illustrating one step of the method for manufacturing the semiconductor device of the present invention.

After this, an assembly of the silicon semiconductor substrate and the supporting substrate thus integrated was turned upside down (FIG. 10). Then, the assembly was polished from the rear surface side of silicon semiconductor substrate 11 by means of CMP to thin down the silicon semiconductor substrate (FIG. 11: step (9)).

Figure 12:
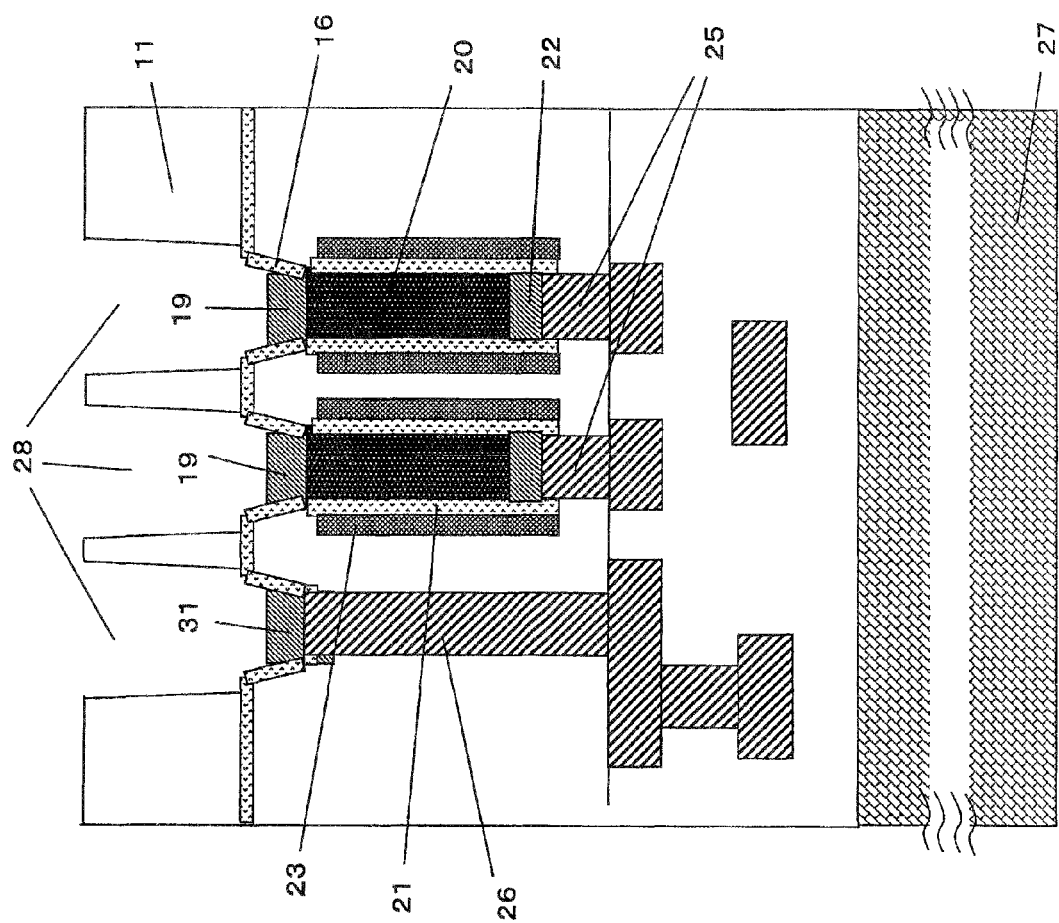
FIG. 12 is still another schematic view illustrating one step of the method for manufacturing the semiconductor device of the present invention.

After this, a photoresist mask pattern (not illustrated) including openings in positions corresponding to protruding regions A and B was formed on the rear surface side of silicon semiconductor substrate 11 using a lithography technique. Next, using this photoresist mask pattern as a mask, anisotropic dry etching was performed on the rear surface side of silicon semiconductor substrate 11. At this time, the condition of anisotropic dry etching was set so that the etching rate of silicon semiconductor substrate 11, connecting part 31 and lower impurity-diffused region 19 was faster than the etching rate of second insulating layer (reference numeral 16) and that a selection ratio between the silicon semiconductor substrate and the silicon dioxide film was large. By setting the anisotropic dry etching to these conditions, it was possible to etch silicon semiconductor substrate 11 and the like so as to leave over silicon dioxide film 16. In addition, it was possible to form the second opening (reference numeral 28) until the second opening reached lower impurity-diffused region 19 and connecting part 31, with the opening precisely aligned in a self-aligned manner. In the present exemplary embodiment, not only silicon semiconductor substrate 11 but also connecting part 31 and lower impurity-diffused region 19 were partially removed by anisotropic dry etching (FIG. 12: step (10)). Subsequently, the photoresist mask pattern was separated.

After this, thermal oxidation was performed on the silicon semiconductor substrate under the condition of, for example, 850° C., thereby forming 20 nm-thick silicon dioxide film (third insulating layer) 29 on the inner wall of the second opening (reference numeral 28) (step (11)).

Figure 13:
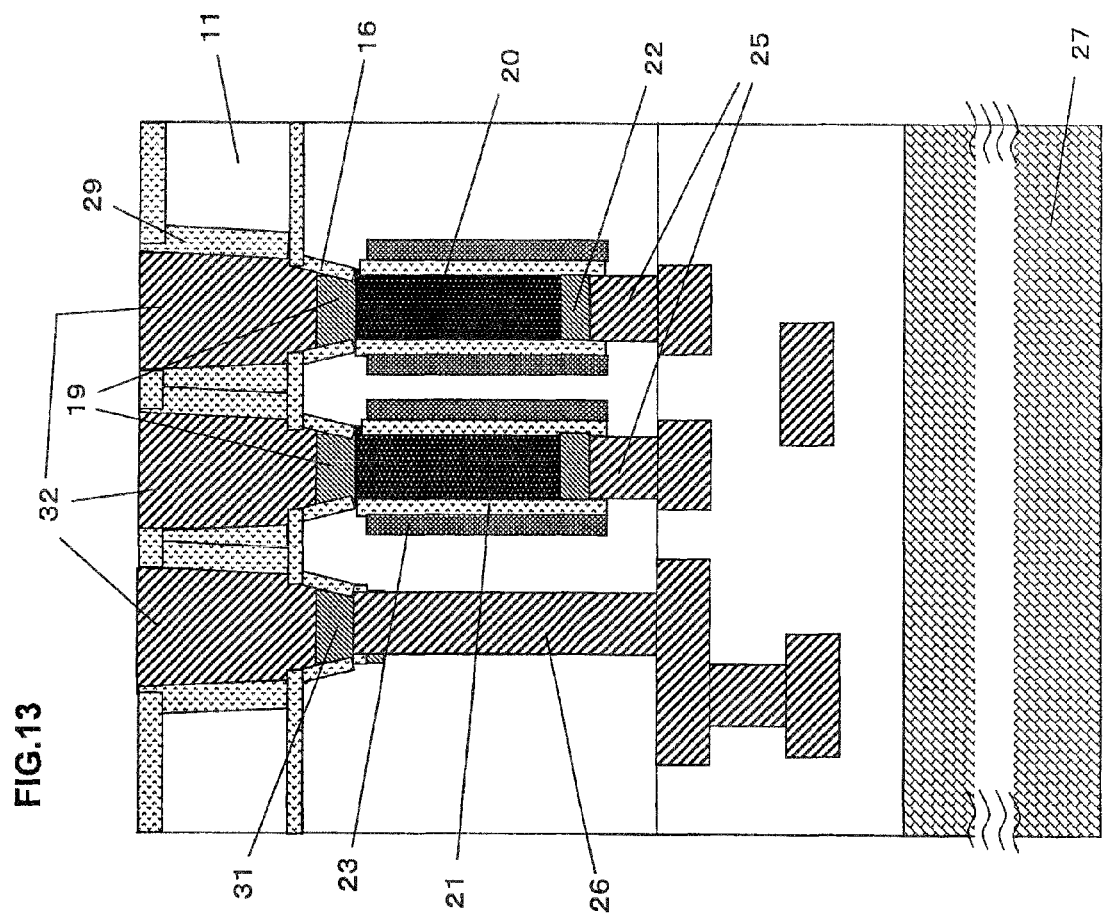
FIG. 13 is still another schematic view illustrating one step of the method for manufacturing the semiconductor device of the present invention.
Figure 14:
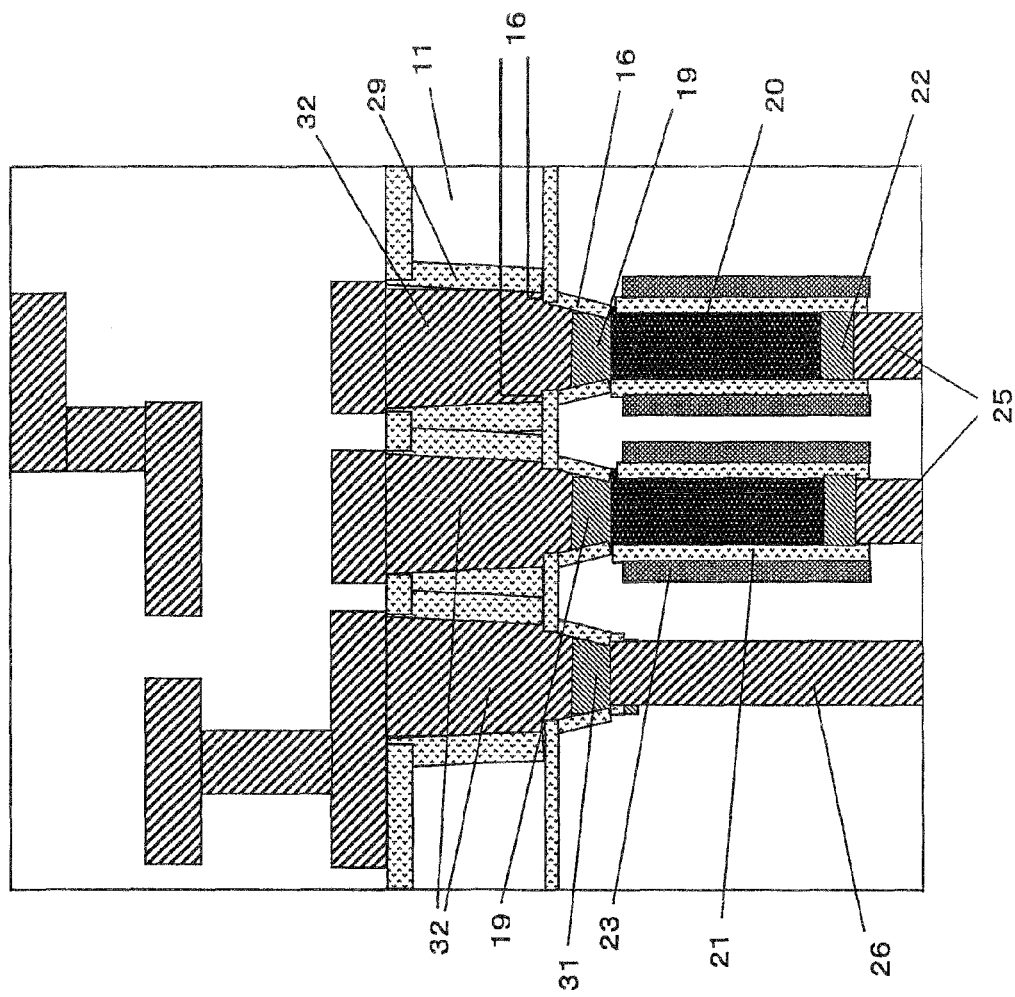
FIG. 14 is still another schematic view illustrating one step of the method for manufacturing the semiconductor device of the present invention.
Figure 15A:
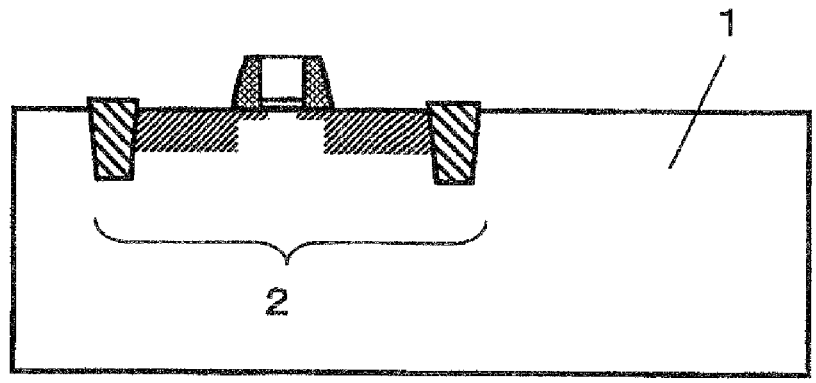
FIG. 15 is a schematic view illustrating one step of a method for manufacturing a related semiconductor device.
Figure 15B:
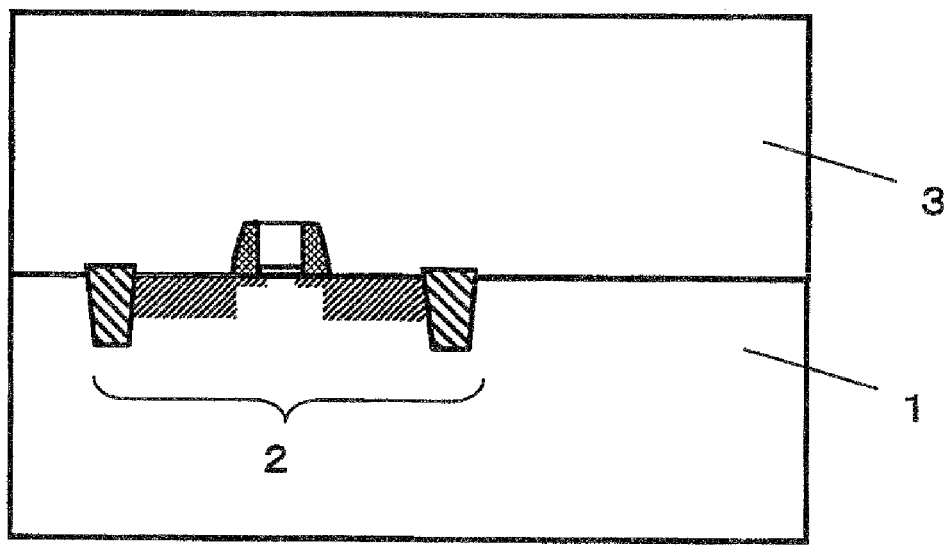
Figure 16A:
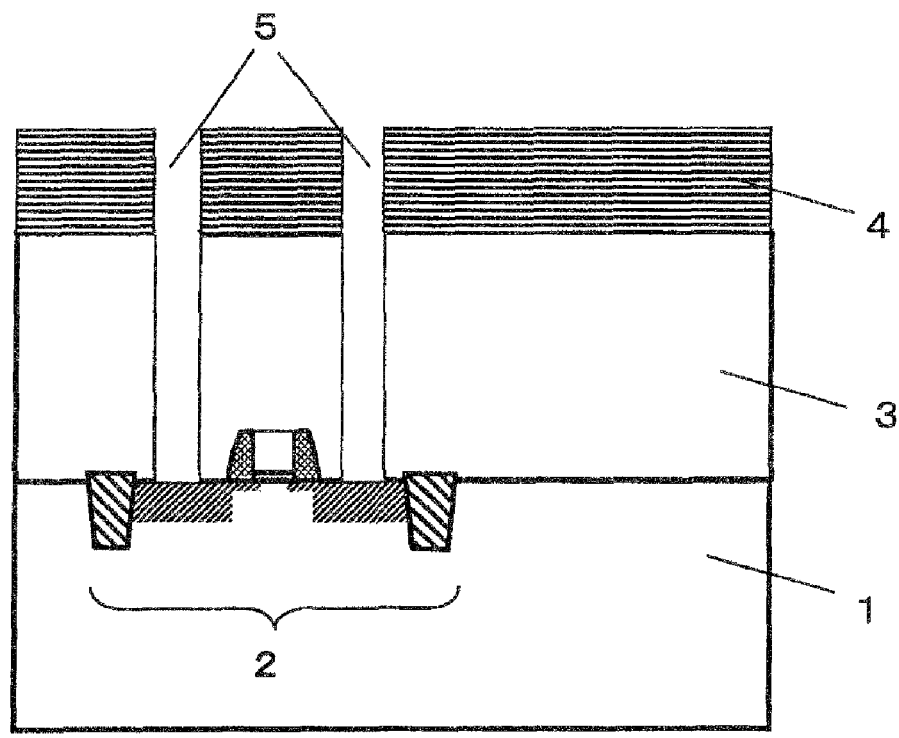
FIG. 16 is another schematic view illustrating one step of the method for manufacturing the related semiconductor device.
Figure 16B:
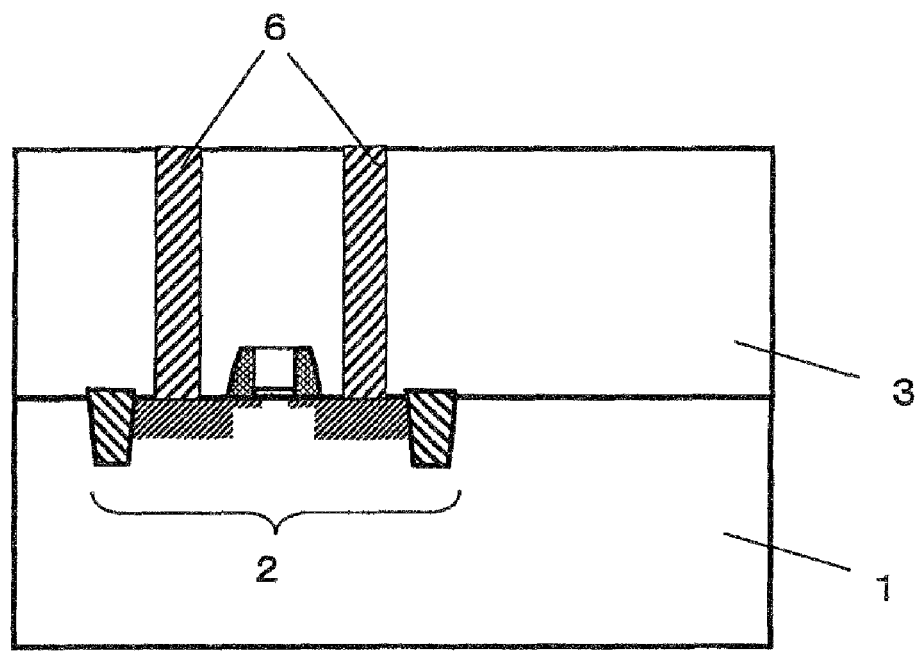
Figure 17A:
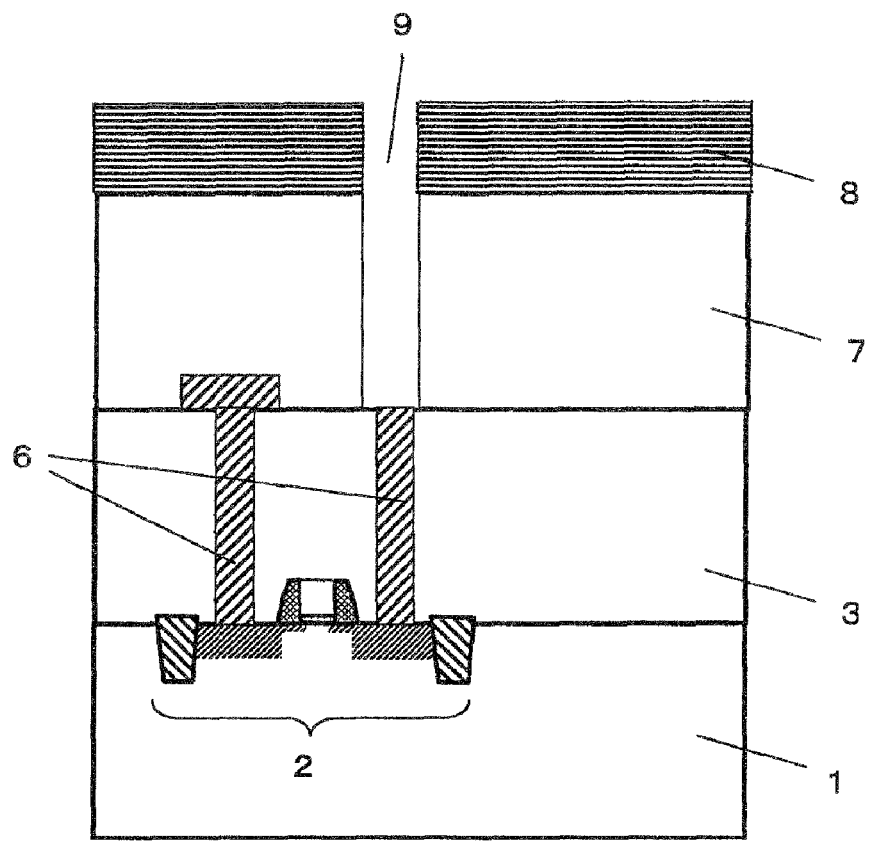
FIG. 17 is yet another schematic view illustrating one step of the method for manufacturing the related semiconductor device.
Figure 17B:
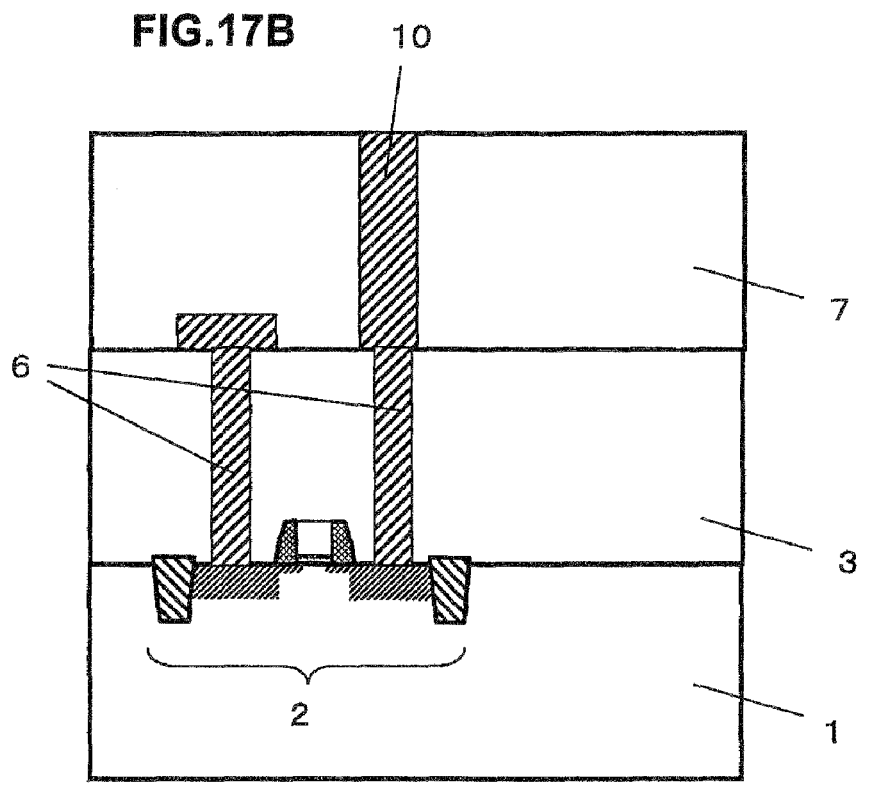

Subsequently, a polysilicon layer was buried in the second opening (reference numeral 28), and then an impurity was implanted into the polysilicon layer. Thus, first contact plug 32 was formed so as to be electrically connected to lower impurity-diffused region 19, and another first contact plug 32 was formed so as to be electrically connected to connecting part 31 (FIG. 13: step (12)). In the manner described above, it was possible to obtain the semiconductor device (FIG. 14).

It is apparent that the present invention is not limited to the above embodiments, but may be modified and changed without departing from the scope and spirit of the invention. FIG. 18 is a schematic view illustrating a finally formed semiconductor device.

In the present embodiment, the vertical MOSFET includes a channel portion formed by performing a selective epitaxial growth as a crystal nucleus of a silicon semiconductor substrate. The channel portion formed by a selective epitaxial growth has a better crystallinity than a channel portion formed by CVD. Since the vertical MOSFET is connected with the second contact plug and interconnect and the semiconductor device of the present embodiment does not need a space for the interconnect, the semiconductor device has advantage for miniaturization of device. In the present embodiment, the first contact plug can be formed in the self-aligned manner, even misalignment of mask is large during forming the first contact plug from the rear side of the semiconductor substrate. As a result, the device can be easily formed. The structure formed by the present embodiment has a feature of an enlarged margin of misalignment during forming a contact hole.

Variation of Exemplary Embodiment 1

The portions of Exemplary Embodiment 1 can be varied as described below.

Figure 19:
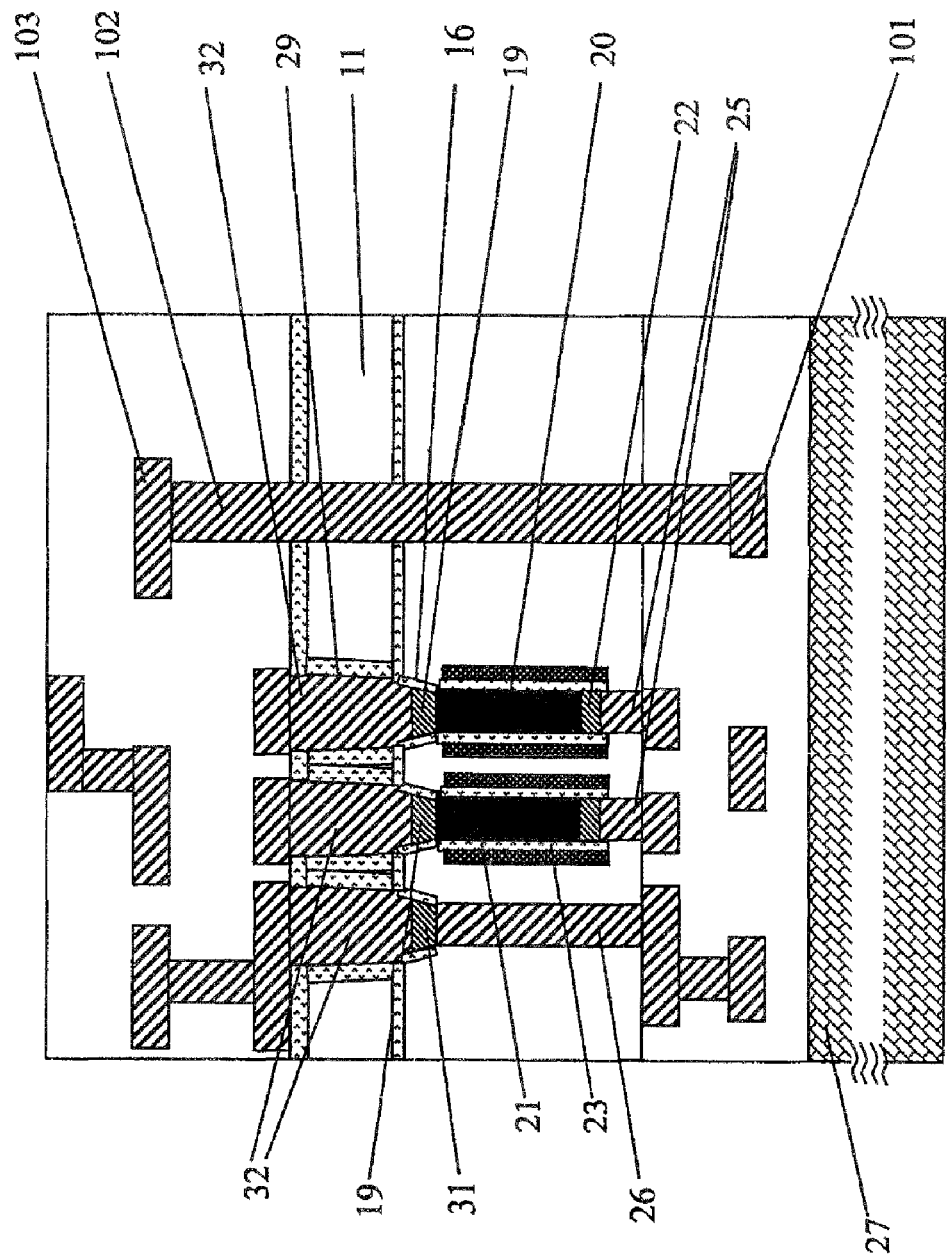
FIG. 19 is a schematic view illustrating another example of the semiconductor device of the present invention.

As shown in FIG. 19, contact plug 102 may be formed which connects interconnect 101 formed on the front surface side of the semiconductor substrate making up the vertical MOSFET to interconnect 103 formed on the rear surface side thereof.

Figure 20:
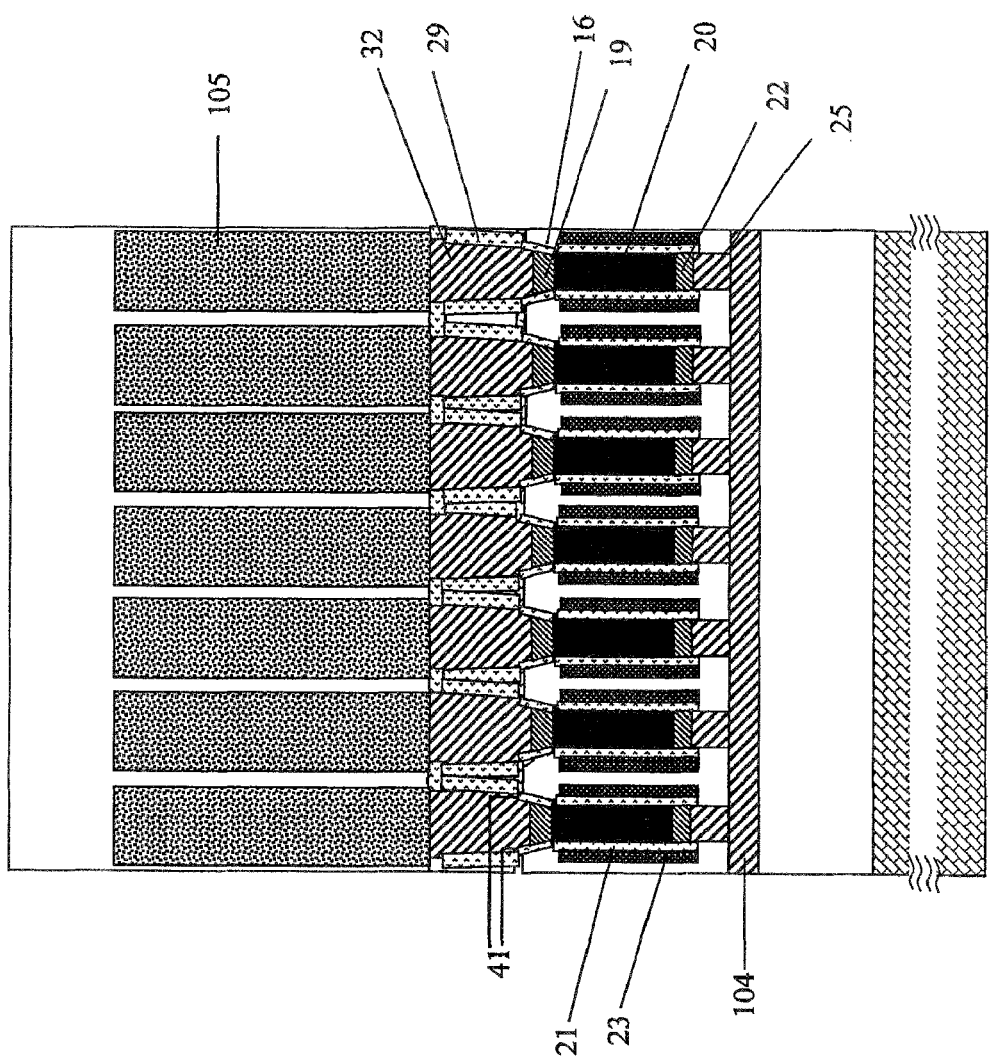
FIG. 20 is a schematic view illustrating another example of the semiconductor device of the present invention.

As shown in FIG. 20, bit line 104 connected to the upper impurity-diffused region of the vertical MOSFET may be formed on the front surface side of the semiconductor substrate. Capacitor 105 connected to the lower impurity-diffused region of the vertical MOSFET may be formed on the rear surface side of the semiconductor substrate. In this case, the vertical MOSFET and the capacitor make up a DRAM. The first structure includes the vertical MOSFET, the second contact plug, the bit line, and the like. The semiconductor device as a whole may be utilized as a phase change memory by replacing capacitor 105 with a phase change substance.

Figure 21:
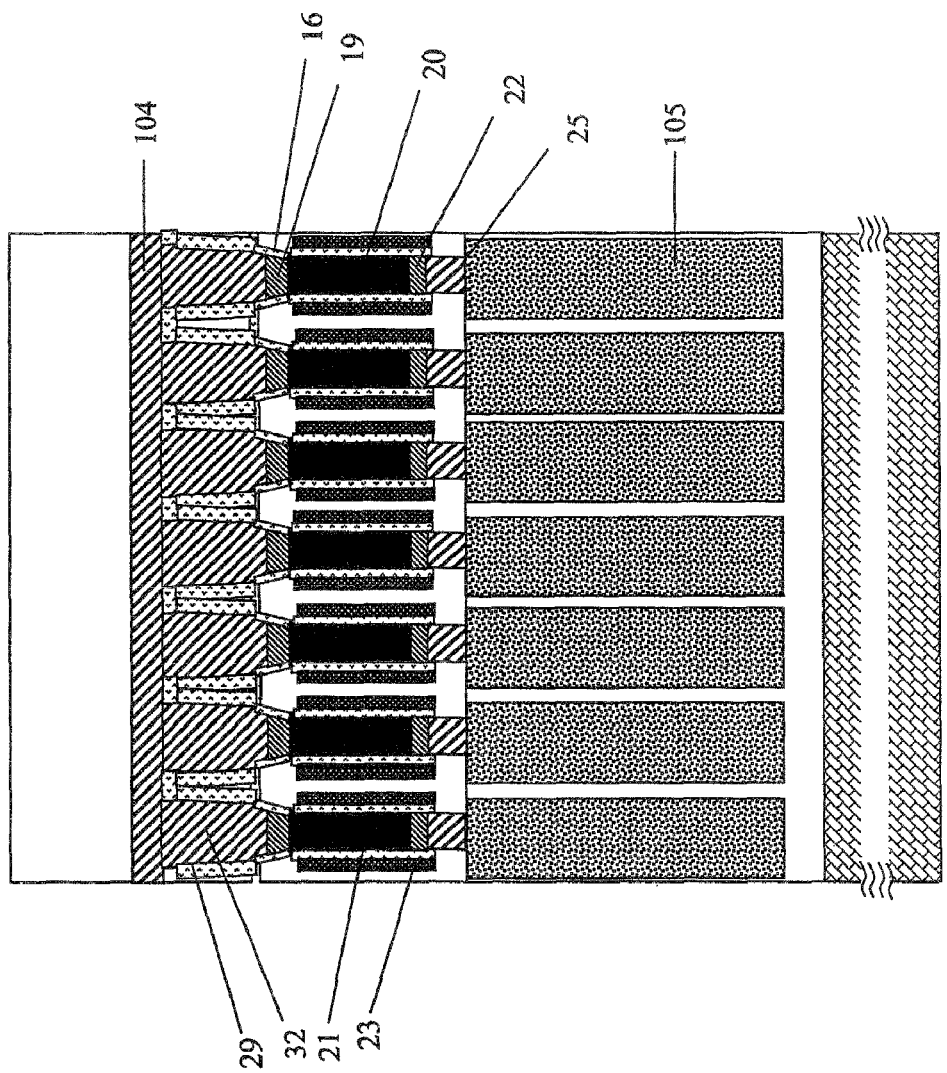
FIG. 21 is a schematic view illustrating another example of the semiconductor device of the present invention.

As shown in FIG. 21, capacitor 105 connected to the upper impurity-diffused region of the vertical MOSFET may be formed on the front surface side of the semiconductor substrate. Bit line 104 connected to the lower impurity-diffused region of the vertical MOSFET may be formed on the rear surface side of the semiconductor substrate. In this case, the semiconductor device may be utilized as a DRAM. The first structure includes the vertical MOSFET, the second contact plug, the capacitor, and the like. The semiconductor device as a whole may be utilized as a phase change memory by replacing capacitor 105 with a phase change substance.

If a minimum process dimension is defined as "F", interconnect layer opposite to the capacitor sandwiching the MOSFET can be formed in 2F pitch. If interconnect layer is formed in 2F pitch only over front surface side of the semiconductor substrate, process flow becomes very complicated. In contrast, in the present embodiment, 2F pitch interconnect layer can be easily formed. For example, formation of 2F pitch bit line improves an integration level per unit area of DRAM, and the like.

Exemplary Embodiment 2

In the present exemplary embodiment, the first contact is formed from the rear surface side of the semiconductor substrate by a forming method different from that used in Exemplary Embodiment 1. First, the manufacturing process is carried out as is the case with Exemplary Embodiment 1 until the step shown in FIG. 11. However, the present exemplary embodiment differs from Exemplary Embodiment 1 in that the present exemplary embodiment omits the step of implanting the impurity into protruding region 15 to form the lower impurity-diffused region. Instead, after formation of semiconductor region 20, the impurity is implanted into the lower portion of semiconductor region 20, which contacts protruding region 15, to form lower impurity-diffused region 19.

Figure 22:
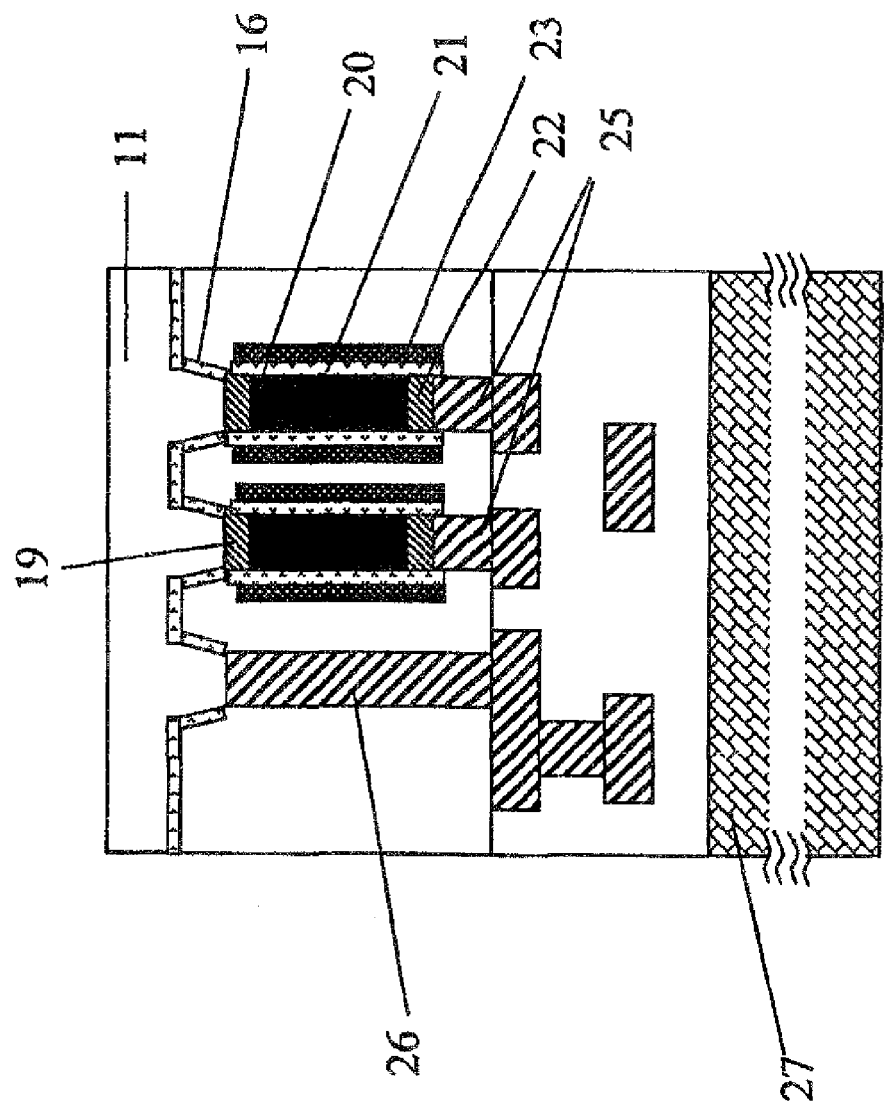
FIG. 22 is still another schematic view illustrating one step of the method for manufacturing the semiconductor device of the present invention.
Figure 23:
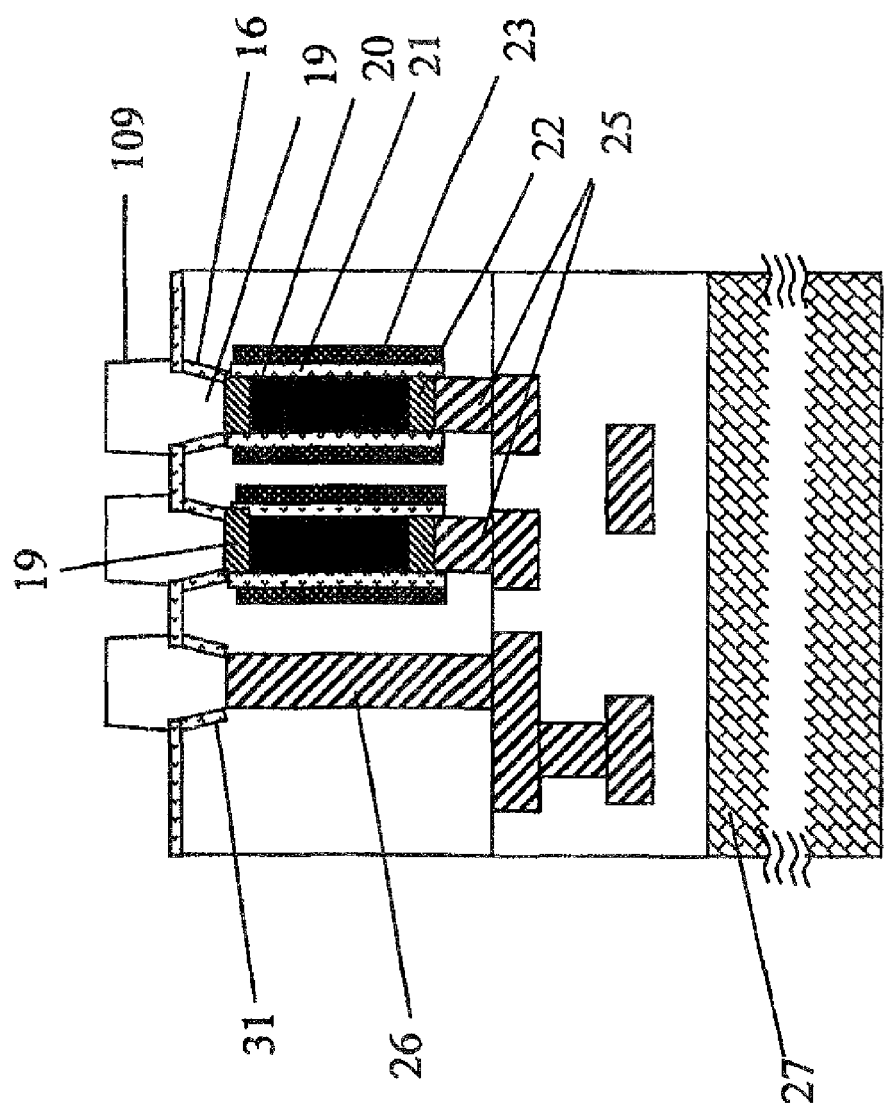
FIG. 23 is still another schematic view illustrating one step of the method for manufacturing the semiconductor device of the present invention.
Figure 24:
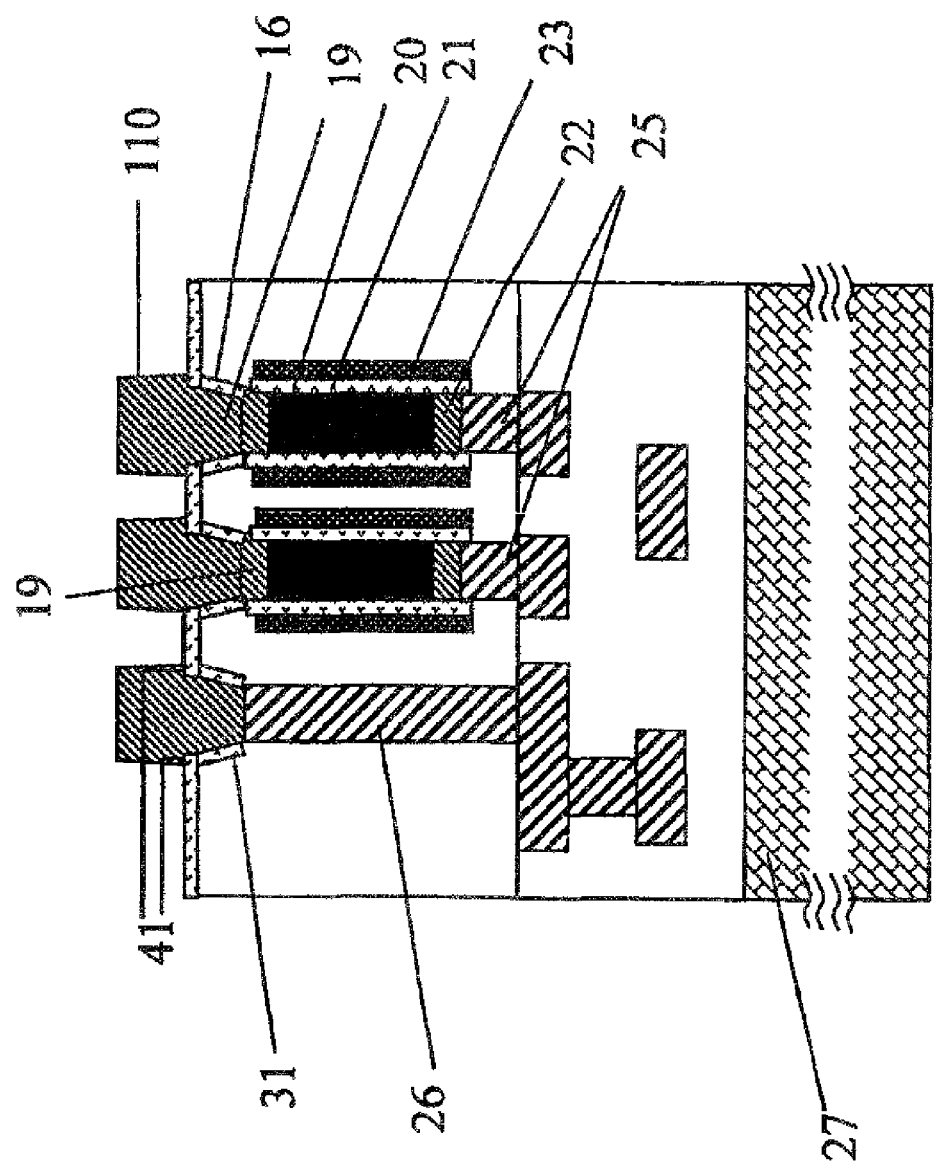
FIG. 24 is still another schematic view illustrating one step of the method for manufacturing the semiconductor device of the present invention.

FIGS. 22 to 24 show subsequent steps. First, the rear surface side of semiconductor substrate 11 is polished by CMP (FIG. 22). Thereafter, the lithography technique is used to pattern semiconductor substrate 11 from the rear surface side thereof to form a plurality of semiconductor portions 109 in association with respective semiconductor regions 20 and respective third contact plugs 26 (FIG. 23). Then, the impurity is implanted into respective semiconductor portions 109 to form first contact plugs 110 (FIG. 24).

In the method for forming the first contact plug according to the present exemplary embodiment, when semiconductor substrate 11 is patterned from the rear surface side thereof, anisotropic etching is performed so that the etching rate of semiconductor substrate 11 is faster than that of second insulating layer (reference numeral 16), thereby providing openings. Thus, first contact plugs 110 can be formed in a self-aligned manner.

There is no semiconductor such as silicon between such a formed contact plug 110 and the other contact plug 110. The above feature of the present embodiment is definitely different from the first embodiment. In present embodiment, forming of such structure reduces a short circuit of interconnect layer and improves a yield of a semiconductor device.

Exemplary Embodiment 3

In the example illustrated in Exemplary Embodiments 1 and 2, the vertical MOSFET is formed on the front surface side of the semiconductor substrate. However, the vertical MOSFET may or may not be used as a part of the transistor formed on the front surface of the semiconductor substrate. Alternatively, an ordinary planar transistor alone may be formed on the front surface side of the semiconductor substrate.

Figure 25:
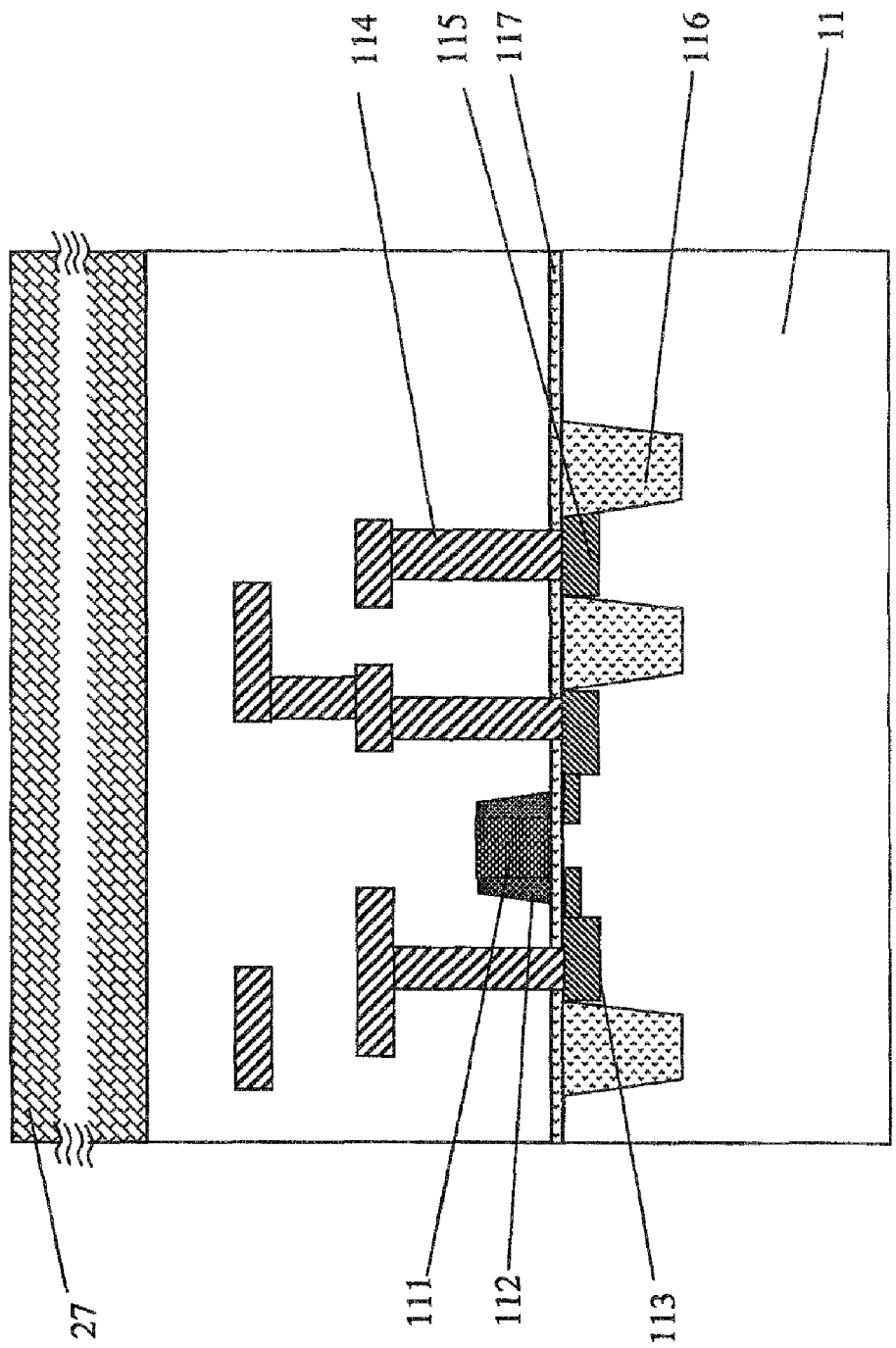
FIG. 25 is still another schematic view illustrating one step of the method for manufacturing the semiconductor device of the present invention.

FIGS. 25 to 28 show a method for manufacturing a semiconductor device using only a planar transistor as the transistor. First, a well-known method is used to form gate insulating film 117 on the front surface side of semiconductor substrate 11. Thereafter, isolation region (STI) 116 and a planar transistor are formed on the front surface side of semiconductor substrate 11. At the same time or in a different step, first impurity-diffused region 115 is formed on the front surface side of semiconductor substrate 11 so as to be isolated from the planar transistor by isolation region 116. Then, an interlayer insulating film is formed across the entire front surface side of semiconductor substrate 11. An opening is then provided at a position in the interlayer insulating film which corresponds to first impurity-diffused region 115. Contact plug 114 is formed in the opening. Thereafter, protective substrate 27 is bonded to the upper part of the interlayer insulating film (FIG. 25).

Figure 26:
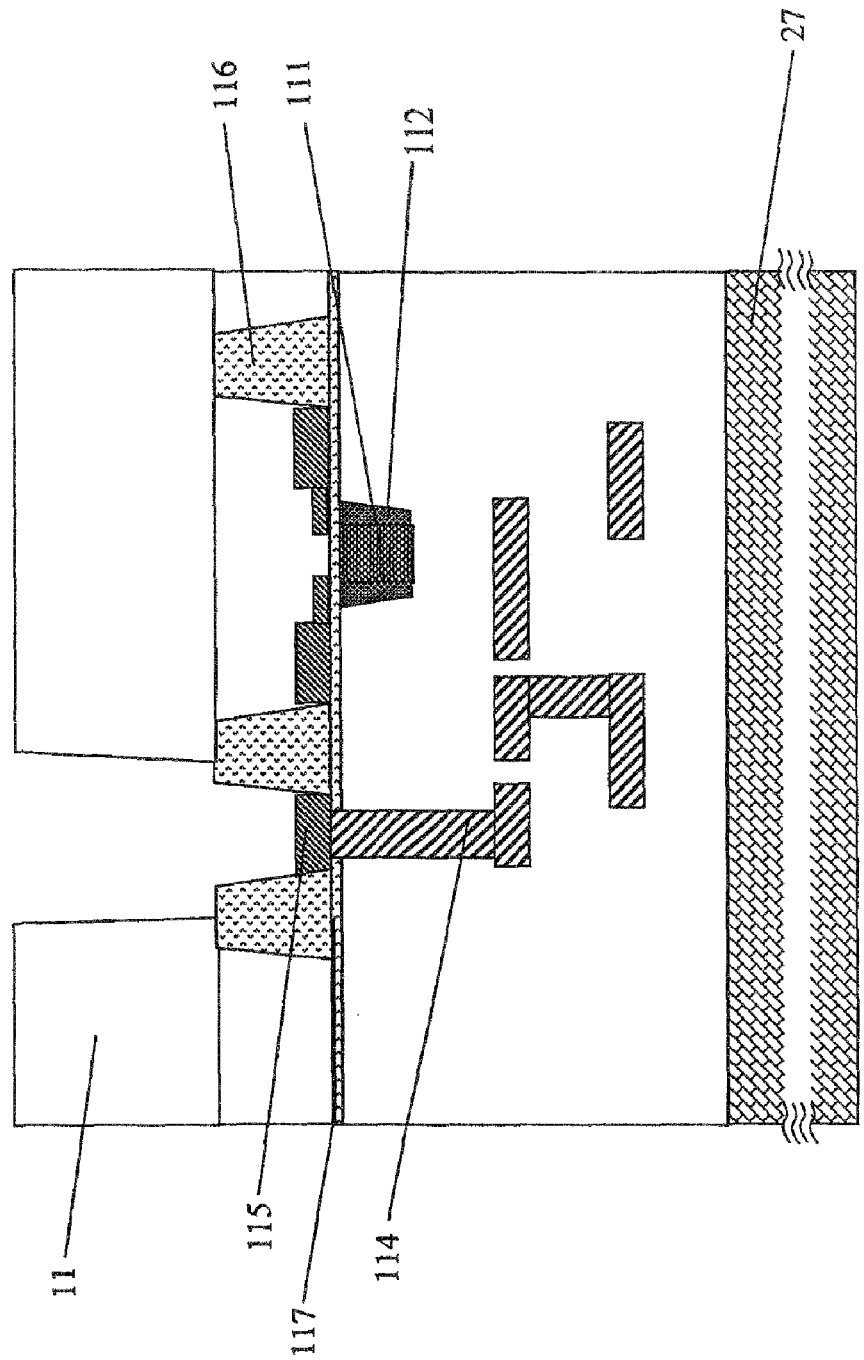
FIG. 26 is still another schematic view illustrating one step of the method for manufacturing the semiconductor device of the present invention.

Thereafter, semiconductor substrate 11 is turned upside down, and a CMP process is carried out on semiconductor substrate 11 from the rear surface side thereof. Then, the lithography technique is used to pattern semiconductor substrate 11. Anisotropic etching is performed on a position corresponding to first impurity-diffused region 115, to form a third opening such that the third opening reaches at least the first impurity-diffused region. At this time, a contact hole can be formed in a self-aligned manner by performing anisotropic etching under the condition that the etching rate of semiconductor substrate 11 is faster than that of gate insulating film 117 (FIG. 26).

Figure 27:
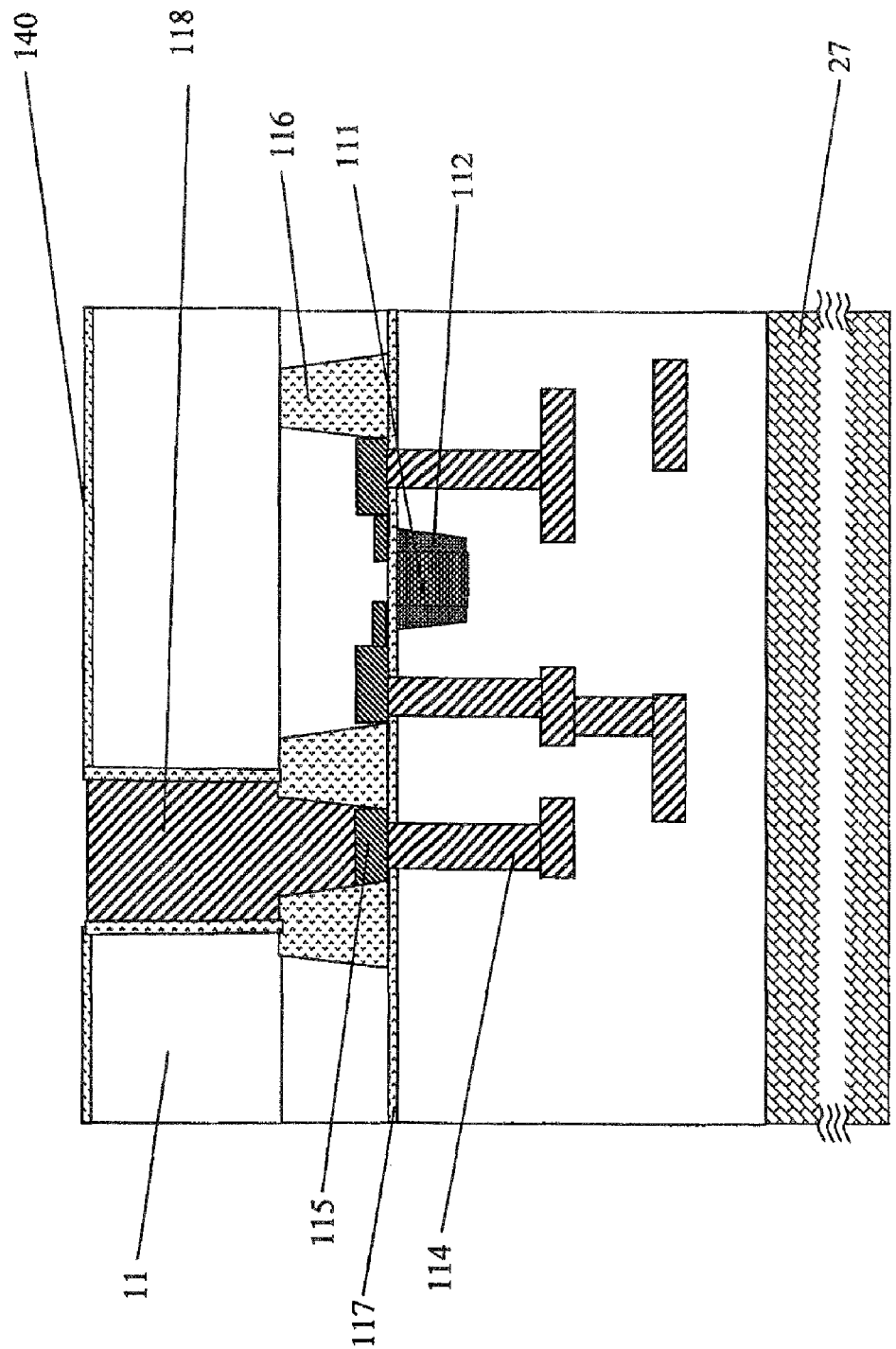
FIG. 27 is still another schematic view illustrating one step of the method for manufacturing the semiconductor device of the present invention.
Figure 28:
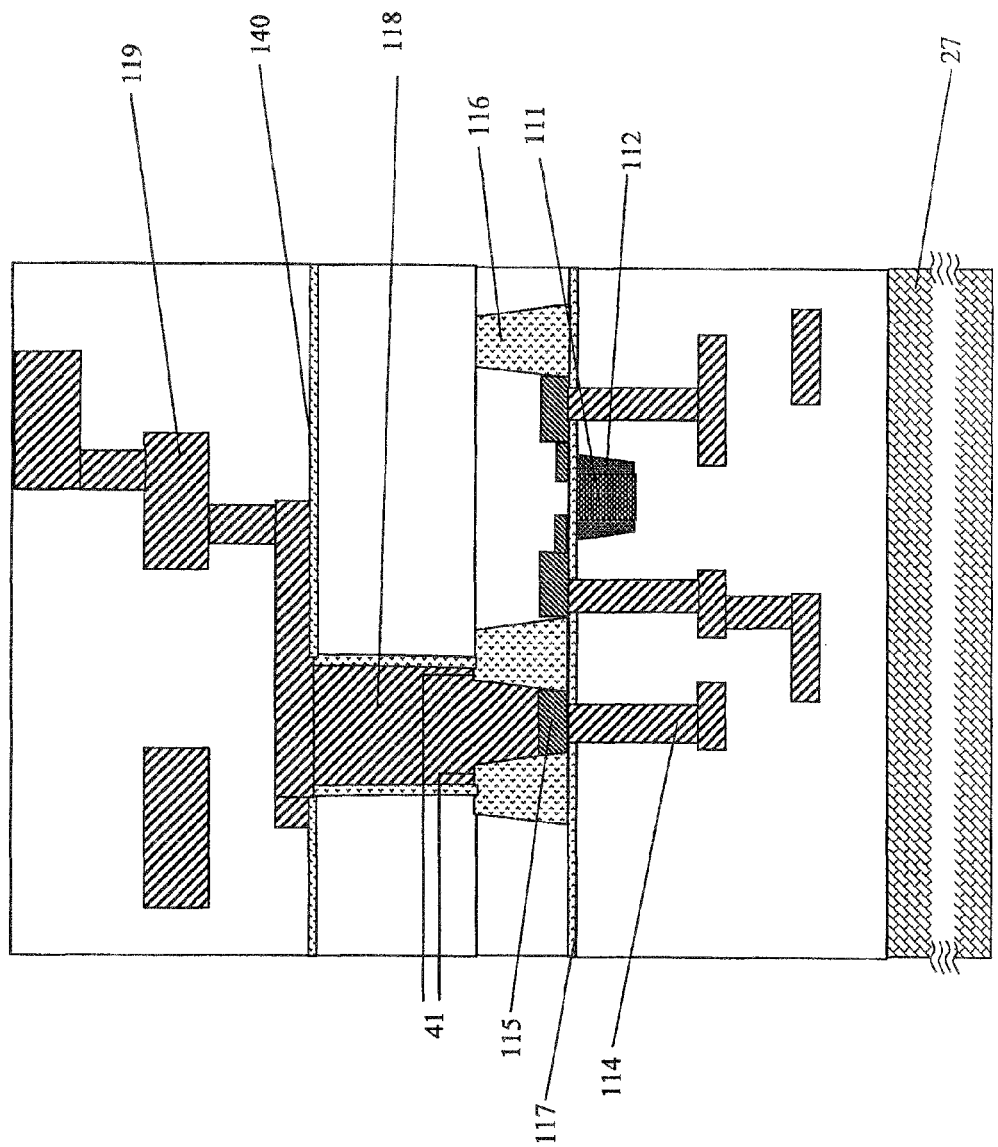
FIG. 28 is still another schematic view illustrating one step of the method for manufacturing the semiconductor device of the present invention.

Then, a portion of semiconductor substrate 11 exposed in the third opening is oxidized to form insulating film layer 140. Then, a conductive material is buried in the contact hole to form first contact plug 118 (FIG. 27). Thereafter, interconnect layer 119 is formed by a well-known method so that interconnect layer 119 is connected to first contact plug 118 (FIG. 28).

As described above, even if the device including the planar transistor is formed on the front surface side of the semiconductor substrate, the interconnect layer can be formed from the rear surface side of the semiconductor substrate.

Exemplary Embodiment 4

Figure 29:
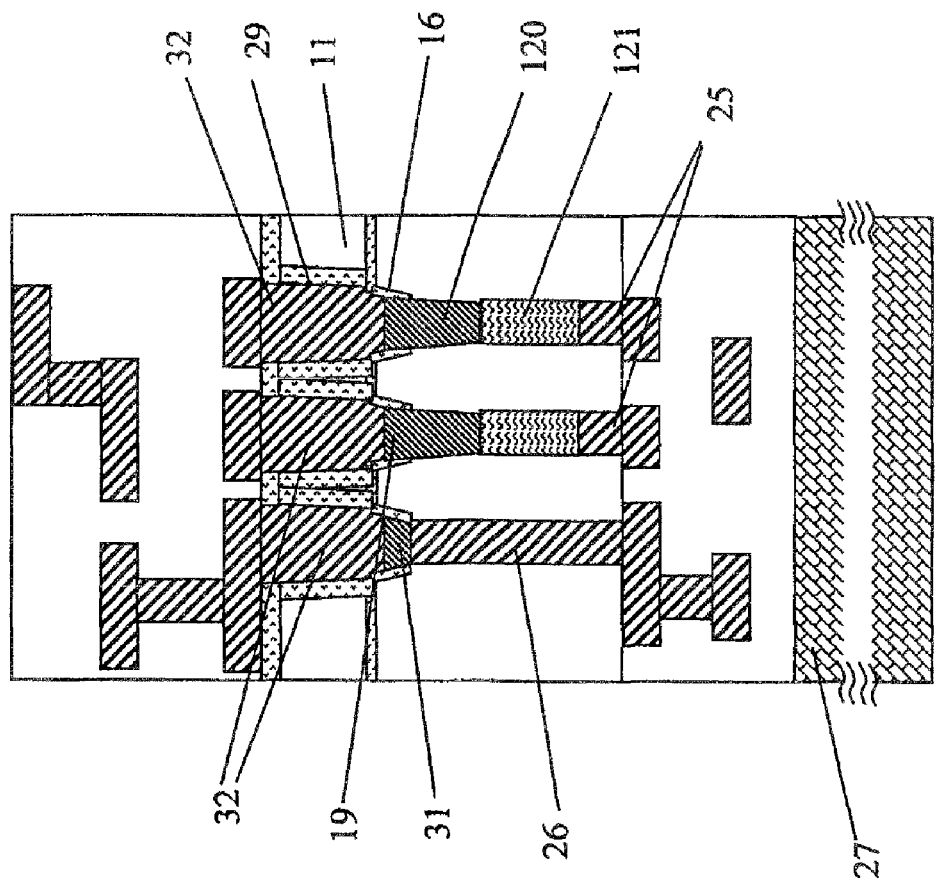
FIG. 29 is a schematic view illustrating another example of the semiconductor device of the present invention.

In the example illustrated in Exemplary Embodiments 1 to 3, the transistor is formed on the front surface side of the semiconductor substrate. However, the device formed on the front surface side of the semiconductor substrate is not limited to the transistor but may be a diode. FIG. 29 is a diagram showing such a semiconductor device. The diode in FIG. 29 is formed of N-type diffusion layer 120 and P-type diffusion layer 121. Alternatively, the diffusion layers denoted by reference numerals 120 and 121 may be of the P type and the N type, respectively, depending on the configuration of the semiconductor device. In this case, the diode, the second and third contact plugs, and the like make up the first structure.

Exemplary Embodiment 5

Figure 46:
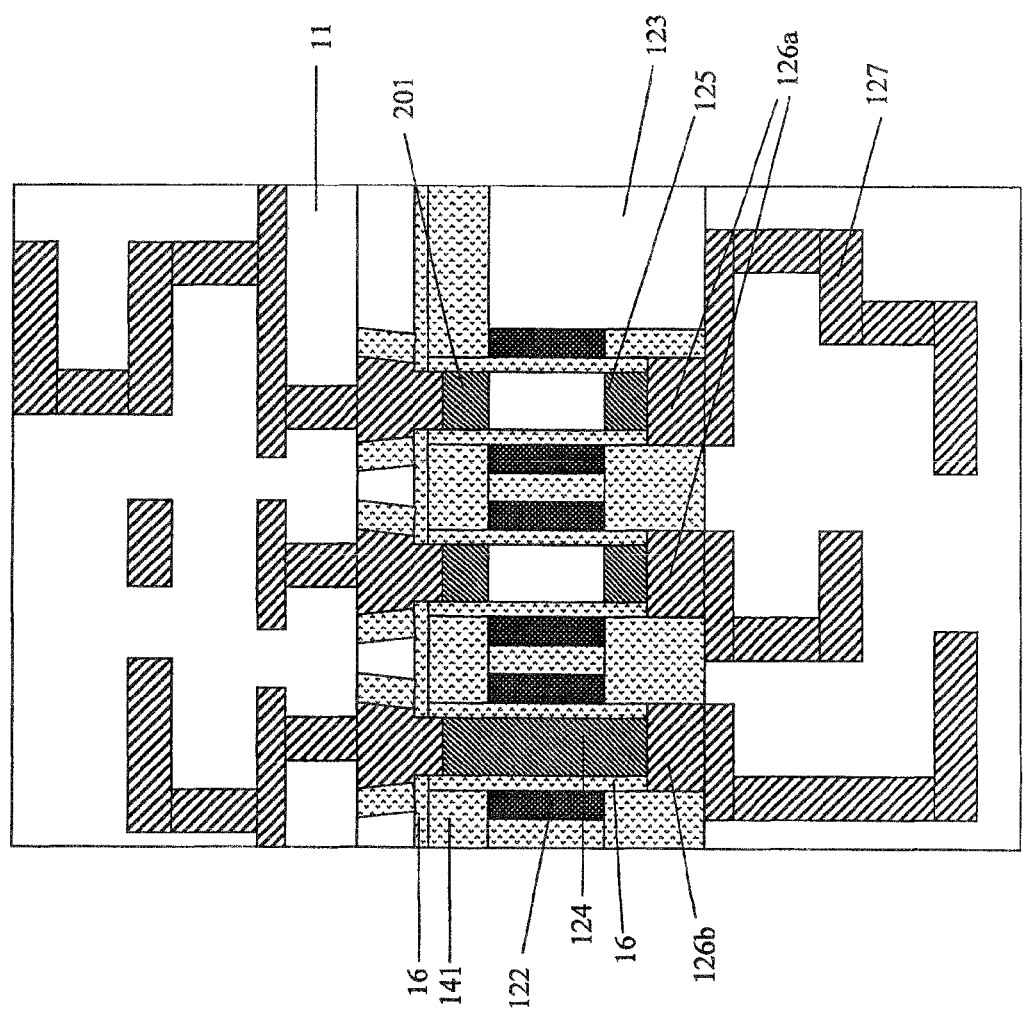
FIG. 46 is still another schematic view illustrating one step of the method for manufacturing the semiconductor device of the present invention.

In recent years, techniques have been developed which enable wafers to be conveyed even with the reduced thickness of the semiconductor substrate. Thus, a thicker interconnect layer enables the semiconductor device to be processed without the need to bond the protective substrate to the semiconductor substrate. FIG. 46 shows a semiconductor device with no protective substrate bonded to the semiconductor substrate. With this semiconductor device, the reduced thickness of the semiconductor substrate allows omission of the step of performing the CMP process on the semiconductor substrate from the rear surface side thereof.

Exemplary Embodiment 6

If the vertical MOSFET is formed on the front surface side of the semiconductor substrate, the impurity for the lower impurity-diffused region may be implanted into the semiconductor substrate from the rear surface side thereof. In this case, the impurity may be implanted exclusively into a part of the lower portion of the semiconductor region of the vertical MOSFET.

Figure 11:
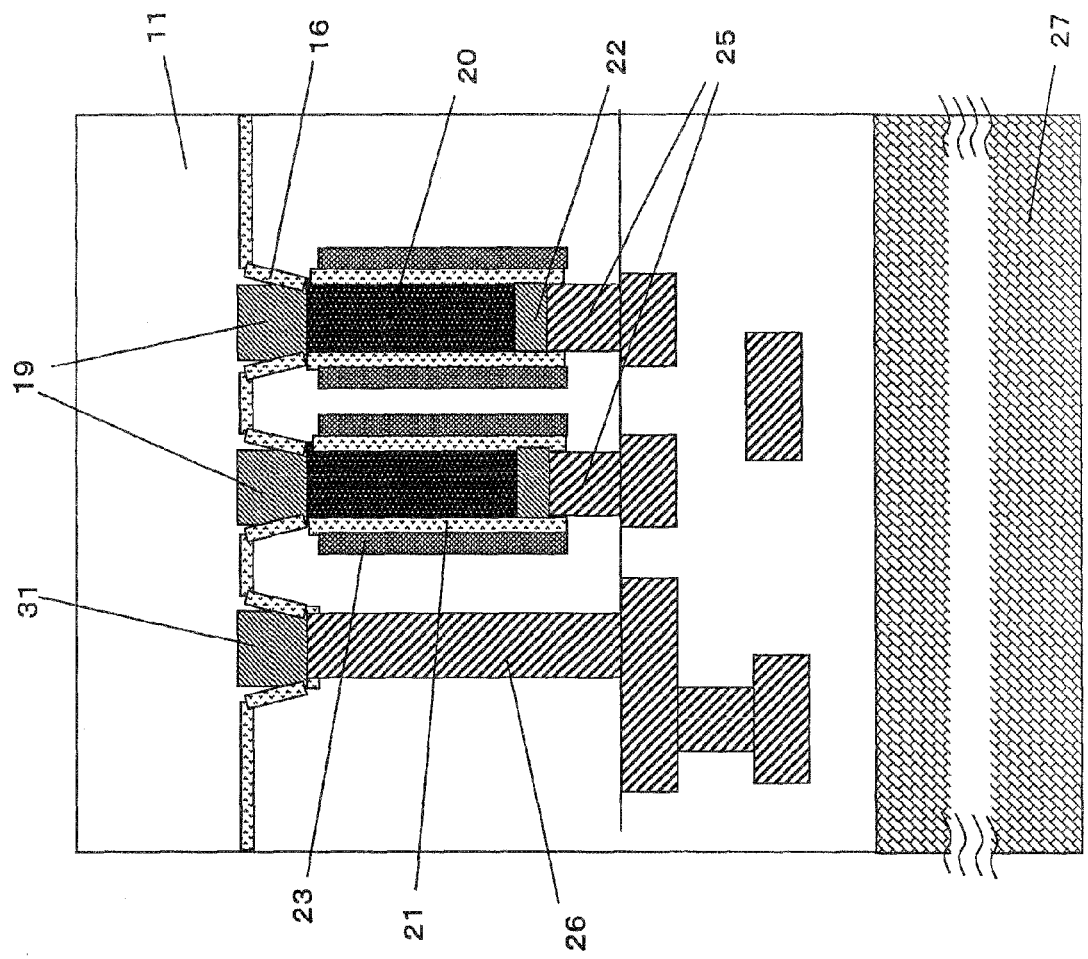
FIG. 11 is still another schematic view illustrating one step of the method for manufacturing the semiconductor device of the present invention.
Figure 47:
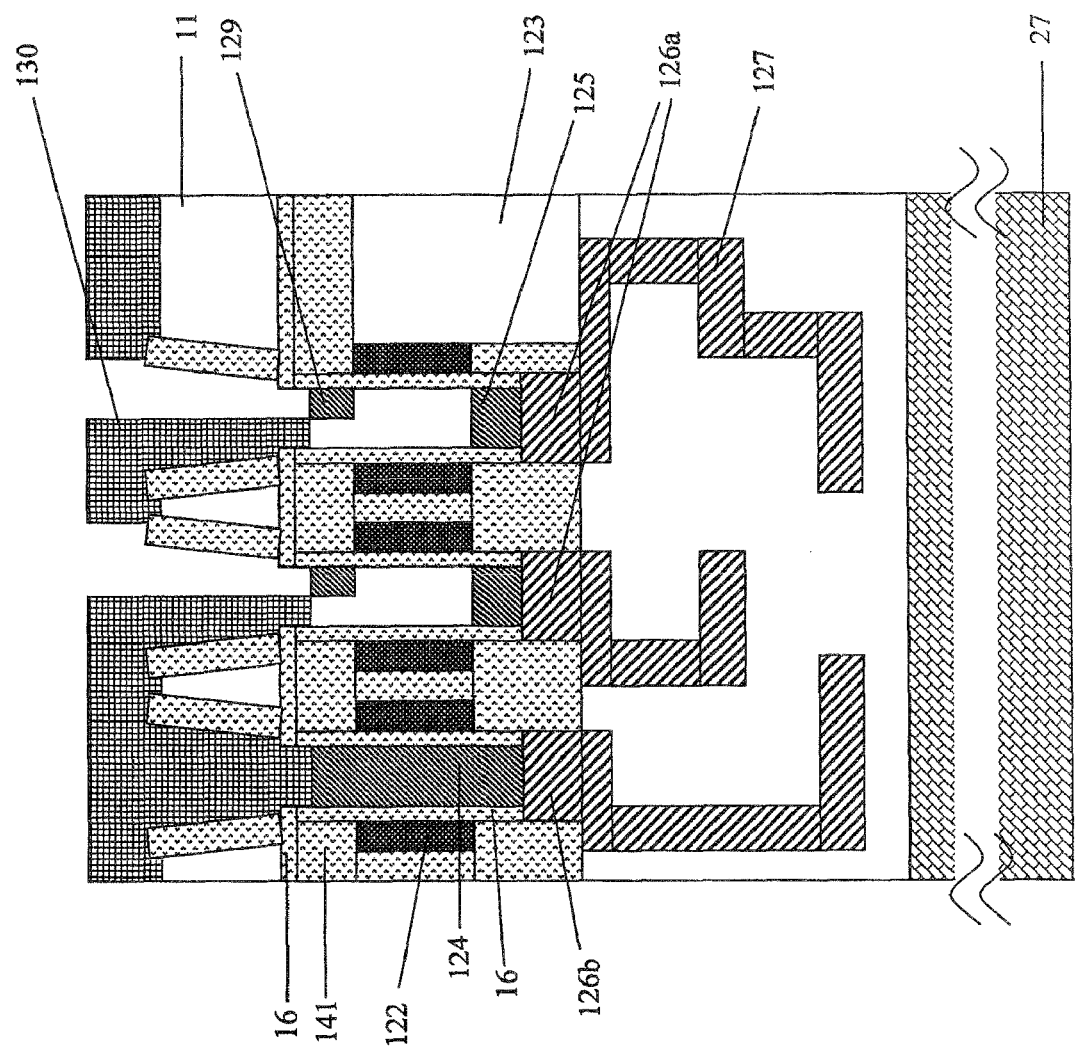
FIG. 47 is still another schematic view illustrating one step of the method for manufacturing the semiconductor device of the present invention.

In this manufacturing method, first, the manufacturing process is carried out as is the case with Exemplary Embodiment 1 until the step shown in FIG. 11. However, the present exemplary embodiment differs from Exemplary Embodiment 1 in that the present exemplary embodiment omits the step of implanting the impurity into protruding region 15 to form the lower impurity-diffused region. Then, as shown in FIG. 47, resist mask 130 is formed on the rear surface side of semiconductor substrate 11; resist mask 130 has opening only in a portion thereof corresponding to a part of semiconductor region 20 of the vertical MOSFET. Thereafter, the impurity is implanted into semiconductor substrate 11 from the rear surface side thereof using resist mask 130 as a mask, to form lower impurity-diffused region 129 in the part of the lower part of semiconductor region 20.

Figure 48:
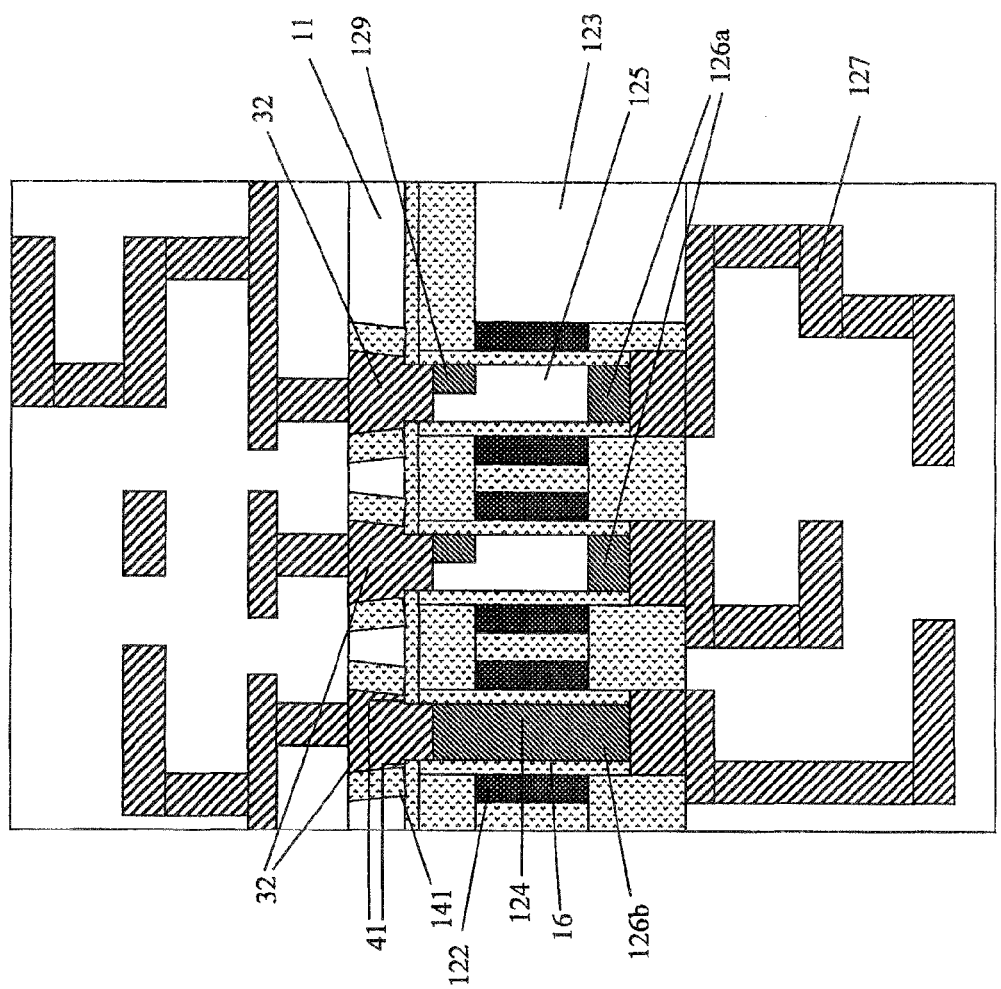
FIG. 48 is a schematic view illustrating another example of the semiconductor device of the present invention.

Then, resist mask 130 is removed. First contact plug 32 is thereafter formed so as to be connected to third contact plug 24 and lower impurity-diffused region 129. An interconnect layer is then formed so as to be connected to first contact plug 32 (FIG. 48). The present exemplary embodiment reduces the potential of carriers in the vertical MOSFET. This in turn reduces the floating body effect of the vertical MOSFET to facilitate designing.

Exemplary Embodiment 7

When the vertical MOSFET and vertical diode according to the above-described exemplary embodiments are formed, the semiconductor region may be formed by utilizing a silicon semiconductor substrate instead of utilizing the selective epitaxial growth. The present exemplary embodiment relates to a manufacturing method for forming the vertical MOSFET utilizing the silicon semiconductor substrate.

First, silicon oxide film 12 is formed on silicon semiconductor substrate 11. The film thickness of the silicon oxide film is 10 nm. Then, nitride film 13 is grown to a thickness of 100 nm as a mask material. The lithography technique is then used to pattern resist 14 so as to form a pattern covering a portion of the substrate in which the vertical MOSFET is to be formed and a portion of the substrate in which the third contact plug is to be formed.

Figure 30:
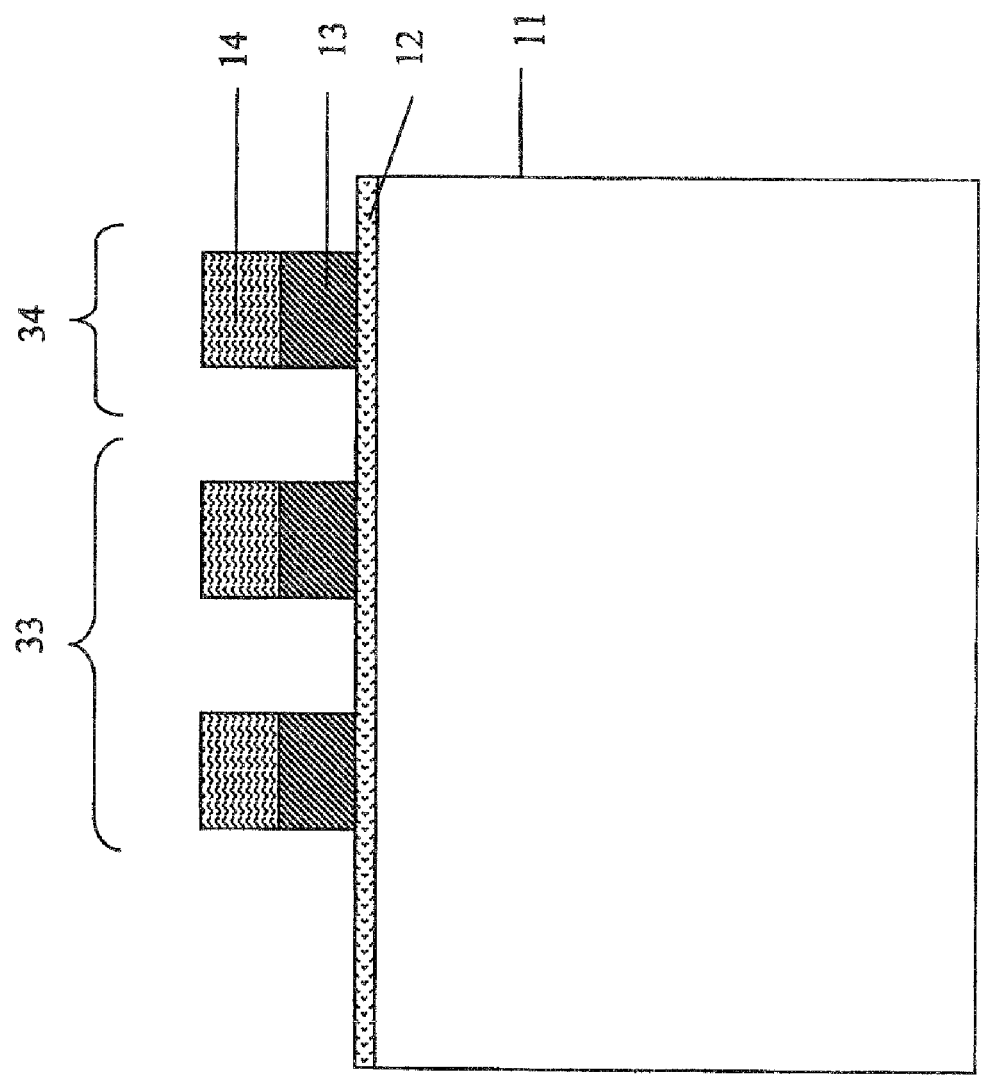
FIG. 30 is still another schematic view illustrating one step of the method for manufacturing the semiconductor device of the present invention.
Figure 31:
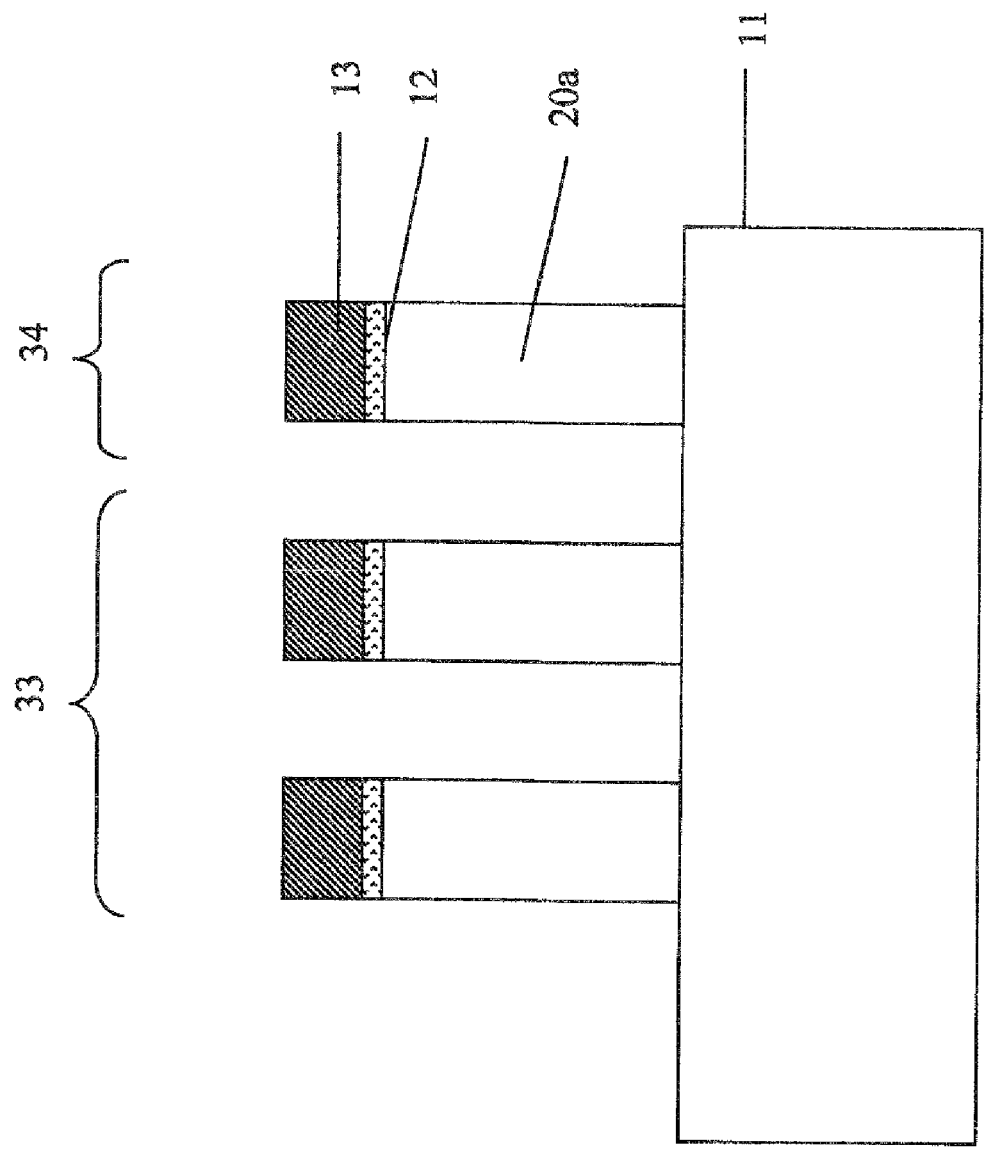
FIG. 31 is still another schematic view illustrating one step of the method for manufacturing the semiconductor device of the present invention.

Then, nitride film 13 is etched using resist mask 14 as a mask (FIG. 30). Silicon semiconductor substrate 11 is thereafter dry etched to a depth of 120 nm using nitride film 13 patterned as a mask. At this time, the semiconductor substrate is etched to a depth that is larger than the channel length of the MOSFET, to form, below nitride film 13, semiconductor region 20a protruding from a predetermined plane of silicon semiconductor substrate 11 (FIG. 31).

Figure 32:
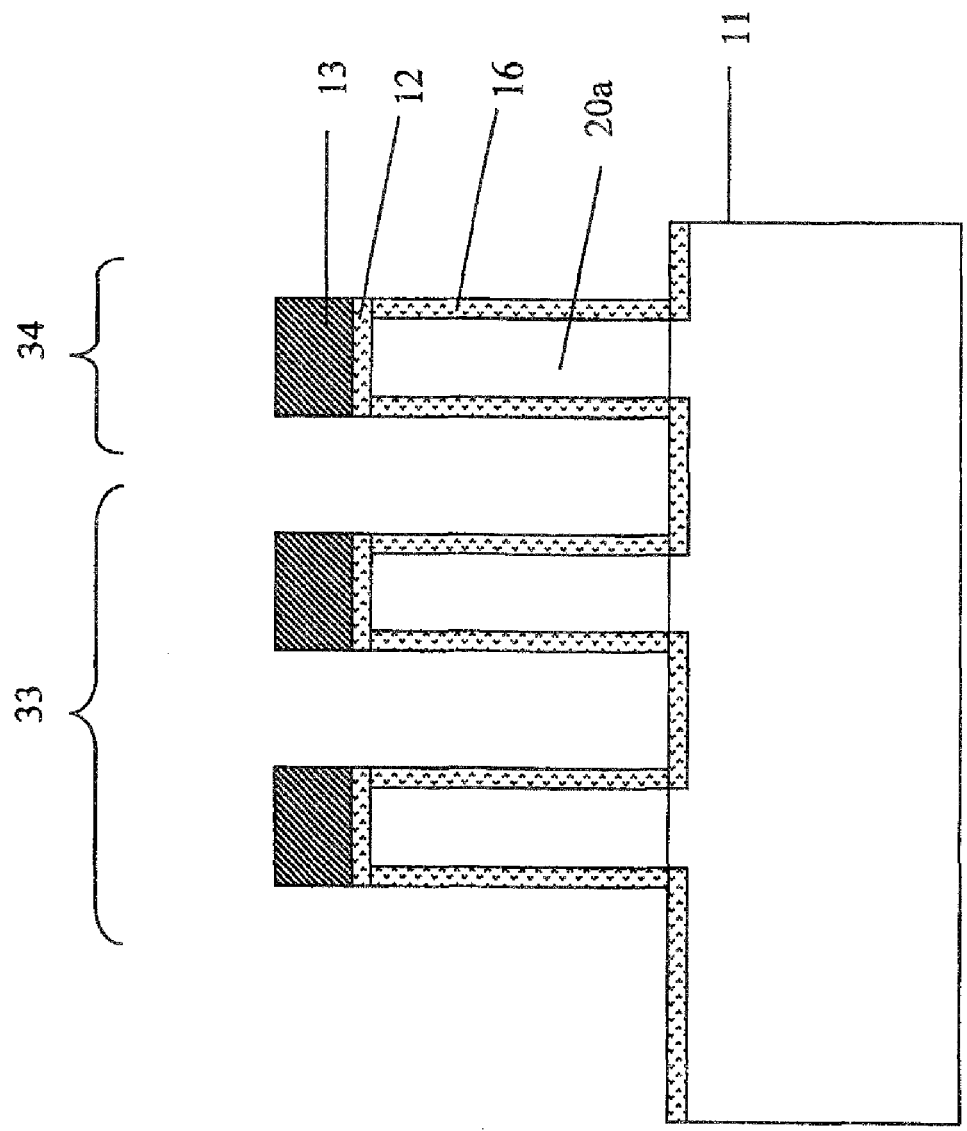
FIG. 32 is still another schematic view illustrating one step of the method for manufacturing the semiconductor device of the present invention.
Figure 33:
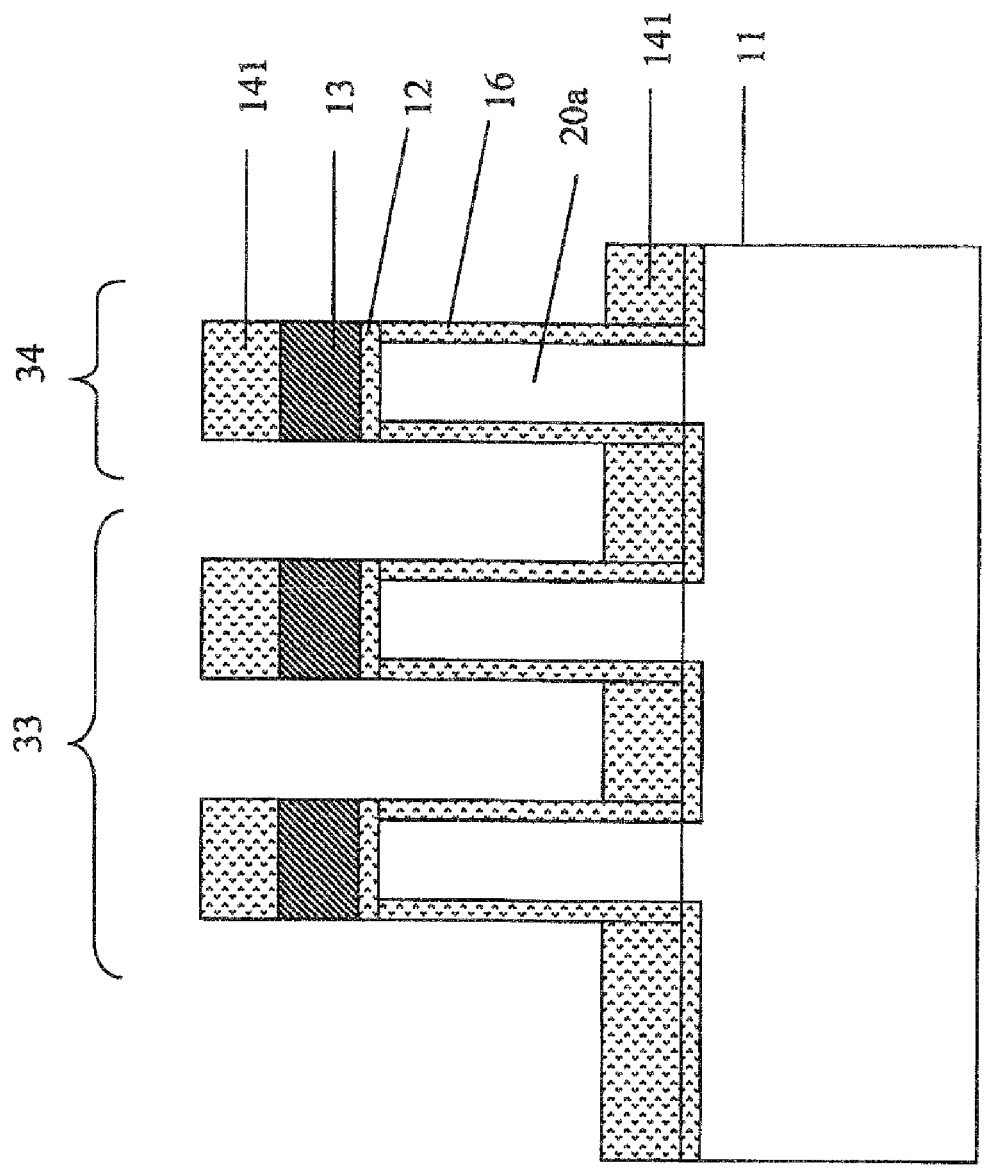
FIG. 33 is still another schematic view illustrating one step of the method for manufacturing the semiconductor device of the present invention.

Then, thermal oxidation is performed to cover the exposed surface of semiconductor region 20a with oxide film 16 (FIG. 32). The film thickness of oxide film 16 is 5 nm. Then, HDP oxide film growth is caused to take place on oxide film 16 to deposit oxide film 141 (FIG. 33). The film thickness of oxide film 141 is 30 nm.

Figure 34:
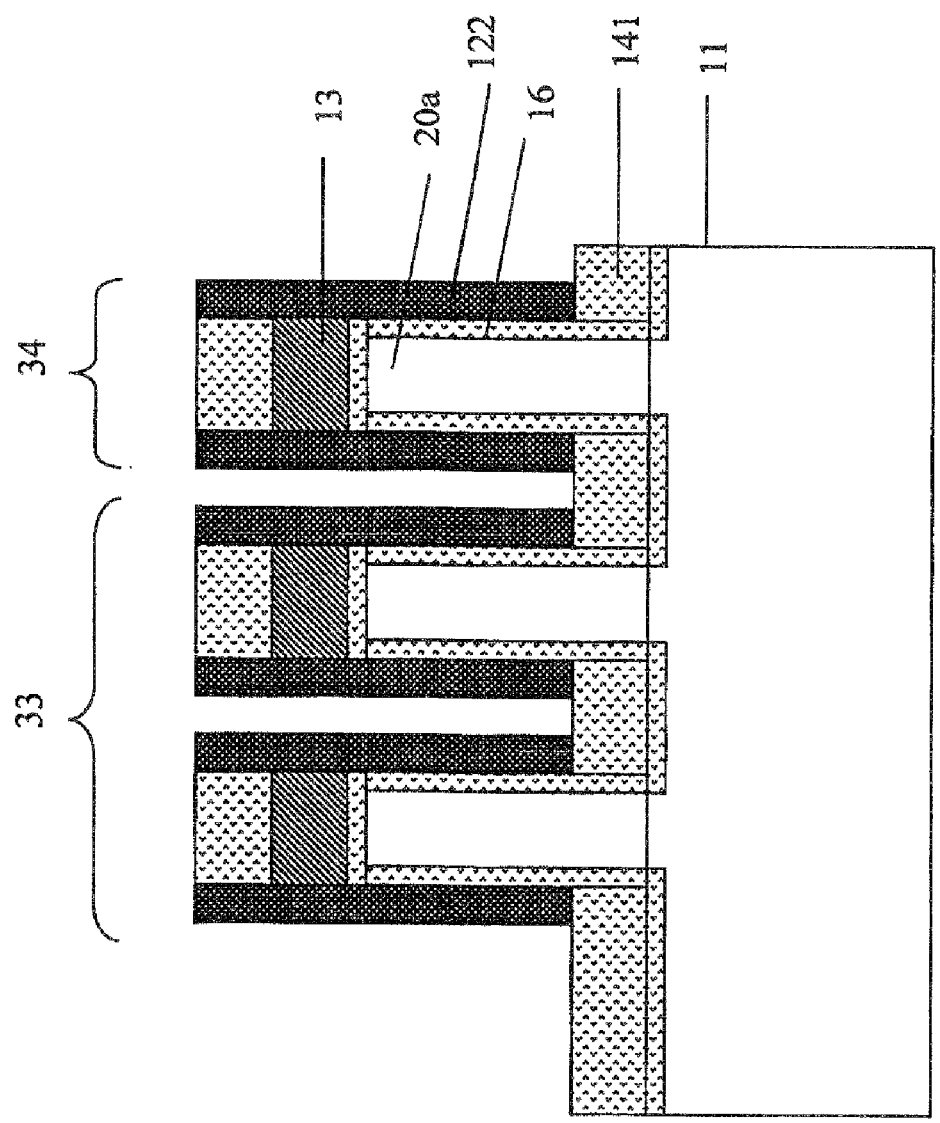
FIG. 34 is still another schematic view illustrating one step of the method for manufacturing the semiconductor device of the present invention.

Then, gate electrode material 122 is deposited on oxide film 141 by CVD. Gate electrode material 122 is, for example, DOPOS, and is deposited to a thickness of 20 nm. Thereafter, gate electrode material 122 is etched back (FIG. 34). Gate electrode material 122 is further etched to form a structure shown in FIG. 35.

Figure 35:
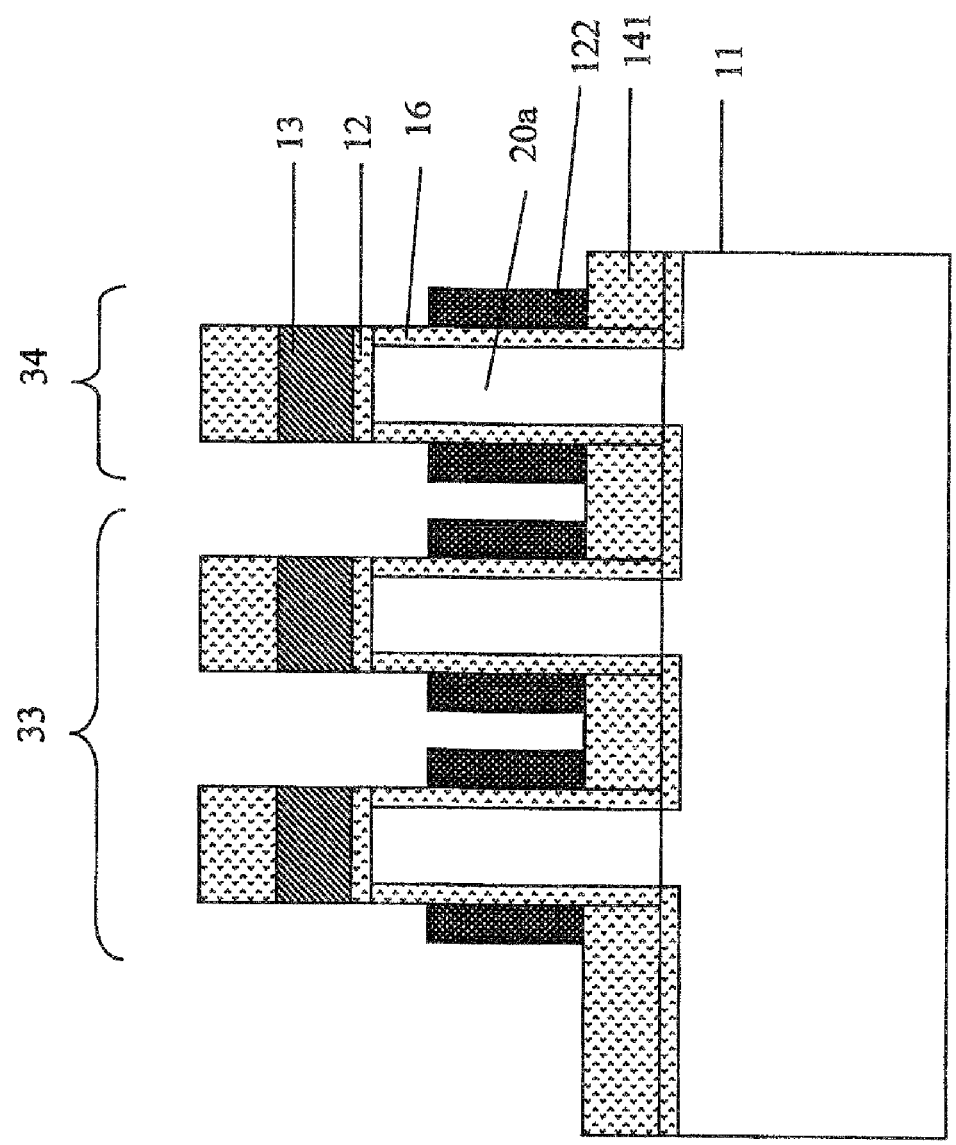
FIG. 35 is still another schematic view illustrating one step of the method for manufacturing the semiconductor device of the present invention.
Figure 36:
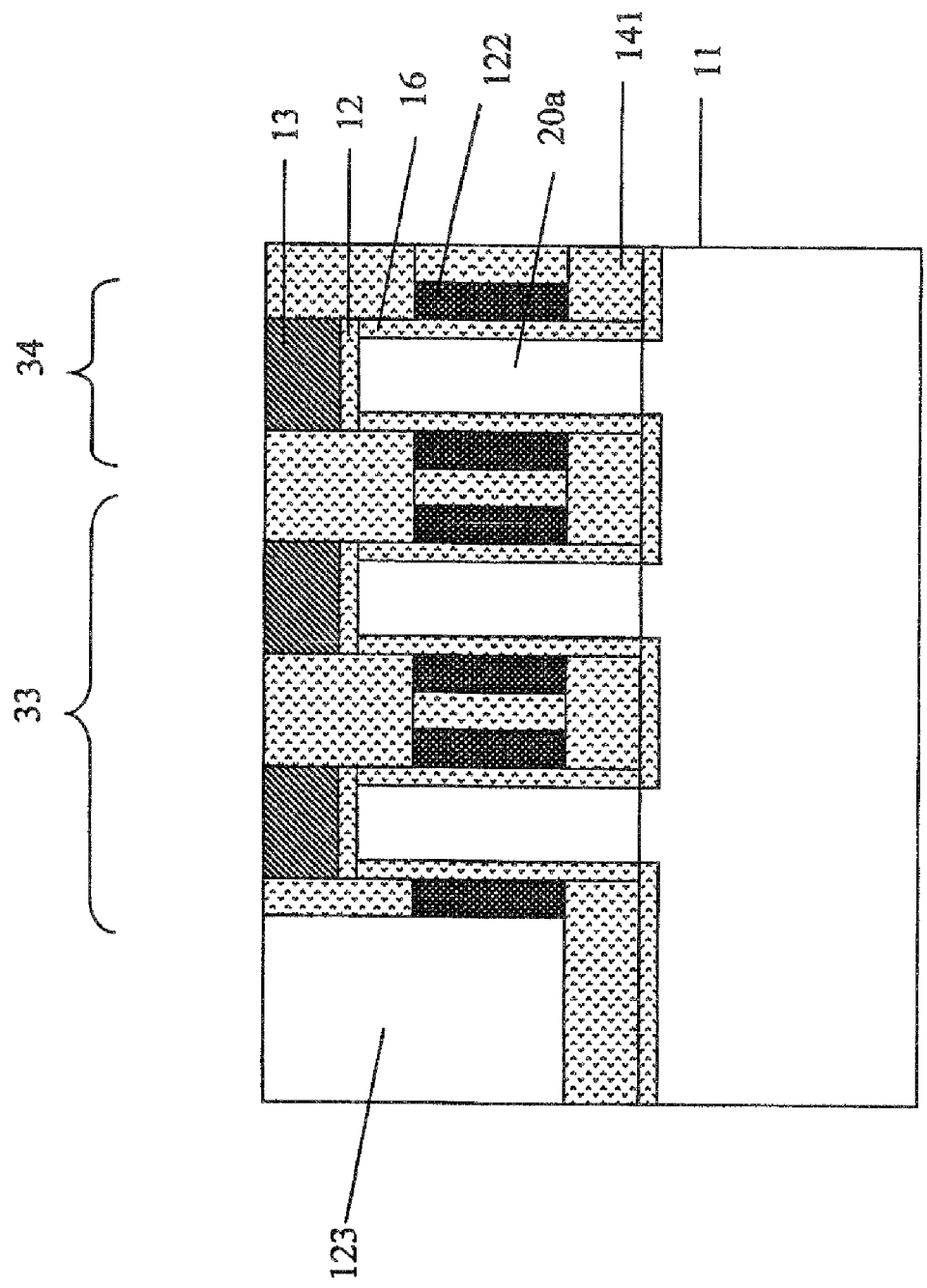
FIG. 36 is still another schematic view illustrating one step of the method for manufacturing the semiconductor device of the present invention.

Then, an interlayer insulating film made up of oxide film 123 is formed on the structure in FIG. 35. The CMP process is thereafter carried out to flatten oxide film 123 (FIG. 36). Wet etching is then performed using thermal phosphoric acid, to remove nitride film 13.

Then, the lithography technique is used to form a resist mask (not shown in the drawings) that is open in a portion thereof corresponding to the portion of the substrate in which the vertical MOSFET is to be formed. The impurity is implanted into the silicon portion using the resist mask as a mask, to form upper impurity-diffused region 125 of the vertical MOSFET. The impurity implantation is performed using As as the impurity under conditions of 20 KeV and $1 \times 10^{15}$ atoms/cm$^2$.

Figure 37:
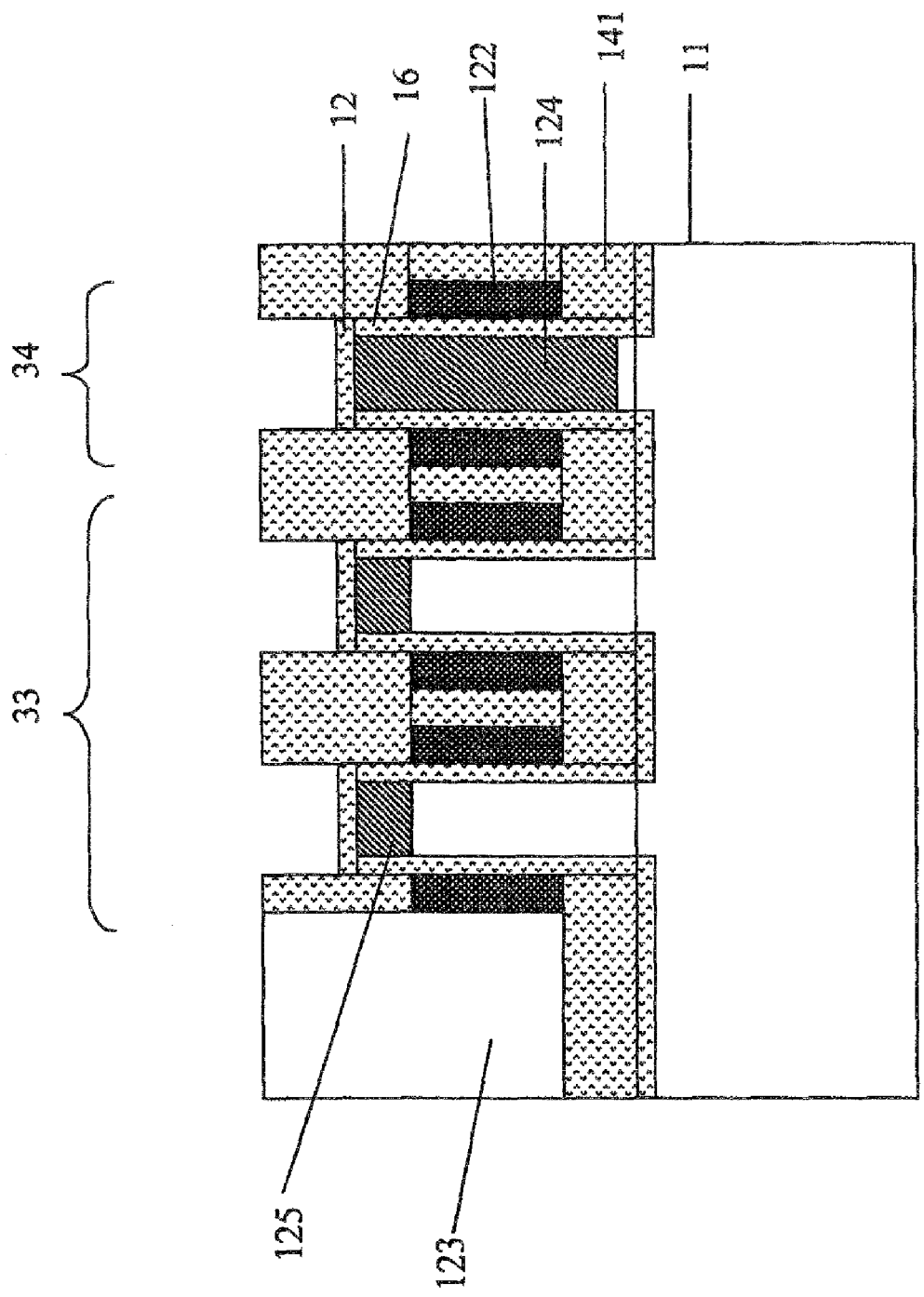
FIG. 37 is still another schematic view illustrating one step of the method for manufacturing the semiconductor device of the present invention.

Then, the resist mask is removed. Furthermore, the lithography technique is used to form a resist mask (not shown in the drawings) that is open in a portion thereof corresponding to the portion of the substrate in which the third contact plug is to be formed. The impurity is implanted into the silicon portion using the resist mask as a mask, to form contact plug portion 124. The impurity implantation is performed three times using As at $1 \times 10^{15}$ atoms/cm$^2$ under conditions of 20 KeV, 80 KeV, and 150 KeV (FIG. 37).

Figure 38:
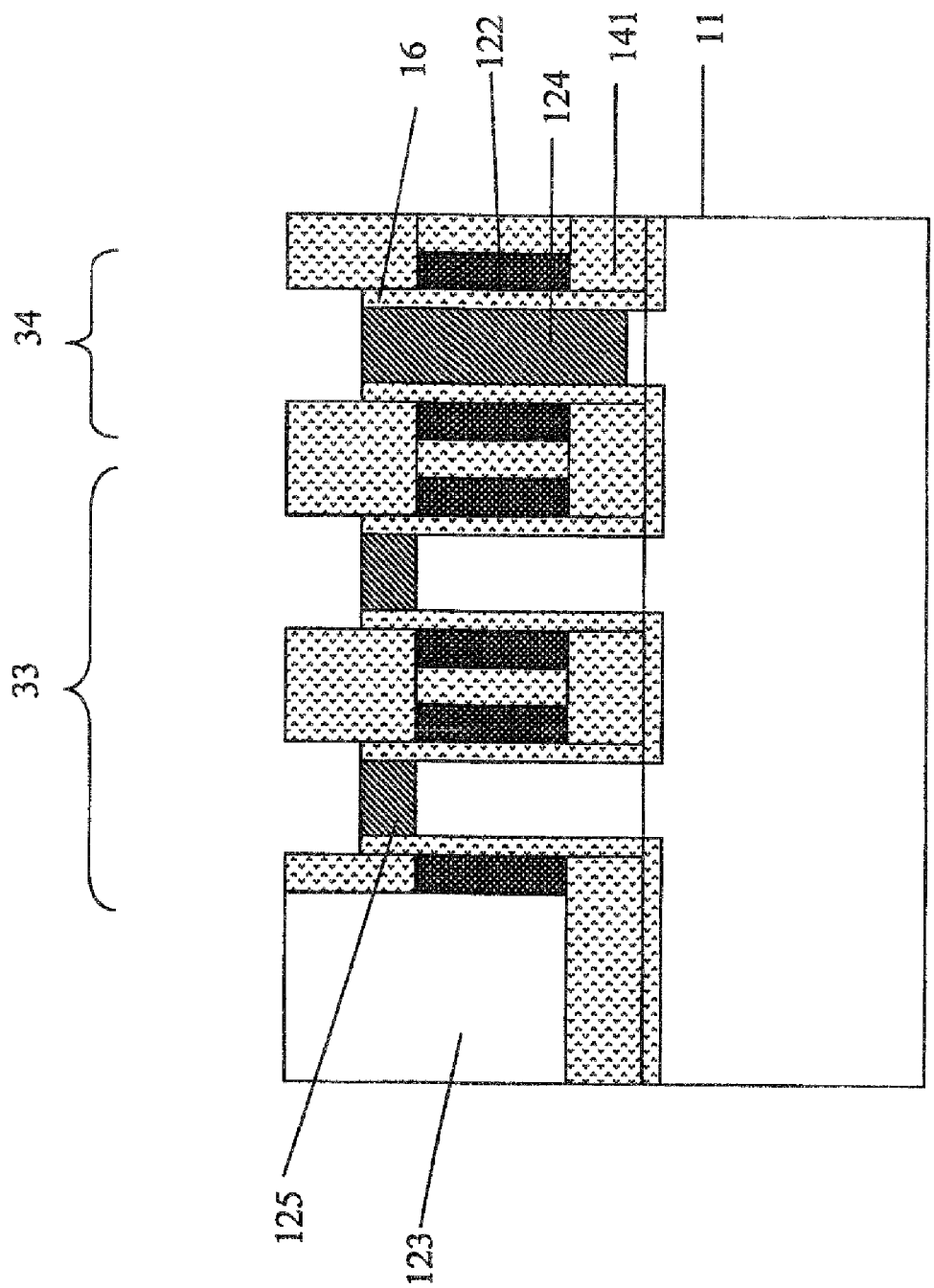
FIG. 38 is still another schematic view illustrating one step of the method for manufacturing the semiconductor device of the present invention.
Figure 39:
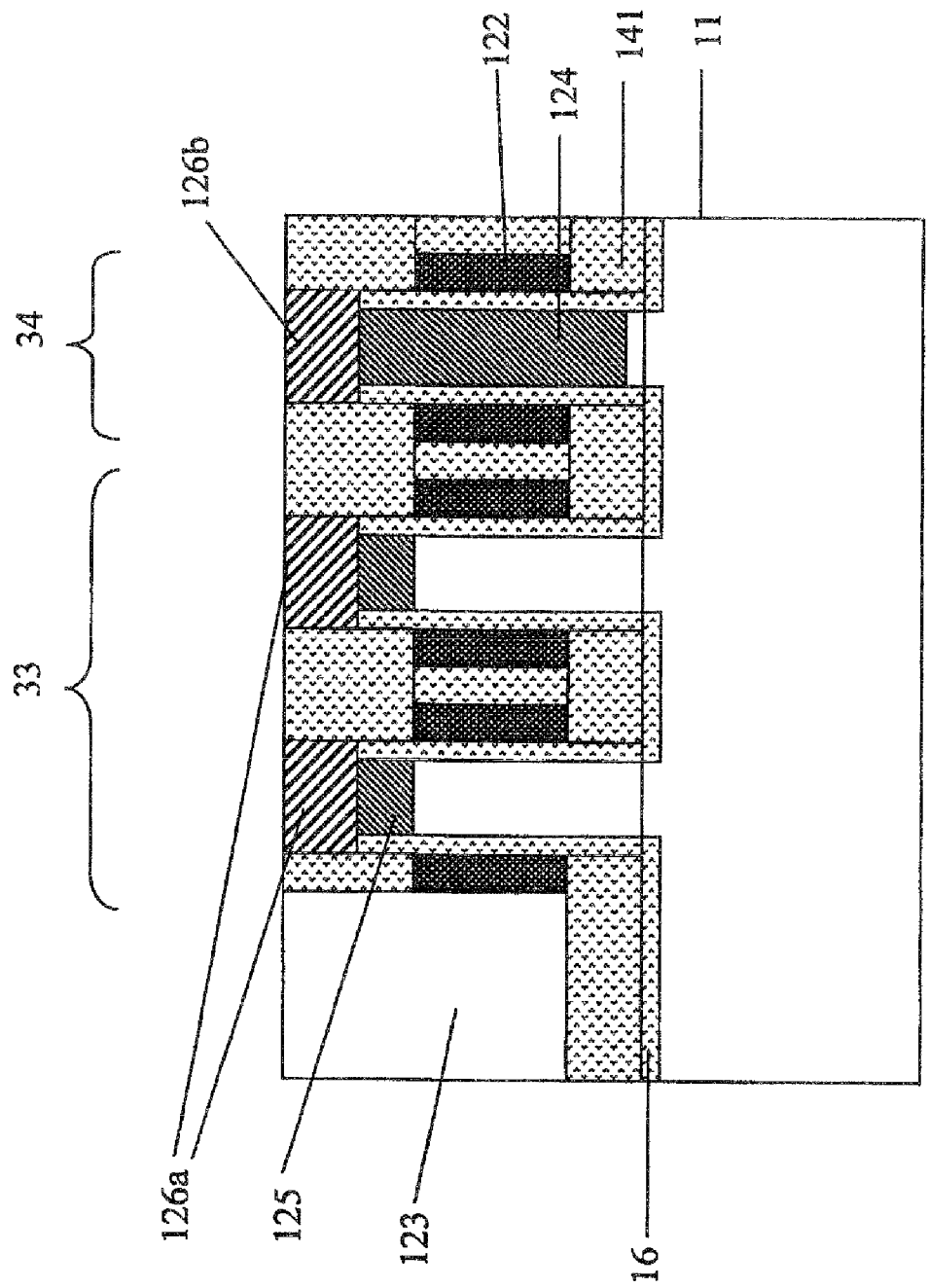
FIG. 39 is still another schematic view illustrating one step of the method for manufacturing the semiconductor device of the present invention.

Then, the resist mask is removed. Oxide film 12 is thereafter dry etched to expose silicon from a top surface of the semiconductor region (FIG. 38). A contact plug material is then deposited across the entire surface of the semiconductor device being manufactured. The CMP process is then carried out to flatten and strike the contact plug material. Second and third contact plugs 126a and 126b are thus formed (FIG. 39).

Figure 40:
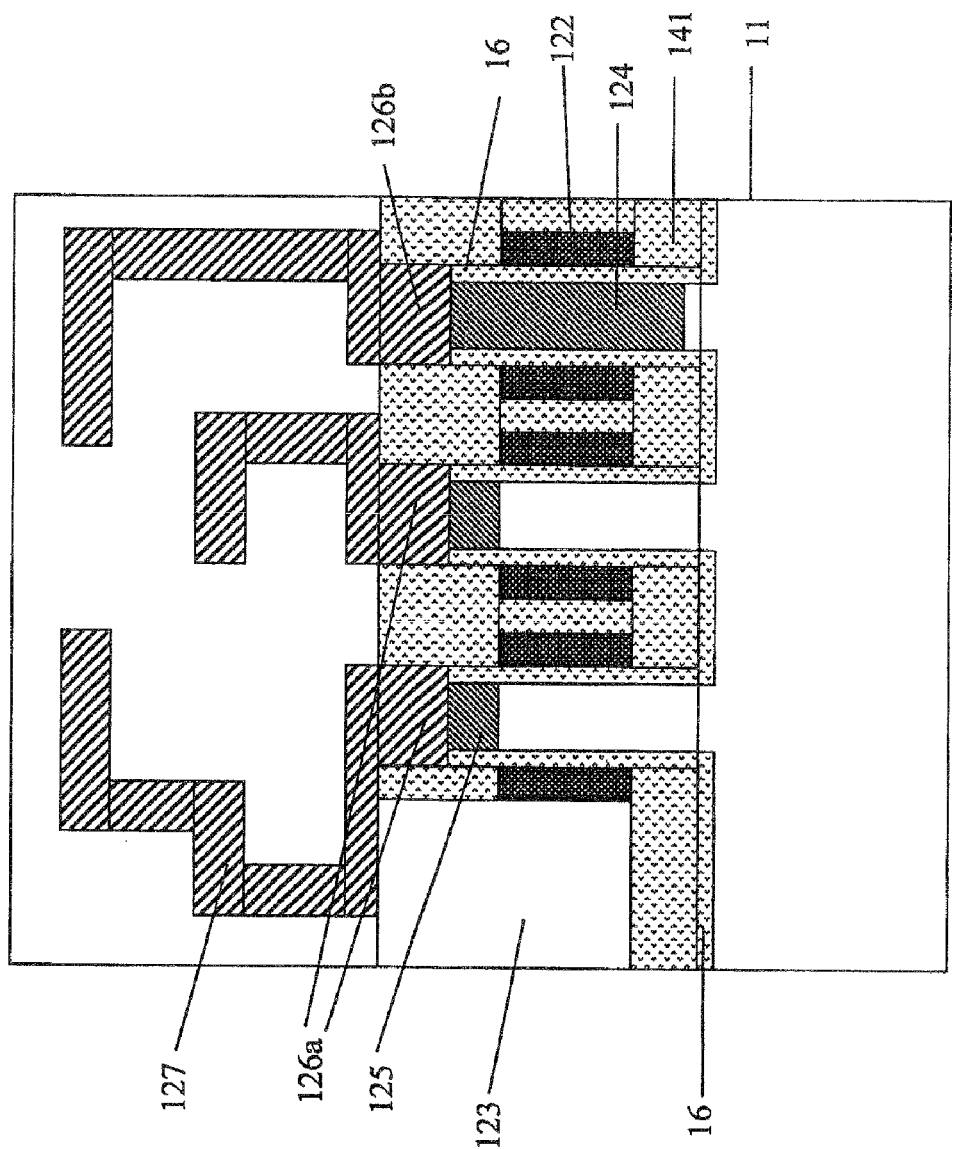
FIG. 40 is still another schematic view illustrating one step of the method for manufacturing the semiconductor device of the present invention.

Then, an interconnect layer and a contact layer are formed so as to be connected to second and third contact plugs 126a and 126b. An interlayer insulating film is thereafter formed across the entire surface of the semiconductor device being manufactured (FIG. 40).

Figure 41:
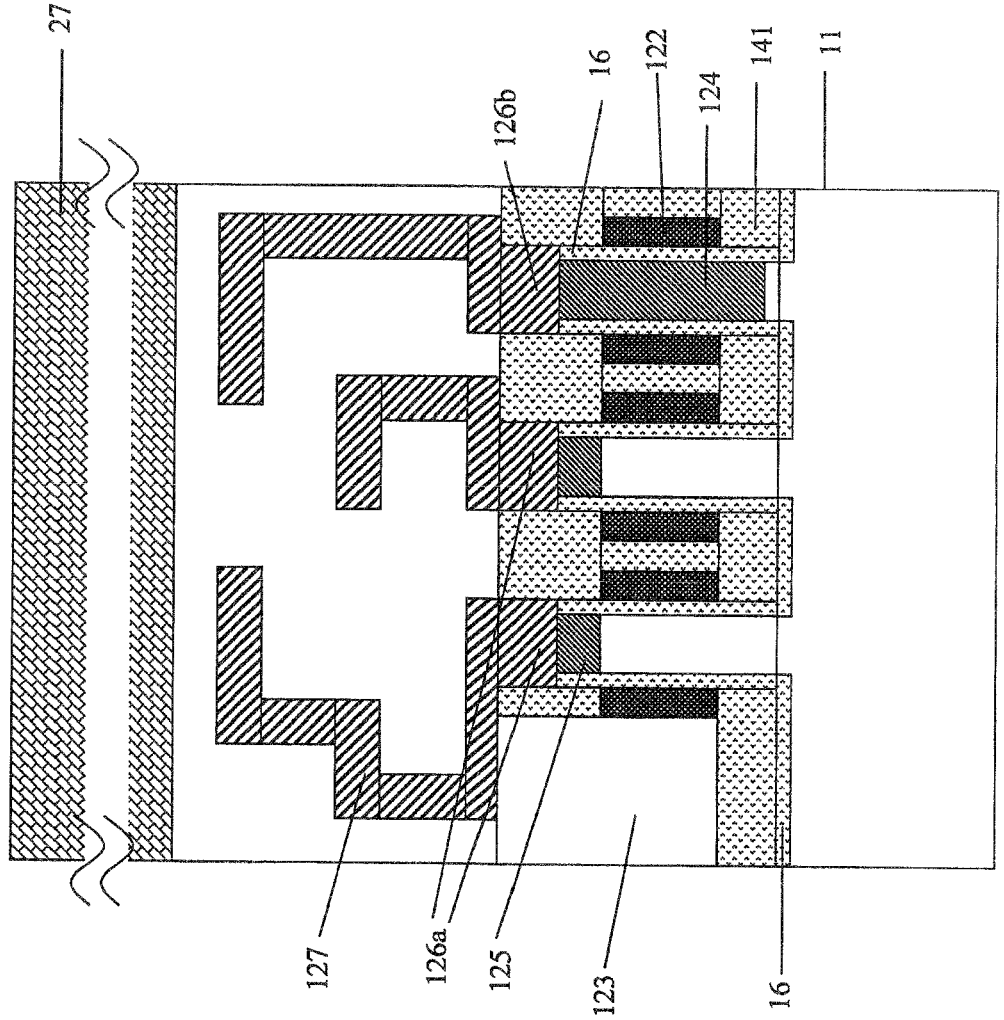
FIG. 41 is still another schematic view illustrating one step of the method for manufacturing the semiconductor device of the present invention.
Figure 42:
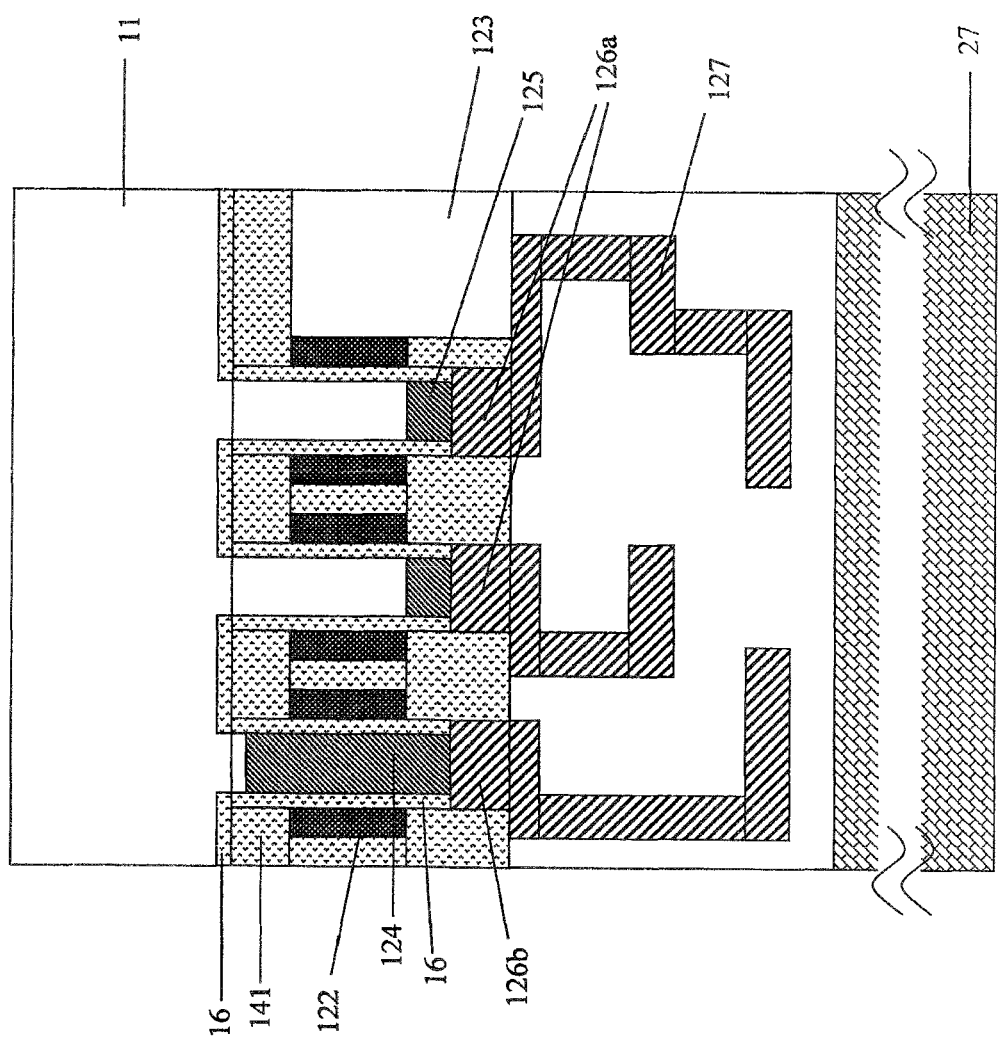
FIG. 42 is still another schematic view illustrating one step of the method for manufacturing the semiconductor device of the present invention.

Thereafter, protective substrate 27 is bonded over the interlayer insulating film (FIG. 41). The silicon semiconductor substrate and protective substrate in FIG. 41 are turned upside down (FIG. 42). The CMP process is then carried out on silicon semiconductor substrate 11 from the rear surface side thereof to thin silicon semiconductor substrate 11. The lithography technique is then used to perform patterning to form a resist mask (not shown in the drawings) that is open in portions thereof corresponding to the semiconductor region of the vertical MOSFET and the third contact plug.

Figure 43:
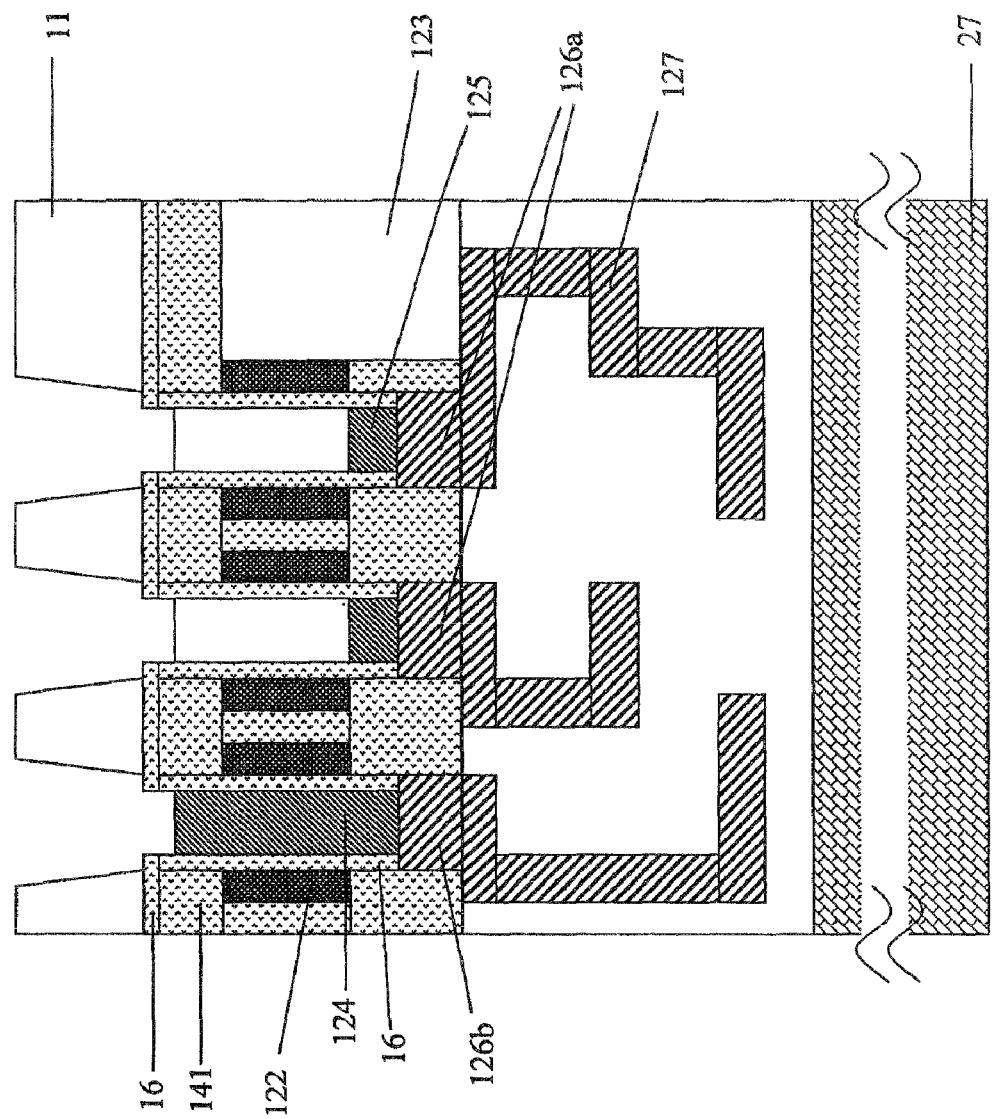
FIG. 43 is still another schematic view illustrating one step of the method for manufacturing the semiconductor device of the present invention.

Then, silicon semiconductor substrate 11 is dry etched using the resist mask as a mask so that the etching rate of silicon semiconductor substrate 11 is faster than that of oxide film 16 (FIG. 43). Thermal oxidation is then performed to oxidize the rear surface side of silicon semiconductor substrate 11. A portion of the substrate corresponding to the semiconductor region of the vertical MOSFET is opened by the lithography technique.

Thereafter, the impurity is implanted into the semiconductor region of the vertical MOSFET from the rear surface side thereof to form lower impurity-diffused region 201. The impurity implantation is performed using As as the impurity under conditions of 20 KeV and $1\times10^{15}$ atoms/cm$^2$.

Figure 44:
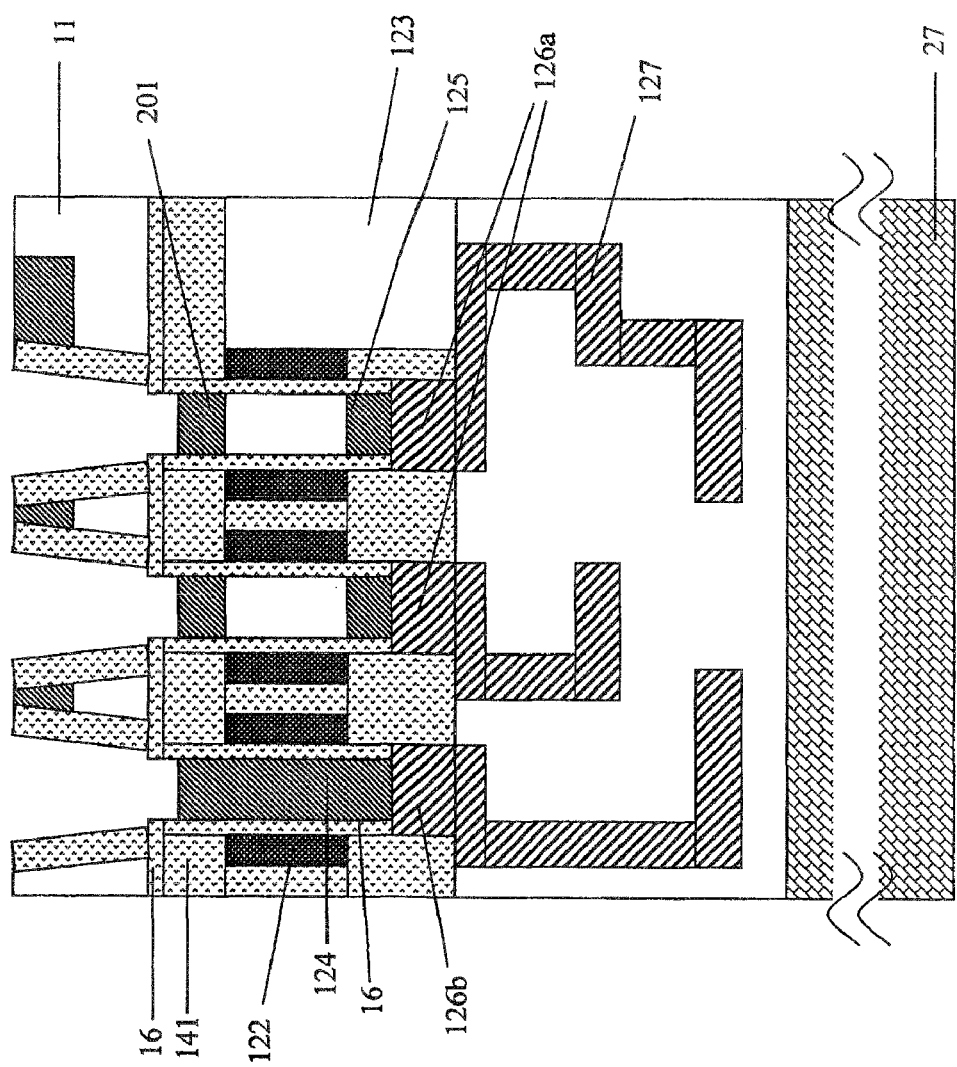
FIG. 44 is still another schematic view illustrating one step of the method for manufacturing the semiconductor device of the present invention.
Figure 45:
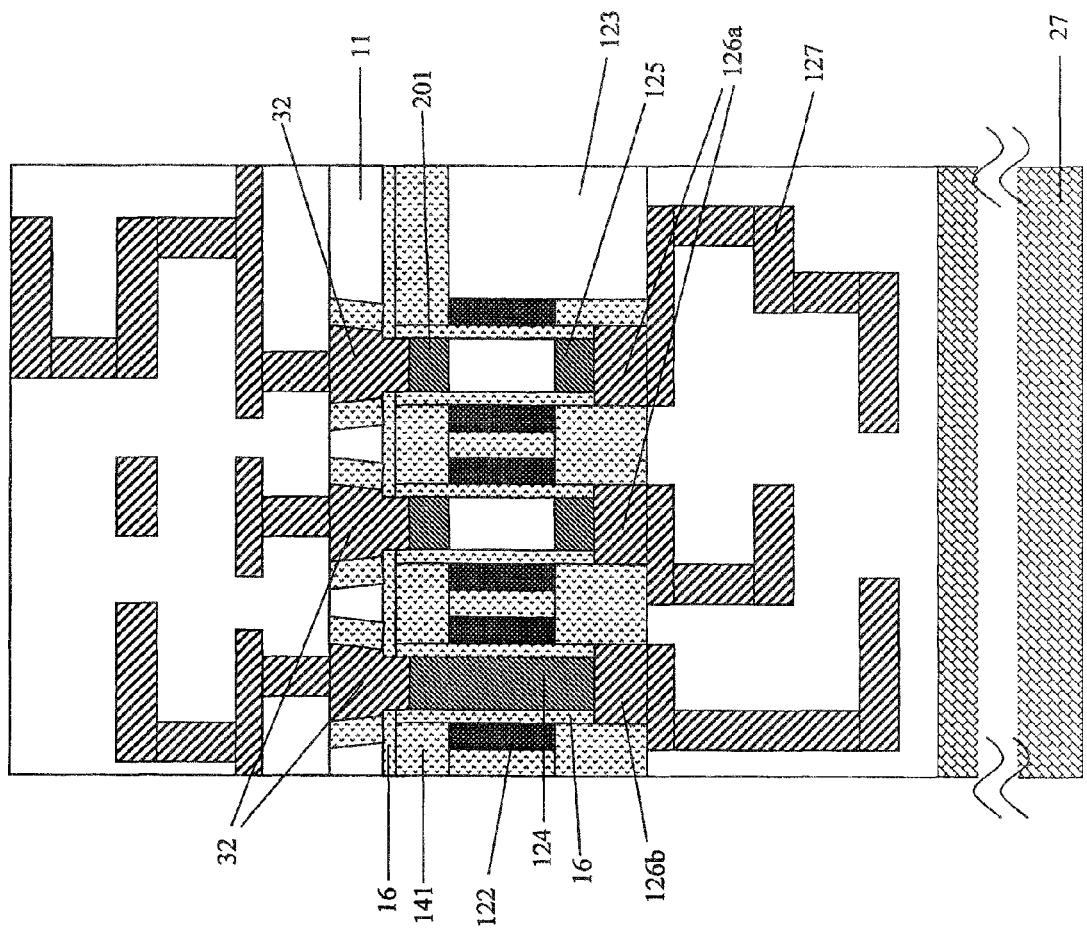
FIG. 45 is still another schematic view illustrating one step of the method for manufacturing the semiconductor device of the present invention.

Then, the resist mask is removed, and the insulating film is etched back (FIG. 44). A material for the first contact plug is then deposited in the opening. The material for the first contact plug is then flattened by the CMP process to form first contact plug 32 (FIG. 45). A contact layer and an interconnect layer are thereafter formed.

In the present embodiment, the vertical MOSFET includes a channel portion formed by performing a selective epitaxial growth as a crystal nucleus of a silicon semiconductor substrate. The channel portion formed by a selective epitaxial growth has a better crystallinity than a channel portion formed by CVD. Since the vertical MOSFET is connected with the second contact plug and interconnect and the semiconductor device of the present embodiment does not need a space for the interconnect, the semiconductor device has advantage for miniaturization of device. In the present embodiment, the first contact plug can be formed in a self-aligned manner, even misalignment of mask is large during forming the first contact plug from the rear side of the semiconductor substrate. As a result, the device can be easily formed. The structure formed by the present embodiment has a feature of an enlarged margin of misalignment during forming a contact hole.

(Feature of the Structure of the Present Invention)

The various examples of the present invention have been described as the exemplary embodiments. The present invention is not limited to the above-described exemplary embodiments. The essential elements of the present invention are as follows.

(1) The silicon substrate is patterned to form the portion in which the insulating film is buried and the silicon portion.

(2) The contact is formed in the silicon substrate from the rear surface side thereof in a self-aligned manner.

Figure 49:
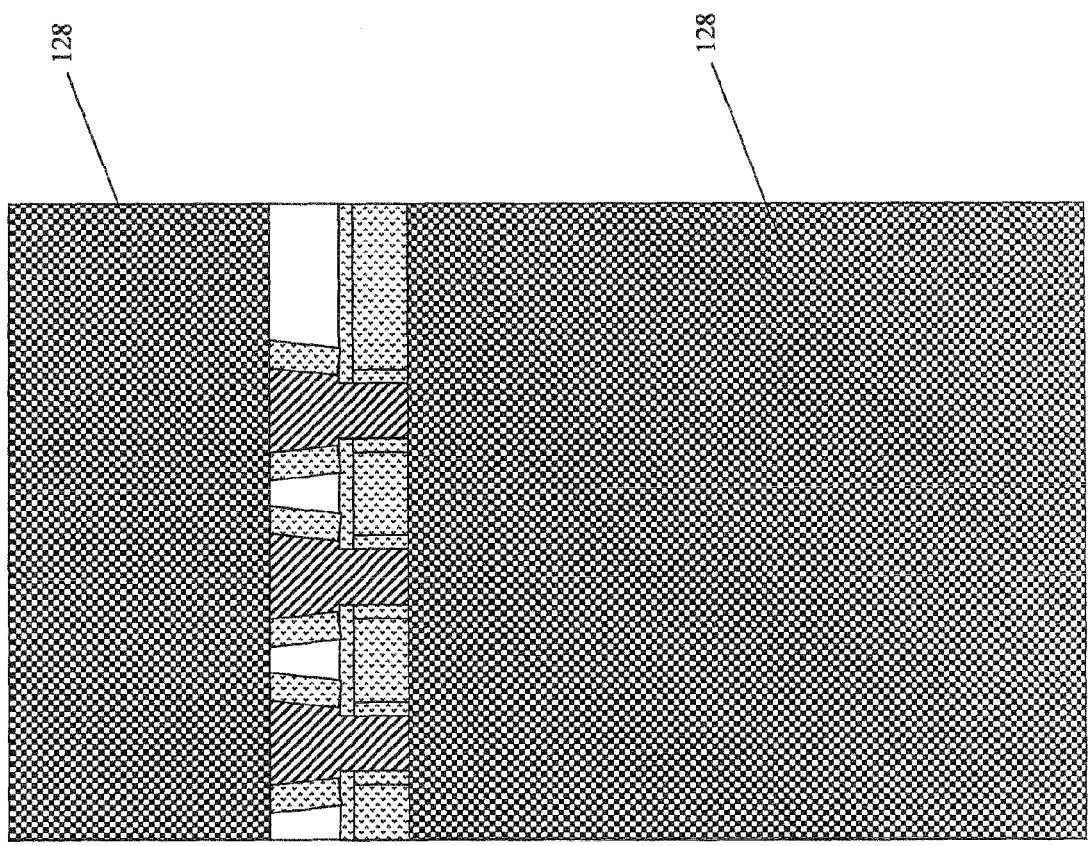
FIG. 49 is a schematic view illustrating another example of the semiconductor device of the present invention.

FIG. 49 shows only the essential components of the present invention. Optional components are denoted by 128.

What is claimed is:

1. A method for manufacturing a semiconductor device, comprising:

(1) forming a first insulating layer across the entire surface of a semiconductor substrate;
(2) forming a first mask pattern on the first insulating layer;
(3) etching the first insulating layer and the semiconductor substrate using the first mask pattern as a mask to form, below the first mask pattern, a protruding region a portion of which other than a portion below the first mask pattern is exposed;
(4) forming a second insulating layer in the exposed portion of the semiconductor substrate;
(5) removing the first mask pattern;
(6) forming an interlayer insulating film over the entire surface of the semiconductor substrate;
(7) forming a first opening within the interlayer insulating film in a position thereof corresponding to the protruding region, removing the first insulating layer on the protruding region, and further forming a first structure on the protruding region;
(8) forming a protective substrate on the first structure;
(9) polishing the semiconductor substrate from the rear surface side thereof opposite to a side on which the first structure is formed to reduce a thickness of the semiconductor substrate;
(10) performing anisotropic etching to the semiconductor substrate in a position corresponding to the protruding region, from the rear surface side thereof, so that the etching rate of the semiconductor substrate is faster than the etching rate of the second insulating layer, to form a second opening until the second opening reaches at least the protruding region;
(11) forming a third insulating layer on the inner wall of the second opening; and
(12) forming at least a first contact plug within the second opening.

2. The method for manufacturing a semiconductor device according to claim 1, wherein the step (7) comprises:
    forming the first opening within the interlayer insulating film in the position thereof corresponding to the protruding region and removing the first insulating layer on the protruding region;
    causing selective epitaxial growth to take place on the protruding region within the first opening to form a semiconductor region on the protruding region;
    removing the interlayer insulating film to expose the semiconductor region;
    forming a gate insulating film on a side surface of the exposed semiconductor region parallel with a thickness direction of the semiconductor substrate;
    forming a gate electrode on the gate insulating film;
    implanting an impurity into an upper portion of the semiconductor region opposite to the protruding region side to convert the upper portion of the semiconductor region into an upper impurity-diffused region;
    forming an interlayer insulating film over the entire surface of the semiconductor substrate; and
    forming a second contact plug so as to penetrate through the interlayer insulating film and be electrically connected to the upper impurity-diffused region, and
at least the semiconductor region the upper portion of which is the upper impurity-diffused region, the gate insulating film, the gate electrode, and the second contact plug are formed as the first structure,
in the step (10), the second opening is formed until the semiconductor region is exposed, in the step (12), a lower impurity-diffused region is formed so as to have contact with the semiconductor region and the first contact plug is formed so as to be electrically connected to the lower impurity-diffused region, and the semiconductor region including the upper impurity-diffused region, the gate insulating film, the gate electrode, and the lower impurity-diffused region compose a vertical MOSFET.

3. The method for manufacturing a semiconductor device according to claim 1, wherein the step (7) comprises:

forming a first opening within the interlayer insulating film in a position thereof corresponding to the protruding region and removing the first insulating layer on the protruding region;

causing selective epitaxial growth to take place on the protruding region within the first opening to form a semiconductor region on the protruding region;

removing the interlayer insulating film to expose the semiconductor region;

forming a gate insulating film on a side surface of the exposed semiconductor region parallel with a thickness direction of the semiconductor substrate;

forming a gate electrode on the gate insulating film;

implanting an impurity into a upper portion of the semiconductor region opposite to the protruding region side, to convert the upper portion of the semiconductor region as an upper impurity-diffused region;

forming an interlayer insulating film over the entire surface of the semiconductor substrate; and forming a second contact plug so as to penetrate through the interlayer insulating film and be electrically connected to the upper impurity-diffused region;

wherein at least the semiconductor region the upper portion of which is the upper impurity-diffused region, the gate insulating film, the gate electrode, and the second contact plug are formed as the first structure, in the step (10), the second opening is provided until the semiconductor region is exposed, in the step (12), the impurity is implanted from the rear surface side into at least a part of a lower portion of the semiconductor region to form a lower impurity-diffused region, and the first contact plug is formed so as to be electrically connected to the lower impurity-diffused region, and the semiconductor region including the upper impurity-diffused region, the gate insulating film, the gate electrode, and the lower impurity-diffused region compose a vertical MOSFET.

4. The method for manufacturing a semiconductor device according to claim 1, wherein the step (7) comprises:

forming the first opening within the interlayer insulating film in a position thereof corresponding to the protruding region and removing the first insulating layer on the protruding region;

implanting an impurity into the protruding region to convert the protruding region into a lower impurity-diffused region;

causing selective epitaxial growth to take place on the protruding region which is the lower impurity-diffused region within the first opening, to form a semiconductor region on the protruding region;

removing the interlayer insulating film to expose the semiconductor region;

forming a gate insulating film on a side surface of the exposed semiconductor region parallel with a thickness direction of the semiconductor substrate;

forming a gate electrode on the gate insulating film;

implanting an impurity into an upper portion of the semiconductor region opposite to the protruding region side to convert the upper portion of the semiconductor region into an upper impurity-diffused region;

forming an interlayer insulating film over the entire surface of the semiconductor substrate; and forming a second contact plug so as to penetrate through the interlayer insulating film and be electrically connected to the upper impurity-diffused region, and at least the semiconductor region the upper portion of which is the upper impurity-diffused region, the gate insulating film, the gate electrode, and the second contact plug are formed as the first structure, in the step (10), the second opening is formed until the second opening reaches the protruding region which is the lower impurity-diffused region, in the step (12), the first contact plug is formed so as to be electrically connected to the lower impurity-diffused region, and the semiconductor region including the upper impurity-diffused region, the gate insulating film, the gate electrode, and the lower impurity-diffused region compose a vertical MOSFET.

5. The method for manufacturing a semiconductor device according to claim 1, wherein in the step (3), a plurality of the protruding regions composed of protruding regions A and B is formed, the step (7) comprises:

forming the first opening within the interlayer insulating film in a position thereof corresponding to the protruding region A and removing the first insulating layer on the protruding region A;

causing selective epitaxial growth to take place on the protruding region A within the first opening to form a semiconductor region on the protruding region A;

removing the interlayer insulating film to expose the semiconductor region;

forming a gate insulating film on a side surface of the exposed semiconductor region parallel with a thickness direction of the semiconductor substrate;

forming a gate electrode on the gate insulating film;

implanting an impurity into an upper portion of the semiconductor region opposite to the protruding region A side to convert the upper portion of the semiconductor region into an upper impurity-diffused region;

forming an interlayer insulating film over the entire surface of the semiconductor substrate; and forming a second contact plug so as to penetrate through the interlayer insulating film and be electrically connected to the upper impurity-diffused region, forming the first opening within the interlayer insulating film in a position thereof corresponding to the protruding region B, removing the first insulating layer on the protruding region B, and further forming a third contact plug so as to be electrically connected to the protruding region B, and at least the semiconductor region the upper portion of which is the upper impurity-diffused region, the gate insulating film, the gate electrode, and the second and third contact plugs are formed as the first structure, in the step (10), the second opening is formed until the semiconductor region and the third contact plug are exposed, in the step (12), the lower impurity-diffused region is formed so as to have contact with the semiconductor region, the first contact plug is formed so as to be electrically connected to the lower impurity-diffused region, a connecting part is formed so as to be electrically connected to the third contact plug, and the first contact plug is formed so as to be electrically connected to the connecting part, and the semiconductor region including the upper impurity-diffused region, the lower impurity-diffused region, the gate insulating film and the gate electrode compose a vertical MOSFET.

6. The method for manufacturing a semiconductor device according to claim 1, wherein in the step (3), a plurality of the protruding regions composed of protruding regions A and B are formed, the step (7) comprises:

forming the first opening within the interlayer insulating film in a position thereof corresponding to the protruding region A and removing the first insulating layer on the protruding region A;

implanting an impurity into the protruding region A to convert the protruding region A into a lower impurity-diffused region;

causing selective epitaxial growth to take place on the protruding region A which is the lower impurity-diffused region within the first opening, to form a semiconductor region on the protruding region A;

removing the interlayer insulating film to expose the semiconductor region;

forming a gate insulating film on a side surface of the exposed semiconductor region parallel with a thickness direction of the semiconductor substrate;

forming a gate electrode on the gate insulating film;

implanting an impurity into an upper portion of the semiconductor region opposite to the protruding region A side, to convert the upper portion of the semiconductor region into an upper impurity-diffused region;

forming an interlayer insulating film over the entire surface of the semiconductor substrate; and forming a second contact plug so as to penetrate through the interlayer insulating film and be electrically connected to the upper impurity-diffused region, forming the first opening within the interlayer insulating film in a position thereof corresponding to the protruding region B, removing the first insulating layer on the protruding region B, further implanting an impurity into the protruding region B to form a connecting part, and forming a third contact plug so as to be electrically connected to the connecting part, and at least the semiconductor region the upper portion of which is the upper impurity-diffused region, the gate insulating film, the gate electrode, and the second and third contact plugs are formed as the first structure, in the step (10), the second opening is formed until the second opening reaches the protruding region A which is the lower impurity-diffused region and the protruding region B which is the connecting part, in the step (12), the first contact plug is formed so as to be electrically connected to the lower impurity-diffused region and the connecting part, and the semiconductor region including the upper impurity-diffused region, the lower impurity-diffused region, the gate insulating film and the gate electrode compose a vertical MOSFET.

7. The method for manufacturing a semiconductor device according to claim 1, wherein the step (7) comprises:

forming the first opening within the interlayer insulating film in a position thereof corresponding to the protruding region and removing the first insulating layer on the protruding region; and forming a third contact plug so as to penetrate through the interlayer insulating film and have contact with the protruding region, and at least the third contact plug is formed as the first structure, in the step (10), the second opening is formed until the third contact plug is exposed, and in the step (12), a connecting part is formed so as to be electrically connected to the third contact plug, and the first contact plug is formed so as to be electrically connected to the connecting part.

8. The method for manufacturing a semiconductor device according to claim 1, wherein the step (7) comprises:

forming the first opening within the interlayer insulating film in a position thereof corresponding to the protruding region and removing the first insulating layer on the protruding region;

implanting an impurity into the protruding region to convert the protruding region into a connecting part; and forming a third contact plug so as to penetrate through the interlayer insulating film and be electrically connected to the protruding region which is the connecting part, and at least the third contact plug is formed as the first structure, in the step (10), the second opening is formed until the second opening reaches the protruding region which is the connecting part, and in the step (12), the first contact plug is formed so as to be electrically connected to the connecting part.

9. A method for manufacturing a semiconductor device, comprising:

(1) forming a first insulating layer over the entire surface of a semiconductor substrate;

(2) forming a first mask pattern on the first insulating layer;

(3) etching the first insulating layer and the semiconductor substrate using the first mask pattern as a mask to form, below the first mask pattern, at least one protruding region the portions of which other than a portion below the first mask pattern are exposed;

(4) forming a second insulating layer in the exposed portions of the semiconductor substrate;

(5) removing the first mask pattern;

(6) forming an interlayer insulating film over the entire surface of the semiconductor substrate;

(7) forming a first opening within the interlayer insulating film in a position thereof corresponding to the protruding region, removing the first insulating layer on the protruding region, and further forming a first structure on the protruding region;

(8) performing anisotropic etching on the semiconductor substrate from the rear surface side thereof opposite to a side on which the first structure is formed, so as to leave a portion in the semiconductor substrate corresponding to the first structure, the anisotropic etching being performed so that the etching rate of the semiconductor substrate is faster than the etching rate of the second insulating layer; and (9) implanting an impurity into a portion in the semiconductor substrate corresponding to the first structure, to form a first contact plug.

10. A method for manufacturing a semiconductor device, comprising:
   (1) forming a first insulating layer over the entire surface of a semiconductor substrate;
   (2) forming a first mask pattern on the first insulating layer;
   (3) etching the first insulating layer and the semiconductor substrate using the first mask pattern as a mask to form, below the first mask pattern, at least one protruding region the portions of which other than a portion below the first mask pattern are exposed;
   (4) forming a second insulating layer in the exposed portions of the semiconductor substrate;
   (5) removing the first mask pattern;
   (6) forming an interlayer insulating film over the entire surface of the semiconductor substrate;
   (7) forming a first opening within the interlayer insulating film in a position thereof corresponding to the protruding region, removing the first insulating layer on the protruding region, and further forming a first structure on the protruding region;
   (8) performing anisotropic etching on the semiconductor substrate from the rear surface side thereof opposite to a side on which the first structure is formed, the anisotropic etching being performed in a position corresponding to the protruding region within the semiconductor substrate so that the etching rate of the semiconductor substrate is faster than the etching rate of the second insulating layer, to form a second opening until the second opening reaches at least the first impurity-diffused region;
   (9) forming a third insulating layer on the inner wall of the second opening; and
   (10) forming at least a first contact plug within the second opening.

11. A method for manufacturing a semiconductor device, comprising:
   (1) forming a first insulating layer over the entire surface of a silicon semiconductor substrate;
   (2) forming a first mask pattern on the first insulating layer;
   (3) etching the first insulating layer and the silicon semiconductor substrate using the first mask pattern as a mask to form, below the first mask pattern, a silicon semiconductor region projecting from a predetermined plane of the silicon semiconductor substrate;
   (4) forming a second insulating layer in the exposed portions of the silicon semiconductor substrate;
   (5) forming a first structure including the silicon semiconductor region;
   (6) polishing the silicon semiconductor substrate from the rear surface side thereof opposite to a side on which the first structure is formed, to reduce a thickness of the silicon semiconductor substrate;
   (7) performing anisotropic etching on a position corresponding to the silicon semiconductor region within the silicon semiconductor substrate from the rear surface side thereof, so that the etching rate of the silicon semiconductor substrate is faster than the etching rate of the second insulating layer, to form a second opening until the second opening reaches at least the silicon semiconductor region;
   (8) forming a third insulating layer on the inner wall of the second opening; and
   (9) forming at least a first contact plug within the second opening.

12. The method for manufacturing a semiconductor device according to claim 1,
   wherein the semiconductor substrate is a silicon semiconductor substrate.

13. The method for manufacturing a semiconductor device according to claim 1,
   wherein in forming the second opening,
   the etching rate of the semiconductor substrate is 1.5 or more times the etching rate of the second insulating layer.

14. The method for manufacturing a semiconductor device according to claim 1,
   wherein in forming the second opening,
   the etching rate of the semiconductor substrate is twice or more times the etching rate of the second insulating layer.

* * * * *